US012813032B2

(12) United States Patent
Moon et al.

(10) Patent No.: US 12,813,032 B2
(45) Date of Patent: Nov. 24, 2026

(54) DISPLAY DEVICE

(71) Applicant: Samsung Display Co., LTD., Yongin-si (KR)

(72) Inventors: Ji Wook Moon, Yongin-si (KR); Byung Choon Yang, Yongin-si (KR); Ki Seong Seo, Yongin-si (KR); Joo Woan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 18/206,511

(22) Filed: Jun. 6, 2023

(65) Prior Publication Data

US 2024/0072216 A1 Feb. 29, 2024

(30) Foreign Application Priority Data

Aug. 30, 2022 (KR) ........................ 10-2022-0109371

(51) Int. Cl.

*H10H 20/851* (2025.01)
*H10H 20/855* (2025.01)
*H10H 29/14* (2025.01)
*H10W 90/00* (2026.01)

(52) U.S. Cl.

CPC ...... *H10H 20/8513* (2025.01); *H10H 20/855* (2025.01); *H10H 29/142* (2025.01); *H10W 90/00* (2026.01)

(58) Field of Classification Search

CPC ............. H10H 20/855; H10H 20/8513; H10H 29/142; H01L 25/0753; H10W 90/00

See application file for complete search history.

(56) References Cited

U.S. PATENT DOCUMENTS 4,757,037 A * 7/1988 Colombet ............. C04B 35/462 423/598
9,831,396 B2 11/2017 Hosokawa et al.
2007/0104629 A1* 5/2007 Yadav ................... C01F 17/229 977/773
2016/0079484 A1* 3/2016 Hosokawa ......... H10H 20/8512 257/98
2017/0133357 A1* 5/2017 Kuo ....................... H10H 20/85
2022/0158135 A1* 5/2022 Irobe .................... H10H 20/855

FOREIGN PATENT DOCUMENTS

JP 2016-063001 A 4/2016
KR 10-2012-0122159 A 11/2012
KR 10-2018-0118090 A 10/2018
WO WO-9211919 A1 * 7/1992 ........... B01D 53/945

* cited by examiner

*Primary Examiner* — Abdulmajeed Aziz
*Assistant Examiner* — Nathaniel J Lee
(74) *Attorney, Agent, or Firm* — Womble Bond Dickinson (US) LLP

(57) ABSTRACT

A display device comprises a substrate including a plurality of light emitting areas, a partition wall portion provided on the substrate and partitioning the plurality of light emitting areas, and a plurality of light emitting parts provided on the substrate and respectively corresponding to the plurality of light emitting areas, wherein at least one of the plurality of light emitting parts includes a light emitting element provided on the substrate, and a first color conversion layer covering the light emitting element and including first inorganic particles, and the first inorganic particles include $Nd_2(Si, Ti, Ge)_2O_7$.

20 Claims, 46 Drawing Sheets

EA: EA1, EA2, EA3
120: T1, CL, 121, PE, CE, CH1, CH2
130: 131, 132, 133
160: 161, 162, 163, 164
LTL: BS3

EA: EA1, EA2, EA3
120: T1, CL, 121, PE, CE, CH1, CH2
130: 131, 132, 133
160: 161, 162, 163, 164
LTL: BS3

EA: EA1, EA2, EA3
120: T1, CL, 121, PE, CE, CH1, CH2
130: 131, 132, 133
160: 161, 162, 163, 164

EA: EA1, EA2, EA3
120: T1, CL, 121, PE, CE, CH1, CH2
130: 131, 132, 133
160: 161, 162, 163, 164
LTL: BS3

EA: EA1, EA2, EA3
120: T1, CL, 121, PE, CE, CH1, CH2
130: 131, 132, 133
160: 161, 162, 163, 164
LTL: BS3

EA: EA1, EA2, EA3
120: T1, CL, 121, PE, CE, CH1, CH2
130: 131, 132, 133
160: 161, 162, 163, 164
LTL: BS3
MLL: ML1, ML2, ML3

EA: EA1, EA2, EA3
120: T1, CL, 121, PE, CE, CH1, CH2
130: 131, 132, 133
160: 161, 162, 163, 164
LTL: BS3
MLL: ML1, ML2, ML3

EA: EA1, EA2, EA3
120: T1, CL, 121, PE, CE, CH1, CH2
130: 131, 132, 133
160: 161, 162, 163, 164
LTL: BS3
MLL: ML1, ML2, ML3

EA: EA1, EA2, EA3
120: T1, CL, 121, PE, CE, CH1, CH2
130: 131, 132, 133
160: 161, 162, 163, 164
LTL: BS3
MLL: ML1, ML2, ML3
CCL1: NP1, BS1, AP4
CCL2: NP2, BS2, AP4
133: LTL, LE
131: CCL1, LE
132: CCL2, LE

EA: EA1, EA2, EA3
120: T1, CL, 121, PE, CE, CH1, CH2
130: 131, 132, 133
160: 161, 162, 163, 164
MLL: ML1, ML2, ML3
CCL1: NP1, BS1, AP1
CCL2: NP2, BS2, AP1
133: LTL, LE
LTL: BS3, NP3, AP1
131: CCL1, LE
132: CCL2, LE

DISPLAY DEVICE

CROSS-REFERENCE TO RELATED APPLICATION

This application claims priority to and the benefit of Korean Patent Application No. 10-2022-0109371 filed on Aug. 30, 2022 in the Korean Intellectual Property Office, the contents of which in its entirety are herein incorporated by reference.

BACKGROUND

1. Field

One or more embodiments of the present disclosure relate to a display device.

2. Description of the Related Art

As the information society develops, the demand for a display device in various suitable forms for displaying an image is increasing. For example, the display device has been applied to various electronic devices such as smartphones, digital cameras, laptop computers, navigation devices, and/or smart televisions.

The display device may be a flat panel display, such as a liquid crystal display, a field emission display, and/or a light emitting display.

The light emitting display may be implemented as an organic light emitting display device including an organic light emitting diode element, an inorganic light emitting display device including an inorganic semiconductor element, and/or a micro light emitting display device including a micro light emitting diode element depending on a light emitting element that emits light.

Because the light emitting element emits light in a wavelength band corresponding to a single color, the light emitting display may display a color image by including a color conversion layer that converts a wavelength band of light emitted from the light emitting diode element.

SUMMARY

Aspects of one or more embodiments of the present disclosure provide a display device capable of improving a color reproduction ratio.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device may include a substrate including a plurality of light emitting areas, a partition wall portion provided on the substrate and partitioning the plurality of light emitting areas, and a plurality of light emitting parts provided on the substrate and respectively corresponding to the plurality of light emitting areas, wherein at least one of the plurality of light emitting parts may include a light emitting element provided on the substrate, and a first color conversion layer covering the light emitting element and including first inorganic particles, and the first inorganic particles include $Nd_2(Si, Ti, Ge)_2O_7$.

In one or more embodiments, the plurality of light emitting parts may include a first light emitting part configured to emit light in a first wavelength band, a second light emitting part configured to emit light in a second wavelength band, and a third light emitting part configured to emit light in a third wavelength band.

In one or more embodiments, the first light emitting part may include the first color conversion layer, and the first color conversion layer may include first wavelength conversion particles configured to convert light emitted from the light emitting element into the light in the first wavelength band, and a first base resin in which the first wavelength conversion particles and the first inorganic particles are dispersed.

In one or more embodiments, a content of the first inorganic particles may be 0.1 wt % to 10 wt % with respect to the first base resin.

In one or more embodiments, the light in the first wavelength band may be any one of red, green, or blue light.

In one or more embodiments, the first wavelength conversion particles may be selected from phosphors and quantum dots.

In one or more embodiments, the first light emitting part may include the first color conversion layer, the first color conversion layer may include first wavelength conversion particles configured to convert light emitted from the light emitting element into the light in the first wavelength band, and the second light emitting part may include a second color conversion layer including the first inorganic particles and second wavelength conversion particles configured to convert the light emitted from the light emitting element into the light in the second wavelength band.

In one or more embodiments, the third light emitting part may include a light transmitting layer including the first inorganic particles and third wavelength conversion particles configured to convert the light emitted from the light emitting element into the light in the third wavelength band.

In one or more embodiments, the light emitting element may be configured to emit light in an ultraviolet wavelength band or light in a blue wavelength band.

In one or more embodiments, the display device may further include a color filter layer provided on the plurality of light emitting parts, wherein the color filter layer may include second inorganic particles that are the same as the first inorganic particles.

In one or more embodiments, the display device may further include an absorption layer provided between the plurality of light emitting parts and the color filter layer, wherein the absorption layer may includes third inorganic particles that are the same as the first inorganic particles.

In one or more embodiments, the display device may further include a lens layer provided on the color filter layer, wherein the lens layer may include a plurality of lenses respectively corresponding to the plurality of light emitting areas, and the plurality of lenses may include fourth inorganic particles that are the same as as the first inorganic particles.

According to one or more embodiments of the present disclosure, a display device may include a substrate including a plurality of light emitting areas, a partition wall portion provided on the substrate and partitioning the plurality of light emitting areas, a plurality of light emitting parts provided on the substrate and respectively corresponding to the plurality of light emitting areas, and an absorption layer provided on the plurality of light emitting parts and including first inorganic particles, wherein at least one of the plurality of light emitting parts may include a light emitting element provided on the substrate, and wavelength converting particles covering the light emitting element and configured to convert a wavelength band of light emitted from the light emitting element, and the first inorganic particles include $Nd_2(Si, Ti, Ge)_2O_7$.

In one or more embodiments, the absorption layer may overlap at least one of the plurality of light emitting parts.

In one or more embodiments, the display device may further include a color filter layer provided on the absorption layer, wherein the color filter layer may include second inorganic particles that are the same as the first inorganic particles.

In one or more embodiments, the display device may further include a lens layer provided on the color filter layer, wherein the lens layer may include a plurality of lenses respectively corresponding to the plurality of light emitting areas, and the plurality of lenses include third inorganic particles that are the same as the first inorganic particles.

According to one or more embodiments of the present disclosure, a display device may include a substrate including a plurality of light emitting areas, a partition wall portion provided on the substrate and partitioning the plurality of light emitting areas, a plurality of light emitting parts provided on the substrate and respectively corresponding to the plurality of light emitting areas, and a lens layer provided on the plurality of light emitting parts and including first inorganic particles, wherein at least one of the plurality of light emitting parts may include a light emitting element provided on the substrate, and wavelength converting particles covering the light emitting element and configured to convert a wavelength band of light emitted from the light emitting element, and the first inorganic particles include $Nd_2(Si, Ti, Ge)_2O_7$.

In one or more embodiments, the display device may further include a color filter layer provided between the lens layer and the plurality of light emitting parts, wherein the color filter layer may include second inorganic particles that are the same as the first inorganic particles.

According to one or more embodiments of the present disclosure, a display device may include a substrate including a plurality of light emitting areas, a partition wall portion provided on the substrate and partitioning the plurality of light emitting areas, a plurality of light emitting parts provided on the substrate and respectively corresponding to the plurality of light emitting areas, and a color filter layer provided on the plurality of light emitting parts and including first inorganic particles, wherein at least one of the plurality of light emitting parts may include a light emitting element provided on the substrate, and wavelength converting particles covering the light emitting element and configured to convert a wavelength band of light emitted from the light emitting element, and the first inorganic particles include $Nd_2(Si, Ti, Ge)_2O_7$.

In one or more embodiments, the color filter layer may include a plurality of color filters respectively corresponding to the plurality of light emitting areas, and at least one of the plurality of color filters may include the first inorganic particles.

According to embodiments, the display device may reduce a full width at half maximum of a light spectrum of a set or specific wavelength band by including inorganic particles capable of absorbing light of a set or specific wavelength band in at least one light emitting part. Accordingly, a color reproduction ratio and color purity of the display device may be improved.

In addition, the display device may further reduce the full width at half maximum of the light spectrum of the specific wavelength band by including the inorganic particles in at least one selected from an absorption layer, a color filter layer, and a lens layer. Accordingly, the color reproduction ratio and the color purity of the display device may be further improved.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in more detail embodiments thereof with reference to the attached drawings, in which.

DETAILED DESCRIPTION

Figure 1:
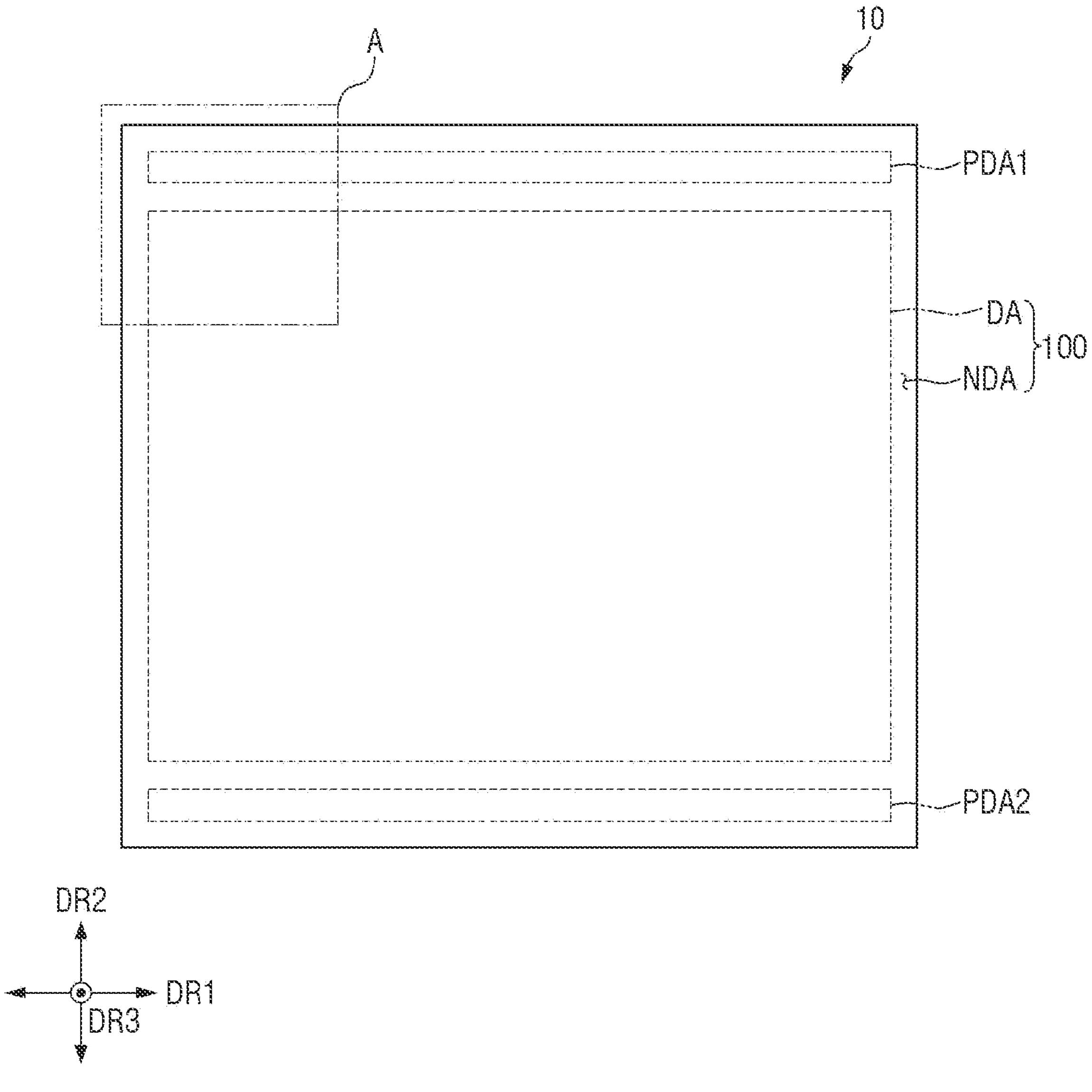
FIG. 1 is a layout view illustrating a display device according to one or more embodiments.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the disclosure.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association. As used herein, the singular forms "a," "an," and "the" are intended to include the plural forms as well, unless the context clearly indicates otherwise.

It will be further understood that the terms "includes," "including," "comprises," and/or "comprising," when used in this disclosure, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

Further, in this specification, the phrase "on a plane," or "plan view," means viewing a target portion from the top, and the phrase "on a cross-section" means viewing a cross-section formed by vertically cutting a target portion from the side. Hereinafter, embodiments will be described with reference to the accompanying drawings.

Figure 2:
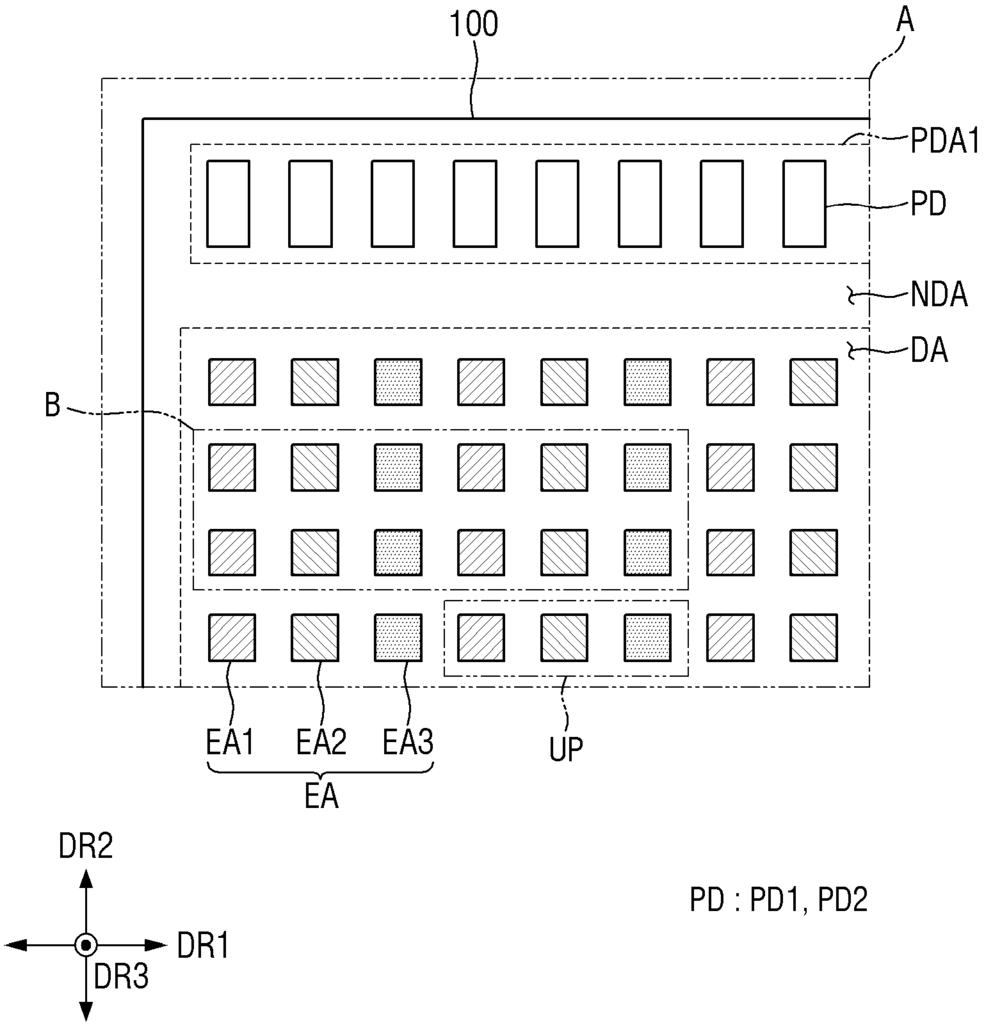
FIG. 2 is a layout view illustrating an area A of FIG. 1 in more detail.
Figure 3:
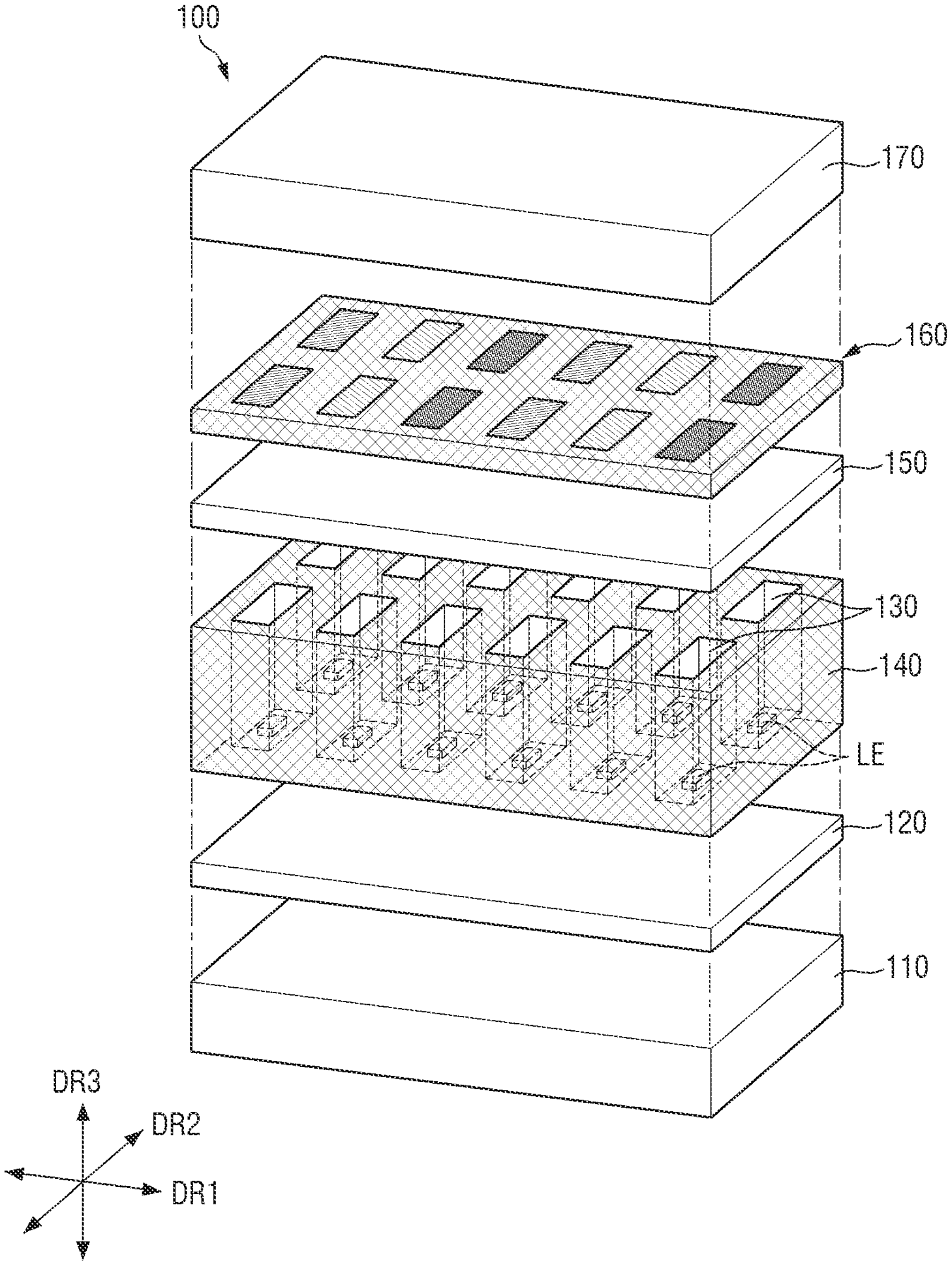
FIG. 3 is an exploded perspective view illustrating a display device according to one or more embodiments.

FIG. 1 is a layout view illustrating a display device according to one or more embodiments. FIG. 2 is a layout view illustrating an area A of FIG. 1 in detail. FIG. 3 is an exploded perspective view illustrating a display device according to one or more embodiments.

In FIGS. 1 to 3, a first direction DR1 refers to a horizontal direction of a display panel 100, a second direction DR2 refers to a vertical direction of the display panel 100, and a third direction DR3 refers to a thickness direction of the display panel 100 or a thickness direction of a semiconductor circuit board 110. In this case, "left", "right", "upper", and "lower" indicate directions when the display panel 100 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2. In addition, "upper portion" refers to one side in the third direction DR3, and "lower portion" refers to the other side in the third direction DR3.

Referring to FIGS. 1 to 3, a display device 10 according to one or more embodiments includes a display panel 100 including a display area DA and a non-display area NDA.

The display panel 100 may have a quadrangular planar shape having a long side in the first direction DR1 and a short side in the second direction DR2. However, the shape of the display panel 100 is not limited thereto, and may have a polygonal, circular, elliptical, or irregular planar shape other than the quadrangular shape.

The display area DA may be an area in which an image is displayed, and the non-display area NDA may be an area in which an image is not displayed. A planar shape of the display area DA may follow the planar shape of the display panel 100. It is illustrated in FIG. 1 that the display area DA has the quadrangular planar shape. The display area DA may be provided in a central area of the display panel 100. The non-display area NDA may be provided around the display area DA. The non-display area NDA may be provided to surround the display area DA.

The display area DA of the display panel 100 may include a plurality of unit pixels UP. The unit pixel UP may be defined as a minimum light emitting part (e.g., unit) capable of displaying white light.

Each of the plurality of unit pixels UP may include a plurality of light emitting areas EA that emit light. Although it is illustrated in the drawings that each of the plurality of unit pixels UP includes three light emitting areas EA, the present disclosure is not limited thereto. In addition, although it is illustrated that each of the plurality of light emitting areas EA has a quadrangular planar shape, the embodiments of the present disclosure are not limited thereto.

A first light emitting area EA1 may emit first light. The first light may be light in a red wavelength band. For example, a main peak wavelength (R-peak) of the first light may be approximately 600 nm to 750 nm, but the embodiments of the present disclosure are not limited thereto.

A second light emitting area EA2 may emit second light. The second light may be light in a green wavelength band. For example, a main peak wavelength (G-peak) of the second light may be located at approximately 480 nm to 560 nm, but the embodiments of the present disclosure are not limited thereto.

A third light emitting area EA3 may emit third light. The third light may be light in a blue wavelength band. For example, a main peak wavelength (B-peak) of the third light may be located at approximately 370 nm to 460 nm, but the embodiments of the present disclosure are not limited thereto.

The first light emitting areas EA1, the second light emitting areas EA2, and the third light emitting areas EA3 may be alternately arranged with each other in the first direction DR1. For example, the first light emitting areas EA1, the second light emitting areas EA2, and the third light emitting areas EA3 may be provided in the order of the first light emitting areas EA1, the second light emitting areas EA2, and the third light emitting areas EA3 in the first direction DR1. The first light emitting areas EA1 may be arranged with each other in the second direction DR2. The second light emitting areas EA2 may be arranged with each other in the second direction DR2. The third light emitting areas EA3 may be arranged with each other in the second direction DR2.

According to one or more embodiments, each of the plurality of light emitting areas EA may have a width of several to several tens of nanometers. However, embodiments of the present disclosure are not limited thereto.

The non-display area NDA may include a first pad portion PDA1 and a second pad portion PDA2. However, this is only an example, and the non-display area NDA may include only one of the first pad portion PDA1 or the second pad portion PDA2.

Each of the first pad portion PDA1 and the second pad portion PDA2 may correspond to a plurality of signal pads PD to which an external circuit board supplying a signal or voltage for driving the display panel 100 is connected (e.g., is electrically coupled).

The first pad portion PDA1 may be provided on an upper side of the display panel 100. The first pad portion PDA1 may include first pads PD1 connected to the external circuit board.

The second pad portion PDA2 may be provided on a lower side of the display panel 100. The second pad portion PDA2 may include second pads PD2 to be connected to the external circuit board. The second pad portion PDA2 may not be provided (e.g., may be omitted).

Referring to FIG. 3, the display panel 100 of the display device 10 according to one or more embodiments may include a substrate 110, a transistor array 120 provided on the substrate 110, a plurality of light emitting parts 130 and a partition wall portion 140 provided on the transistor array 120, a protective layer 150 provided on the plurality of light emitting parts 130 and the partition wall portion 140, a color filter layer 160 provided on the protective layer 150, and a protective substrate 170 provided on the color filter layer 160.

The substrate 110 may be formed in the form of a rigid flat plate or may also be formed in the form of a flexible flat plate in which deformation such as bending, folding, and/or rolling may be easily or suitably performed. The substrate 110 may support structures provided thereon, for example, the transistor array 120, the plurality of light emitting parts 130, the partition wall portion 140, the protective layer 150, and the color filter layer 160.

The substrate 110 may be formed of an insulating material such as glass, quartz, and/or a polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), and combinations thereof. However, the present disclosure is not limited thereto, and the substrate 110 may be formed of a suitable metal material.

The transistor array 120 may include at least one thin film transistor (T1 and T2 in FIG. 5) corresponding to each of the plurality of light emitting areas EA, a common line (CL in FIG. 5) extending in a set or predetermined direction in the display area DA, a planarization film (121 in FIG. 6) covering at least one thin film transistor and the common line, a plurality of pixel electrodes PE provided on the planarization film 121 and corresponding to the plurality of light emitting areas EA, and a plurality of common electrodes CE provided on the planarization film 121, corresponding to the plurality of light emitting areas EA, and spaced apart from the pixel electrodes PE. The transistor array 120 will be described in more detail herein below with reference to FIGS. 4 and 5.

The plurality of light emitting parts 130 may be provided on the substrate 110 and may respectively correspond to the plurality of light emitting areas EA. The plurality of light emitting parts may include a first light emitting part corresponding to the first light emitting area EA1 emitting (e.g., configured to emit) the light in the first wavelength band, a second light emitting part corresponding to the second light emitting area EA2 emitting (e.g., configured to emit) the light in the second wavelength band, and a third light emitting part corresponding to the third light emitting area EA3 emitting (e.g., configured to emit) the light in the third wavelength band. A light emitting element LE emitting (e.g., configured to emit) light in a set or specific wavelength band may be included in each of the light emitting parts. The light emitting element LE will be described in more detail herein below.

The partition wall portion 140 may correspond to a boundary between the plurality of light emitting areas EA. For example, the partition wall portion 140 may be provided to separate and define each of the plurality of light emitting areas EA and surround each of the plurality of light emitting parts 130. The partition wall portion 140 may be formed of a material that absorbs (e.g., is configured to absorb) light or a material that reflects (e.g., is configured to reflect) light. As an example, the partition wall portion 140 may be formed of a black matrix that absorbs light.

The protective layer 150 is provided on the plurality of light emitting parts 130 and the partition wall portion 140, and seals each of the plurality of light emitting parts 130.

The protective layer 150 may be formed of an inorganic insulating material. As an example, the protective layer 150 may be formed of an inorganic insulating material such as silicon oxide, silicon nitride, and/or silicon oxynitride. However, this is only an example, and the material of the protective layer 150 is not limited as long as it has suitable light-transmitting properties and adhesive properties.

The color filter layer 160 may include a first color filter corresponding to the first light emitting area EA1 emitting (e.g., configured to emit) the light in the first wavelength band, a second color filter corresponding to the second light emitting area EA2 emitting (e.g., configured to emit) the light in the second wavelength band, and a third color filter corresponding to the third light emitting area EA3 emitting (e.g., configured to emit) the light in the third wavelength band.

The first color filter may include a dye or pigment that selectively transmits (e.g., is configured to transmit) light in a wavelength band corresponding to the first wavelength band. The second color filter may include a dye or pigment that selectively transmits (e.g., is configured to transmit) light in a wavelength band corresponding to the second wavelength band. The third color filter may include a dye or pigment that selectively transmits (e.g., is configured to transmit) light in a wavelength band corresponding to the third wavelength band. Furthermore, when the plurality of light emitting areas EA further include a light emitting area emitting white light, the color filter layer 160 may further include a color filter corresponding to a white light emitting area and formed of a transparent material.

The protective substrate 170 may be attached on the color filter layer 160 through a set or predetermined adhesive layer. The protective substrate 170 may be formed of a glass material. In some embodiments, the protective substrate 170 may also be formed of any one plastic material selected from polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

Figure 4:
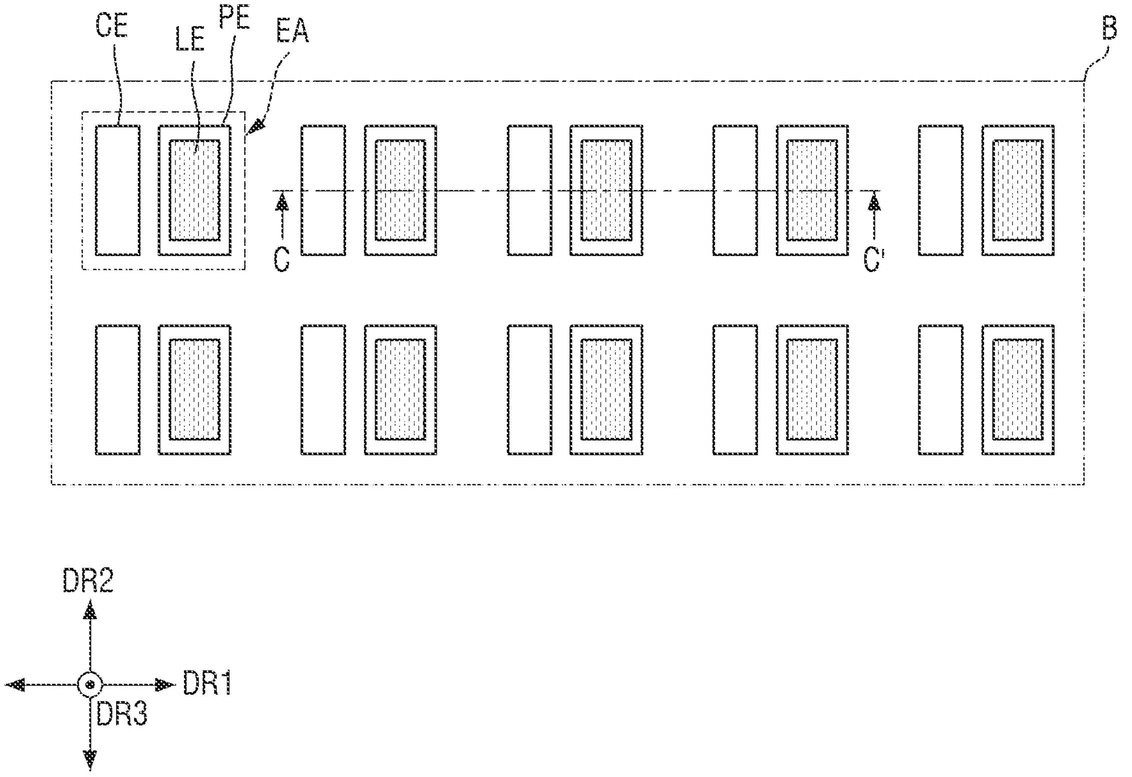
FIG. 4 is a view illustrating a pixel electrode, a common electrode, and a light emitting element of a transistor array corresponding to portion B of FIG. 2.
Figure 5:
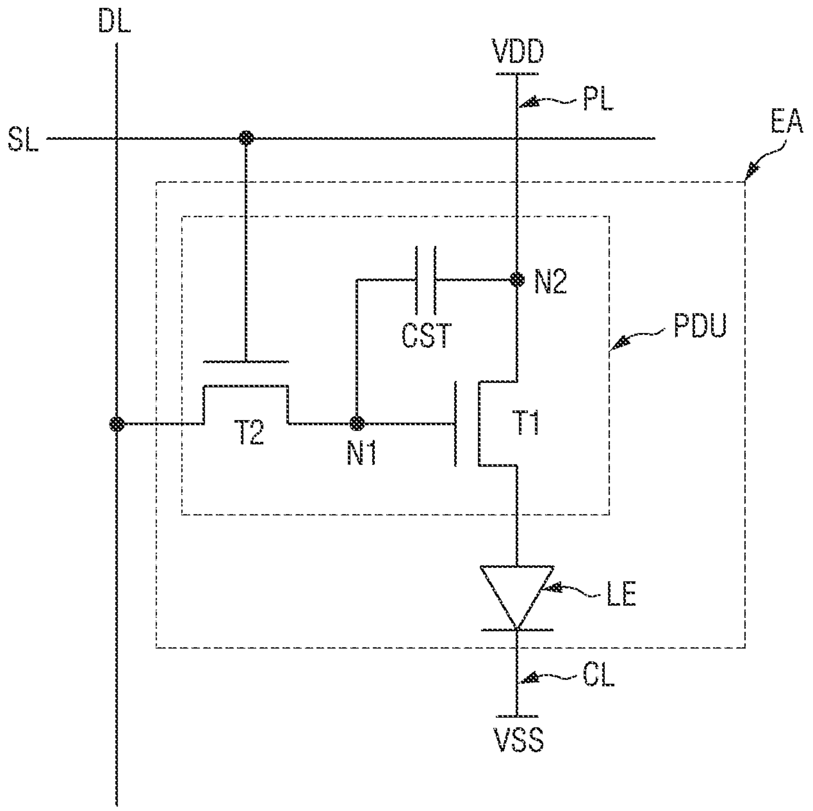
FIG. 5 is an equivalent circuit diagram corresponding to any one of the light emitting areas of FIG. 2.

FIG. 4 is a view illustrating a pixel electrode, a common electrode, and a light emitting element of a transistor array corresponding to portion B of FIG. 2. FIG. 5 is an equivalent circuit diagram corresponding to any one of the light emitting areas of FIG. 2.

Referring to FIG. 4, the display panel 100 may include a plurality of light emitting elements LE respectively corresponding to the plurality of light emitting areas EA. In each of the plurality of light emitting areas EA, the light emitting element LE may be connected between the pixel electrode PE and the common electrode CE. As an example, each of the plurality of light emitting areas EA may include the pixel electrode PE and the common electrode CE that are spaced apart from each other.

The light emitting element LE of each of the plurality of light emitting areas EA may include a first electrode provided on the pixel electrode PE and electrically connected to the pixel electrode PE, and a second electrode connected to the common electrode CE.

As an example, when the light emitting element LE is a vertical type (or kind) including the first electrode and the second electrode facing each other, the first electrode of the light emitting element LE may be in direct contact with the pixel electrode PE and be electrically connected to the pixel electrode PE, and the second electrode of the light emitting element LE may be electrically connected to the common electrode CE through a set or predetermined bonding wire.

In some embodiments, when the light emitting element LE is of a horizontal type (or kind) including the first electrode and the second electrode provided in parallel with each other on a surface opposite to the pixel electrode PE, the first electrode and the second electrode of the light emitting element LE may be respectively connected to the pixel electrode PE and the common electrode CE through respective bonding wires.

In some embodiments, when the light emitting element LE is a flip type (or kind) including the first electrode and the second electrode provided in parallel with each other on a surface facing the pixel electrode PE, the first electrode and the second electrode of the light emitting element LE may be in contact with the pixel electrode PE and the common electrode CE facing the first electrode and the second electrode, respectively, and be electrically connected to the pixel electrode PE and the common electrode CE, respectively.

Hereinafter, a case in which the display panel 100 according to the embodiments includes the light emitting element LE of the vertical type (or kind) will be mainly described for convenience, but this is only an example. For example, the display panel 100 according to the embodiments may include the light emitting element LE of the lateral type (or kind) or the flip type (or kind) instead of the vertical type (or kind).

Referring to FIG. 5, the transistor array (120 in FIG. 3) of the display panel 100 may include a plurality of pixel driving units PDU corresponding to the plurality of light emitting areas EA, respectively, and connected to the light emitting elements LE of the plurality of light emitting areas EA, respectively.

Each of the plurality of pixel driving units PDU may include at least one thin film transistor (T1 and T2 in FIG. 5). For example, the transistor array 120 of the display panel 100 may include at least one thin film transistor (T1 and T2 in FIG. 5) corresponding to each of the plurality of light emitting areas EA.

Each of the plurality of light emitting areas EA may include a light emitting element LE and a pixel driving unit PDU for driving the light emitting element LE.

As an example, as illustrated in FIG. 5, the pixel driving unit PDU may include a first thin film transistor T1 connected to the light emitting element LE, and a second thin film transistor T2 and a storage capacitor CST connected to the first thin film transistor T1.

The first thin film transistor T1 may be connected in series with the light emitting element LE between a power line PL supplying a first driving power VDD and a common line CL supplying a second driving power VSS of a voltage level lower than that of the first driving power VDD. For example, a first electrode of the first thin film transistor T1 may be connected to the power line PL, and a second electrode of the first thin film transistor T1 may be connected to an anode electrode of the light emitting element LE. In some embodiments, a cathode electrode of the light emitting element LE may be connected to the common line CL.

The second thin film transistor T2 may be connected between a gate electrode of the first thin film transistor T1 and a data line DL supplying a data signal corresponding to each light emitting area EA. A gate electrode of the second thin film transistor T2 may be connected to a scan line SL that supplies a scan signal for selecting whether to write a data signal.

The storage capacitor CST may be connected between the first node N1 and the second node N2. The first node N1 is a contact point between the gate electrode of the first thin film transistor T1 and the second thin film transistor T2, and the second node N2 is a contact point between the first thin film transistor T1 and the power line PL. For example, the storage capacitor CST is connected between the gate electrode and the first electrode of the first thin film transistor Ti.

When the second thin film transistor T2 is turned on based on the scan signal of the scan line SL, the data signal of the data line DL is supplied to the gate electrode of the first thin film transistor T1 and the storage capacitor CST through the turned-on second thin film transistor T2. Accordingly, the first thin film transistor T1 is turned on based on the data signal, and a driving current corresponding to the data signal is supplied to the light emitting element LE through the turned-on first thin film transistor T1. In some embodiments, the turn-on of the first thin film transistor T1 may be maintained based on a voltage charged in the storage capacitor CST.

An active layer of each of the first and second thin film transistors T1 and T2 may also be formed of any one selected from polysilicon, amorphous silicon, and an oxide semiconductor. When the semiconductor layer of each of the first and second thin film transistors T1 and T2 is formed of polysilicon, a process for forming the semiconductor layer may be a low temperature polysilicon (LTPS) process.

It should be noted that the above-described equivalent circuit diagram of the light emitting area according to the embodiments of the present disclosure is not limited to that illustrated in FIG. 5. The equivalent circuit diagram of the light emitting area according to the embodiments of the present disclosure may be formed in other suitable circuit structures employable by those skilled in the art other than the embodiment illustrated in FIG. 5.

Hereinafter, a structure of the display panel 100 of the display device 10 according to one or more embodiments will be described with reference to the drawings.

Figure 6:
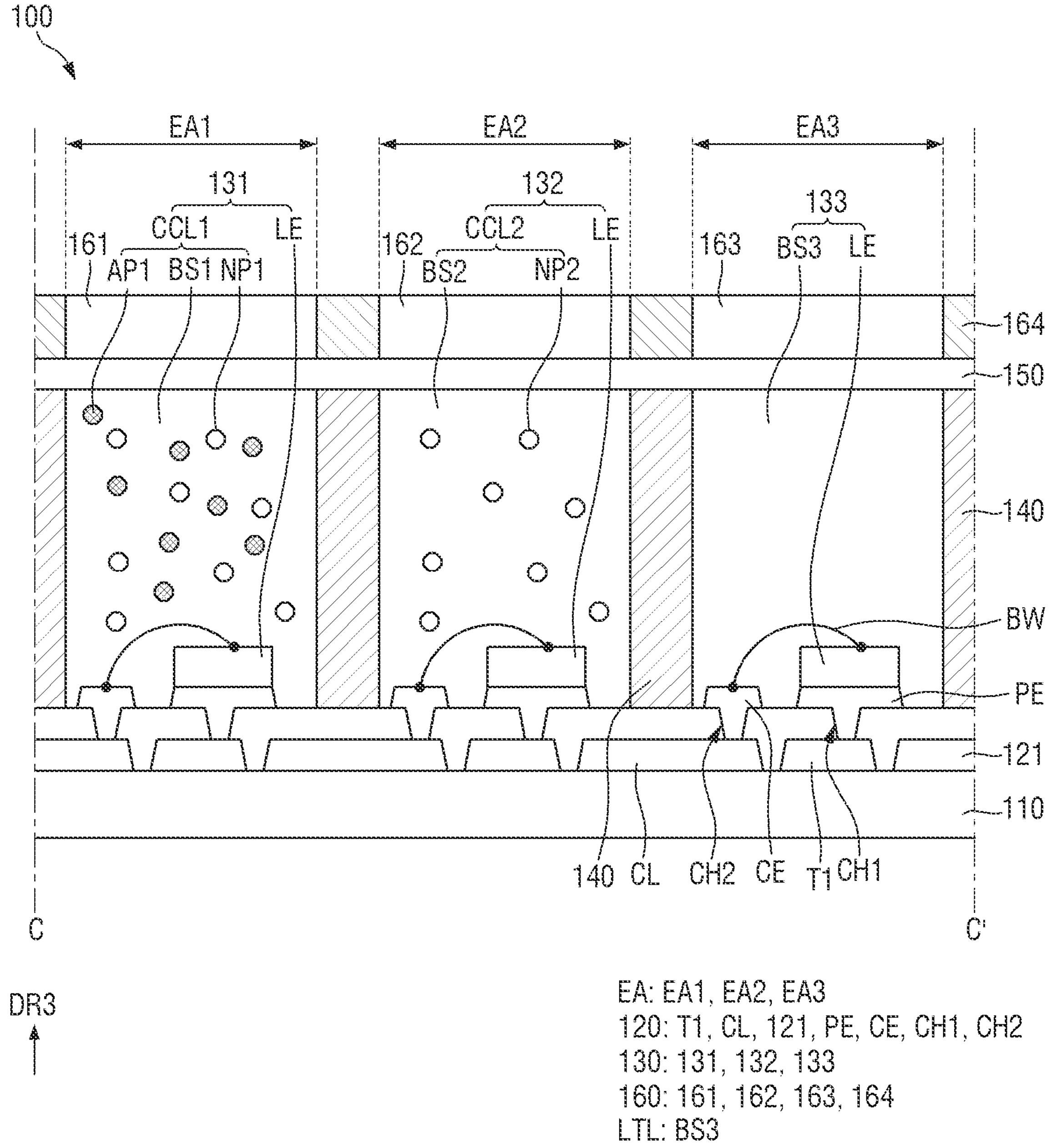
FIG. 6 is a cross-section view illustrating a display panel according to one or more embodiments.
Figure 7:
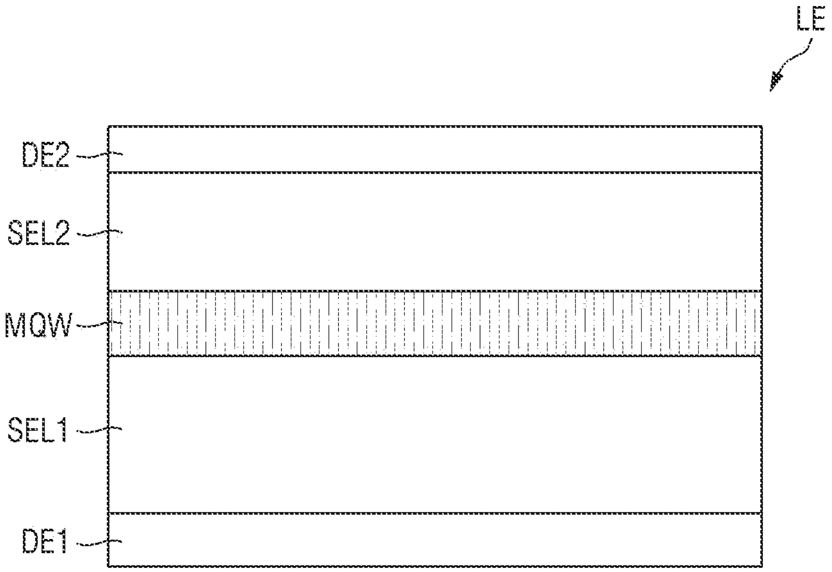
FIG. 7 is a cross-sectional view illustrating a light emitting element according to one or more embodiments.
Figure 8:
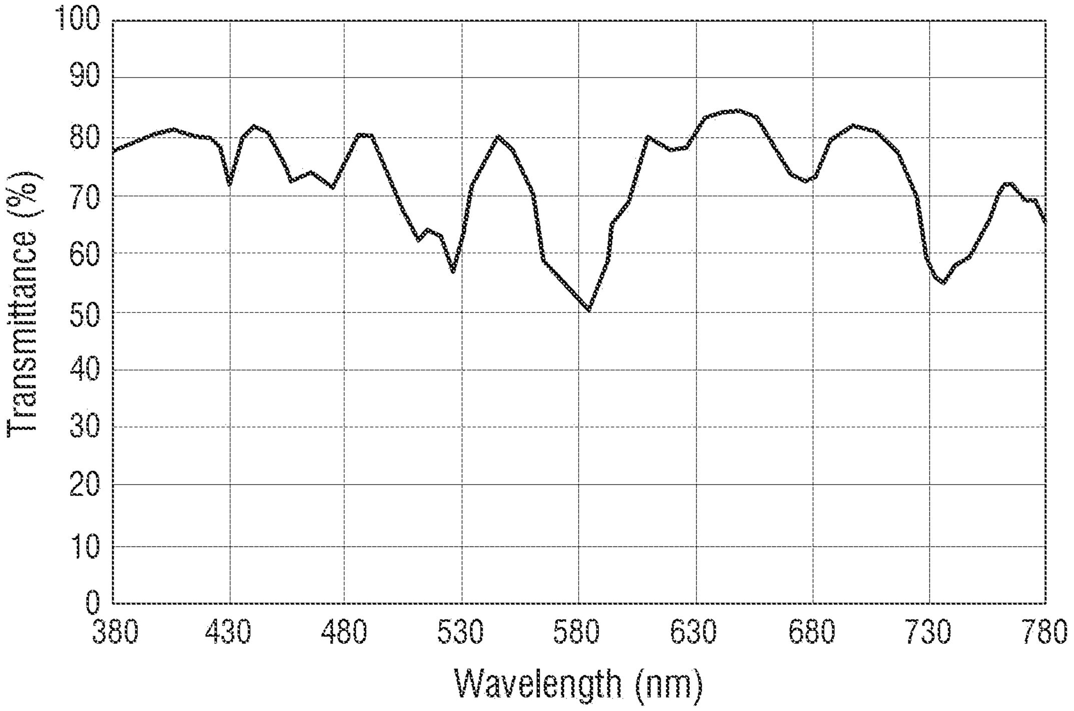
FIG. 8 is a graph illustrating light transmittance for each wavelength band of an inorganic particle.

FIG. 6 is a cross-section view illustrating a display panel according to one or more embodiments. FIG. 7 is a cross-sectional view illustrating a light emitting element according to one or more embodiments. FIG. 8 is a graph illustrating light transmittance for each wavelength band of an inorganic particle. FIG. 6 is a cross-sectional view taken along line C-C' of FIG. 3.

Referring to FIG. 6, the display panel 100 according to one or more embodiments may include a substrate 110 including a plurality of light emitting areas EA, a plurality of light emitting parts 130 provided on the substrate 110 and corresponding to the plurality of light emitting areas EA, respectively, and a partition wall portion 140 provided on the substrate 110 and corresponding to a boundary between the plurality of light emitting areas EA.

Each of the plurality of light emitting parts 130 may correspond to any one of two or more different colors. The plurality of light emitting parts 130 may include a light emitting element (LE) mounted on a substrate 110, and may include color conversion layers CCL1 and CCL2 that convert light from the light emitting element LE into any one wavelength band, and a light transmitting layer LTL.

For example, the plurality of light emitting parts 130 may include a first light emitting part 131 corresponding to the first light emitting area EA1 emitting (e.g., configured to emit) the light in the first wavelength band, a second light emitting part 132 corresponding to the second light emitting area EA2 emitting (e.g., configured to emit) the light in the second wavelength band, and a third light emitting part 133 corresponding to the third light emitting area EA3 emitting (e.g., configured to emit) the light in the third wavelength band.

As an example, the first wavelength band may be red corresponding to approximately 600 nm to 750 nm. The second wavelength band may be green corresponding to approximately 480 nm to 560 nm. The third wavelength band may be blue corresponding to approximately 420 nm to 460 nm.

Hereinafter, although the colors of the light of the first wavelength band, the second wavelength band, and the third wavelength band are described as red, green, and blue, respectively, this is only an example, and the colors corresponding to the plurality of light emitting areas EA and the respective wavelength bands thereof according to the present embodiments are not limited to the above example.

According to one or more embodiments, each of the first light emitting part 131, the second light emitting part 132, and the third light emitting part 133 may include a light emitting element LE that emits light in the third wavelength band.

For example, each of the first light emitting part 131, the second light emitting part 132, and the third light emitting part 133 may include a light emitting element LE that emits light in a blue wavelength band. As an example, any one selected from the first light emitting part 131, the second light emitting part 132, and the third light emitting part 133 may include a light emitting element LE that emits blue light corresponding to a blue wave band of 440 nm to 470 nm.

Referring to FIG. 7, the vertical type (or kind) light emitting element LE may include a first semiconductor layer SEL1 and a second semiconductor layer SEL2 that face each other and are doped with dopants of different conductive types (e.g., dopants with different conductivities), and an active layer MQW interposed between the first semiconductor layer SEL1 and the second semiconductor layer SEL2.

The vertical type (or kind) light emitting element LE may further include a first diode electrode DE1 provided on a lower side of the first semiconductor layer SEL1 and a second diode electrode DE2 provided on the second semiconductor layer SEL2. Depending on a packaging of the vertical type (or kind) light emitting element LE, the first diode electrode DE1 and the second diode electrode DE2 may not be provided (e.g., may be omitted).

The first semiconductor layer SEL1 may be a p-type semiconductor, and may include a semiconductor material having a chemical formula of $Al_xGa_yIn_{1-x-y}N$ ($0 \le x \le 1$, $0 \le y \le 1$, and $0 \le x+y \le 1$). For example, the first semiconductor layer SEL1 may be one or more selected from AlGaInN, GaN, AlGaN, InGaN, AlN, and InN doped with a p-type dopant. The p-type dopant doped in the first semiconductor layer SEL1 may be Mg, Zn, Ca, Ba, and/or the like.

The light emitting element LE may further include an electron blocking layer provided between the first semiconductor layer SEL1 and the active layer MQW. The electron blocking layer may be formed of p-AlGaN doped with a p-type dopant. The electron blocking layer may prevent or reduce movement of electrons from the active layer MQW to the first semiconductor layer SEL1.

The active layer MQW emits energy in the form of photons while generating electron-hole pairs by combining holes and electrons respectively supplied from the first semiconductor layer SEL1 and the second semiconductor layer SEL2 according to a driving current. In one or more embodiments, the active layer MQW of the light emitting element LE may emit light corresponding to a wavelength band of approximately 400 nm to 420 nm. In some embodiments, the active layer MQW of the light emitting element LE may emit light corresponding to a wavelength band of approximately 440 nm to 470 nm.

The active layer MQW may have a single or multi quantum well structure. As an example, the active layer MQW may have a multi quantum well structure in which well layers and barrier layers are alternately stacked. Here, the well layer may be made of InGaN. In some embodiments, the barrier layer may be made of GaN and/or AlGaN. The well layer may have a thickness of approximately 1 nm to 4 nm, and the barrier layer may have a thickness of approximately 3 nm to 10 nm. However, this is only an example, and the material and structure of the active layer MQW of the light emitting element LE may be variously suitably changed.

In some embodiments, the active layer MQW may have a structure in which a semiconductor material having a large bandgap energy and a semiconductor material having a low bandgap energy are alternately stacked. In some embodiments, the active layer MQW may include group 3 to group 5 semiconductor materials corresponding to a target wavelength band of the light emitting element LE.

The light emitting element LE may further include a superlattice layer provided between the active layer MQW and the second semiconductor layer SEL2 and alleviating or reducing a stress difference between the active layer MQW and the second semiconductor layer SEL2. The superlattice layer may be made of InGaN and/or GaN.

The second semiconductor layer SEL2 may be an n-type semiconductor. The second semiconductor layer SEL2 may include a semiconductor material having a chemical formula of $Al_xGa_yIn_{1-x-y}N$ ($0 \le x \le 1$, $0 \le y \le 1$, and $0 \le x+y \le 1$). For example, the second semiconductor layer SEL2 may be one or more selected from AlGaInN, GaN, AlGaN, InGaN, AlN, and InN doped with an n-type dopant. The n-type dopant doped in the second semiconductor layer SEL2 may be Si, Ge, Sn, Se, and/or the like.

As illustrated in FIG. 6, according to one or more embodiments, as each of the first light emitting part 131 and the second light emitting part 132 includes the light emitting element LE that emits the blue light, the first light emitting part 131 and the second light emitting part 132 may include color conversion layers CCL1 and CCL2 including wavelength conversion particles NP1 and NP2, respectively, for converting the blue light of the light emitting element LE into respective colors. The third light emitting part 133 may include a light transmitting layer LTL capable of transmitting the blue light as it is.

The first light emitting part 131 may include a first color conversion layer CCL1 including a first base resin BS1 in which first wavelength conversion particles NP1 are dispersed.

The first base resin BS1 may include a material having a relatively (or suitably) high light transmittance. The first base resin BS1 may be made of a transparent organic material. For example, the first base resin BS1 may include at least one of organic materials such as an epoxy-based resin, an acrylic resin, a cardo-based resin, and/or an imide-based resin.

The first wavelength conversion particle NP1 may convert light in a blue wavelength band into light in a first wavelength band. For example, the first wavelength conversion particle NP1 may convert the light in the blue wavelength band emitted from the light emitting element LE into light in a red wavelength band and emit the converted light. The first wavelength conversion particle NP1 may include a phosphor and/or a quantum dot.

A phosphor that converts the light in the blue wavelength band into the light in the red wavelength band may include any one or more selected from the group consisting of, for example, (Sr, Ca)$AlSiN_3$: $Eu^{2+}$, $K_2$(Si, Ti, Ge)$SiF_6$: $Mn^{4+}$, $Na_2SiF_6$: $Mn^{4+}$, 3.5MgO·0.5$MgF_2$·$GeO_2$: $Mn^{4+}$, Sr[$Li_2Al_2O_2N_2$]: $Eu^{2+}$, (Sr, Ba)$_2Si_5N_8$: $Eu^{2+}$, CaS: $Eu^{2+}$, and $BaMgAl_{10}O_{17}$: $Mn^{4+}$, $Mg^{2+}$.

The quantum dot may include group IV nanocrystals, group II-VI compound nanocrystals, group III-V compound nanocrystals, group IV-VI compound nanocrystals, or combinations thereof.

For example, the quantum dot may have a core-shell structure including a core including the above-described nanocrystals and a shell surrounding (e.g., around) the core. The shell of the quantum dot may serve as a protective layer for maintaining semiconductor properties by preventing or reducing chemical denaturation, and a charging layer for imparting electrophoretic properties to the quantum dot. The shell may be a single layer or multiple layers. An interface between the core and the shell may have a concentration gradient at which a concentration of element present in the shell decreases toward the center. The shell of the quantum dot may be formed of a metal oxide, a non-metal oxide, a semiconductor compound, or a combination thereof.

For example, the core of the quantum dot may be formed of at least one selected from CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge.

The shell of the quantum dot may be formed of at least one selected from ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TIAs, TISb, PbS, PbSe, and PbTe.

In one or more embodiments, the quantum dot included in the first light emitting part 131 converts the light in the blue wavelength band into the light in the red wavelength band, and may include any one or more selected the group consisting of, for example, CdSe, CuInS, CdTe, $CsPBI_3$, and $CuZnSe_2$.

The second light emitting part 132 may include a second color conversion layer CCL2 including a second base resin BS2 in which second wavelength conversion particles NP2 are dispersed.

The second base resin BS2 may be formed of a transparent organic material having a relatively (or suitably) high light transmittance. For example, the second base resin BS2 may be formed of the same material as the first base resin BS1 or be formed of the material exemplified in connection with the first base resin BS1.

The second wavelength conversion particle NP2 may convert light in a blue wavelength band into light in a second wavelength band. For example, the second wavelength conversion particle NP2 may convert the light in the blue wavelength band emitted from the light emitting element LE into light in a green wavelength band and emit the converted light. The second wavelength conversion particle NP2 may include a phosphor or a quantum dot.

A phosphor that converts the light in the blue wavelength band into the light in the green wavelength band may include any one or more selected from the group consisting of, for example, (Ba, Sr, Mg)$_2SiO_4$: $Eu^{2+}$, Beta SiAlON: $Eu^{2+}$ of $Sr_{6-z}Al_zO_zN_{8-z}$, (Lu, Y)$_3$(Al, Ga)$_5O_{12}$: $Ce^{3+}$, $Ba_3Si_6O_{12}N_2$: $Eu^{2+}$, $SrGa_2S_4$: $Eu^{2+}$, and Gamma-AlON: $Eu^{2+}$.

The quantum dot included in the second light emitting part 132 converts the light in the blue wavelength band into the light in the green wavelength band, and may include any one or more selected from the group consisting of InP, CuGaS, CdSe, CdTe, ZnSe, ZnSeTe, $AgGaSe_2$, $AgZnS_2$, $CuGaSe_2$, and $CsPbBr_3$.

The third light emitting part 133 may include a light transmitting layer LTL including a third base resin BS3. The third light emitting part 133 may emit the blue light by transmitting the blue light emitted from the light emitting element LE as it is while maintaining the blue light.

The third base resin BS3 may be formed of a transparent organic material having a relatively (or suitably) high light transmittance. For example, the third base resin BS3 may be formed of the same material as the first base resin BS1 or be formed of the material exemplified in connection with the first base resin BS1.

The first color conversion layer CCL1, the second color conversion layer CCL2, and the light transmitting layer LTL described above may further include a scatterer. The scatterer may induce light absorption of the wavelength conversion particles NP1 and NP2 and scatter the light.

The scatterer may have a refractive index different from that of the base resins BS1, BS2, and BS3. For example, the scatterer may include a light scattering material and/or a light scattering particle that scatters at least a portion of transmitted light. For example, the first scatterer may include a metal oxide particle such as titanium oxide ($TiO_2$), zirconium oxide ($ZrO_2$), aluminum oxide ($Al_xO_y$), indium oxide ($In_2O_3$), zinc oxide (ZnO), and/or tin oxide ($SnO_2$), and/or may include an organic particle such as an acrylic resin and/or a urethane resin. The scatterer may scatter light in a random direction regardless of an incident direction of the incident light without substantially converting a wavelength of the incident light.

The partition wall portion 140 may be provided to correspond to a boundary between the plurality of light emitting areas EA. The partition wall portion 140 may be provided to be spaced apart from the light emitting element LE and surround the light emitting element LE. The partition wall portion 140 may be formed of a light absorbing material such as a black matrix.

The display panel 100 according to one or more embodiments may further include a transistor array 120 provided on the substrate 110. In this case, the plurality of light emitting parts 130 and the partition wall portion 140 may be provided on the transistor array 120.

The transistor array 120 may include at least one thin film transistor T1 provided on the substrate 110 and corresponding to each of the plurality of light emitting areas EA, a common line CL provided on the substrate 110 and extending in a set or predetermined direction corresponding to the arrangement directions DR1 and DR2 of the plurality of light emitting areas EA, a planarization film 121 covering the common line CL and at least one thin film transistor T1 of each of the plurality of light emitting areas EA, a plurality of pixel electrodes PE provided on the planarization film 121 and respectively corresponding to the plurality of light emitting areas EA, and a plurality of common electrodes CE provided on the planarization film 121, respectively corresponding to the plurality of light emitting areas EA, spaced apart from the pixel electrodes PE, and electrically connected to the common line CL.

At least one thin film transistor T1 corresponding to each of the plurality of light emitting areas EA may include an active layer provided on the substrate 110 and made of a semiconductor material, and a gate electrode overlapping a channel region of the active layer. The active layer and the gate electrode may be insulated from each other with a gate insulating film therebetween. The active layer includes a source region and a drain region in contact with both sides of the channel region. Any one of the source region or the drain region may be connected to the pixel electrode PE on the planarization film 121 through a first contact hole CH1 that penetrates through at least the planarization film 121. The other of the source region and the drain region may be connected to a power line (PL in FIG. 5).

In some embodiments, at least one thin film transistor T1 corresponding to each of the plurality of light emitting areas EA may further include a source electrode and a drain electrode provided on a layer different from that of the gate electrode, the gate electrode being respectively connected to the source region and the drain region in contact with both sides of the channel region of the active layer. In this case, the pixel electrode PE may be connected to any one of the source electrode or the drain electrode instead of the active layer.

The common line CL may be insulated from the thin film transistor T1 and may extend in at least one of the first direction DR1 and the second direction DR2. The common line CL may be connected to the common electrode CE on the planarization film 121 through a second contact hole CH2 that penetrates through at least the planarization film 121.

The planarization film 121 may planarize (or substantially or suitably planarize) a step difference on a lower side thereof. The planarization film 121 may be formed of an organic insulating material such as any one selected from an acrylic resin, an epoxy resin, a phenolic resin, a polyamide resin, and a polyimide resin.

A portion of the plurality of light emitting areas EA may correspond to the pixel electrode PE, and another portion thereof may correspond to the common electrode CE.

The pixel electrode PE and the common electrode CE may be formed as a single layer or multiple layers made of any one selected from molybdenum (Mo), aluminum (Al), chromium (Cr), gold (Au), titanium (Ti), nickel (Ni), neodymium (Nd), copper (Cu), and alloys thereof.

In the light emitting element LE of each of the plurality of light emitting parts 130, the first diode electrode (DE1 in FIG. 7) may be provided on the pixel electrode PE, face the pixel electrode PE, and be electrically connected to the pixel electrode PE through contact with the pixel electrode PE.

When the light emitting element LE of each of the plurality of light emitting parts 130 is a vertical type (or kind), the second diode electrode (DE2 in FIG. 7) of the light emitting element LE may face the first diode electrode DE1 and may be electrically connected to the common electrode CE through a set or predetermined bonding wire BW.

In some embodiments, although not illustrated, when the light emitting element LE of each of the plurality of light emitting parts 130 is a lateral type (or kind), the first diode electrode DE1 and the second diode electrode DE2 of the light emitting element LE may be respectively connected to the pixel electrode PE and the common electrode CE through respective bonding wires BW.

The display panel 100 according to one or more embodiments may further include a protective layer 150 provided on the plurality of light emitting parts 130 and the partition wall portion 140, and a color filter layer 160 provided on the protective layer 150.

The protective layer 150 may seal upper portions of the color conversion layers CCL1 and CCL2 and the light transmitting layer LTL of each light emitting part 130. The protective layer 150 may include an inorganic material. For example, the protective layer 150 may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. However, the present disclosure is not limited thereto and the protective layer 150 may not be provided (e.g., may be omitted).

Because the first color conversion layer CCL1 and the second color conversion layer CCL2 may be sealed by the protective layer 150, the wavelength conversion particles NP1 and NP2 of the first color conversion layer CCL1 and the second color conversion layer CCL2 may be protected from moisture. Accordingly, deterioration of the wavelength conversion particles NP1 and NP2 due to moisture permeation may be prevented or reduced.

The color filter layer 160 may include a first color filter corresponding to the first light emitting part 131 emitting (e.g., configured to emit) the light in the first wavelength band, a second color filter 162 corresponding to the second light emitting part 132 emitting (e.g., configured to emit) the light in the second wavelength band, a third color filter 163 corresponding to the third light emitting part 133 emitting (e.g., configured to emit) the light in the third wavelength band, and light blocking unit 164 corresponding to the partition wall portion 140.

The light blocking unit 164 may overlap the partition wall portion 140 in the thickness direction. The light blocking unit 164 may block or reduce transmission of light. The light blocking unit 164 may improve a color reproduction ratio by preventing or reducing the permeation of light and mixing of the colors, between the light emitting parts 130. In some embodiments, the light blocking unit 164 may be provided in a grid shape surrounding (e.g., around) the light emitting parts 130 in a plan view.

The first color filter 161 may include a dye or a pigment of a color of a first wavelength band and may selectively transmit light in a wavelength band corresponding to the first wavelength band. The first color filter 161 may absorb, block, or reduce the rest of the light of the first color conversion layer CCL1, except for the light in the first wavelength band.

The second color filter 162 may include a dye or a pigment of a color of a second wavelength band and may selectively transmit light in a wavelength band corresponding to the second wavelength band. The second color filter 162 may absorb, block, or reduce the rest of the light of the second color conversion layer CCL2 except for the light in the first wavelength band.

The third color filter 163 may include a dye or a pigment of a color of a third wavelength band and may selectively transmit light in a wavelength band corresponding to the third wavelength band. The third color filter 163 may absorb, block, or reduce the rest of the light transmitting through the light transmitting layer LTL except for the light corresponding to the third wavelength band.

The light blocking unit 164 together with the partition wall portion 140 described above may prevent or reduce mixing of the light emitted from each of the first light emitting part 131, the second light emitting part 132, and the third light emitting part 133 that are adjacent to each other and correspond to different colors.

In one or more embodiments, first inorganic particles AP1 may be included in the first light emitting part 131 corresponding to the first light emitting area EA1.

The first inorganic particle AP1 may absorb light in a set or specific wavelength band to reduce a full width at half maximum (FWHM) of the set or specific wavelength band. The first inorganic particles AP1 may be included in the first base resin BS1 of the first color conversion layer CCL1 and may be randomly dispersed. The first inorganic particle AP1 may be formed of an inorganic compound, and may be, for example, $Nd_2(Si, Ti, Ge)_2O_7$.

As illustrated in FIG. 8, $Nd_2(Si, Ti, Ge)_2O_7$ represents a different transmittance for each wavelength band. For example, $Nd_2(Si, Ti, Ge)_2O_7$ represents a transmittance of 72% to 78% in a wavelength band of about 420 nm to 440 nm, represents a transmittance of 57% to 64% in a wavelength band of about 520 nm to 540 nm, represents a transmittance of 50% to 58% in a wavelength band of about 565 nm to 585 nm, represents a transmittance of 68% to 78% in a wavelength band of about 600 nm to 620 nm, and represents a transmittance of 72% to 73% in a wavelength band of about 670 nm to 680 nm.

When the first wavelength conversion particles NP1 having a light spectrum of a broad wavelength band are included in the first color conversion layer CCL1, the first inorganic particle AP1 may absorb light in a wavelength band around a peak wavelength, thereby reducing a full width at half maximum of the light spectrum. For example, when a wavelength band of red light in the light spectrum is about 590 nm to 650 nm and the peak wavelength is 610 nm, the first inorganic particle AP1 may partially absorb light in the wavelength bands of about 590 nm to 600 nm and 630 nm to 650 nm around the peak wavelength, thereby reducing a full width at half maximum of a red light spectrum. Accordingly, a color reproduction ratio and color purity of the light emitted from the first light emitting part 131 may be improved.

The first inorganic particles AP1 may have a size in a range of about 10 nm to 10 μm. At least some of the first inorganic particles AP1 may have the same size, and at least some of the first inorganic particles AP1 may have different sizes within the above-described range. The above-described characteristics of the first inorganic particles AP1 do not vary depending on the particle size, and thus are not limited to the above-described range.

In some embodiments, the first inorganic particles AP1 may be included in the first base resin BS1 of the first color conversion layer CCL1 in a range of 0.1 wt % to 10 wt %. When the content of the first inorganic particles AP1 is included within the above-described range, the first inorganic particles AP1 may reduce the full width at half maximum of the wavelength band of the light emitted from the first color conversion layer CCL1, thereby improving a color reproduction ratio and color purity.

Figure 9:
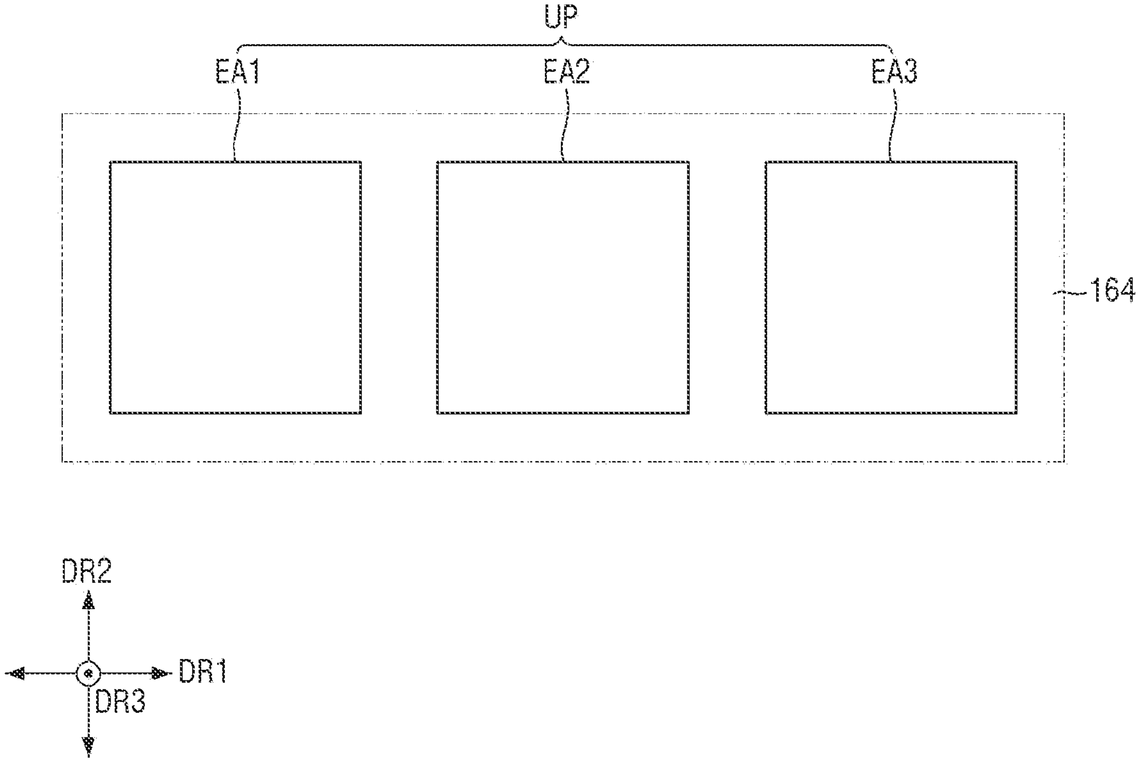
FIG. 9 is a plan view illustrating an example of a unit pixel of a display panel according to one or more embodiments.
Figure 10:
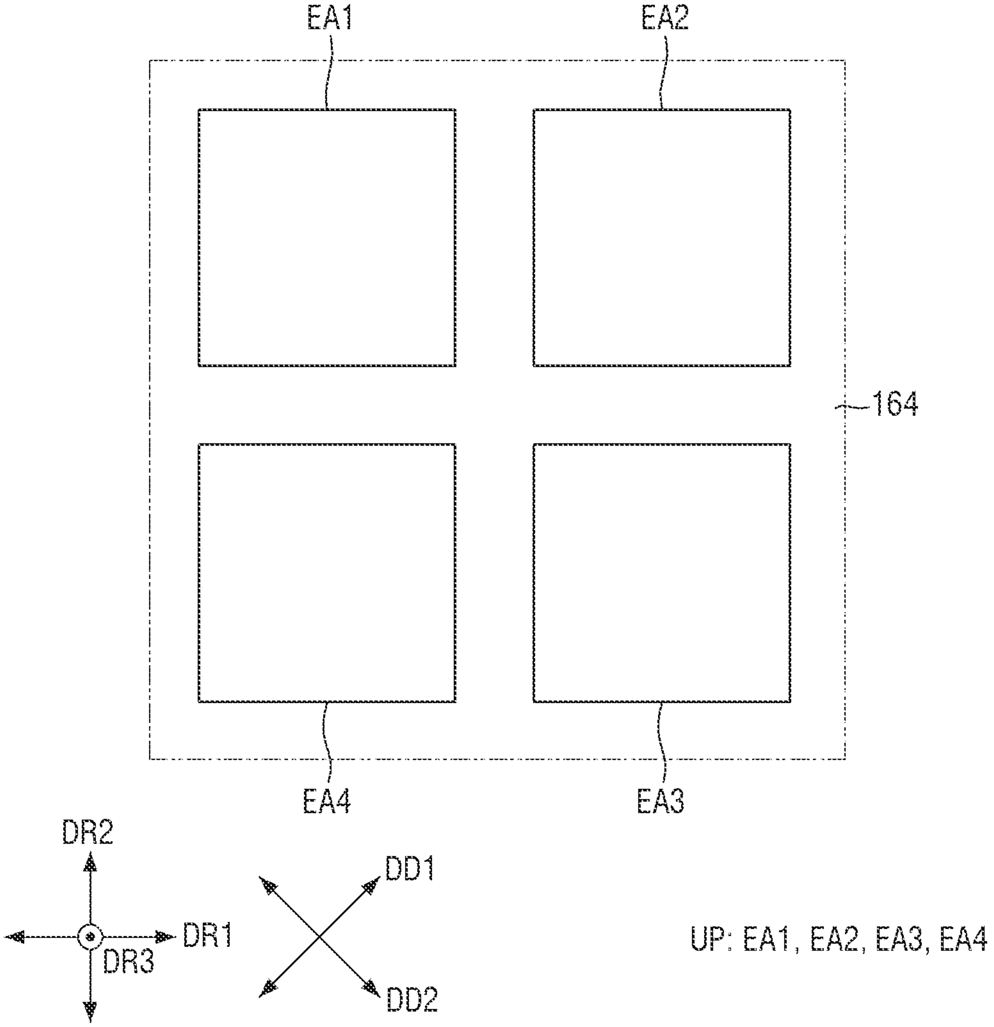
FIG. 10 is a plan view illustrating another example of the unit pixel of the display panel according to one or more embodiments.

FIG. 9 is a plan view illustrating an example of a unit pixel of a display panel according to one or more embodiments. FIG. 10 is a plan view illustrating another example of the unit pixel of the display panel according to one or more embodiments.

Referring to FIG. 9, the unit pixel UP of the display panel 100 according to one or more embodiments may have the first light emitting area EA1, the second light emitting area EA2, and the third light emitting area EA3 that are sequentially provided in the first direction DR1. The partition wall portion 140 may be provided between the first light emitting area EA1, the second light emitting area EA2, and the third light emitting area EA3 to distinguish the first light emitting area EA1, the second light emitting area EA2, and the third light emitting area EA3 from each other. The unit pixel UP may be repeatedly provided in the first direction DR1 and the second direction DR2. For example, the first light emitting area EA1 may be provided repeatedly with each other in the second direction DR2, the second light emitting area EA2 may be provided repeatedly with each other in the second direction DR2, and the third light emitting area EA3 may be provided repeatedly with each other in the second direction DR2.

In some embodiments, referring to FIG. 10, the unit pixel UP of the display panel 100 according to one or more embodiments may have the first light emitting area EA1, the second light emitting area EA2, the third light emitting area EA3, and a fourth light emitting area EA4. Here, the first light emitting area EA1 may emit light in a first wavelength band, the second light emitting area EA2 may emit light in a second wavelength band, and the third light emitting area EA3 may emit light in a third wavelength band. The fourth light emitting area EA4 may emit the same light in the second wavelength band as that of the second light emitting area EA2. For example, the first light emitting area EA1 may emit red light, the second light emitting area EA2 and the fourth light emitting area EA4 may emit green light, and the third light emitting area EA3 may emit blue light.

The second light emitting area EA2 may be provided in the first direction DR1 of the first light emitting area EA1, and the fourth light emitting area EA4 may be provided in the second direction DR2 of the first light emitting area EA1. The fourth light emitting area EA4 may be provided in a first diagonal direction DD1 of the second light emitting area EA2, and the third light emitting area EA3 may be provided in a second diagonal direction DD2 of the first light emitting area EA1.

Each of the above-described first light emitting area EA1, second light emitting area EA2, third light emitting area EA3, and fourth light emitting area EA4 may have substantially the same area, but are not limited thereto. For example, the areas of the first light emitting area EA1, the second light emitting area EA2, and the third light emitting area EA3 may be different from each other, and the areas of the second light emitting area EA2 and the fourth light emitting area EA4 may be the same as each other.

Hereinafter, other embodiments of the display panel of the display device according to one or more embodiments will be described with reference to the drawings.

Figure 11:
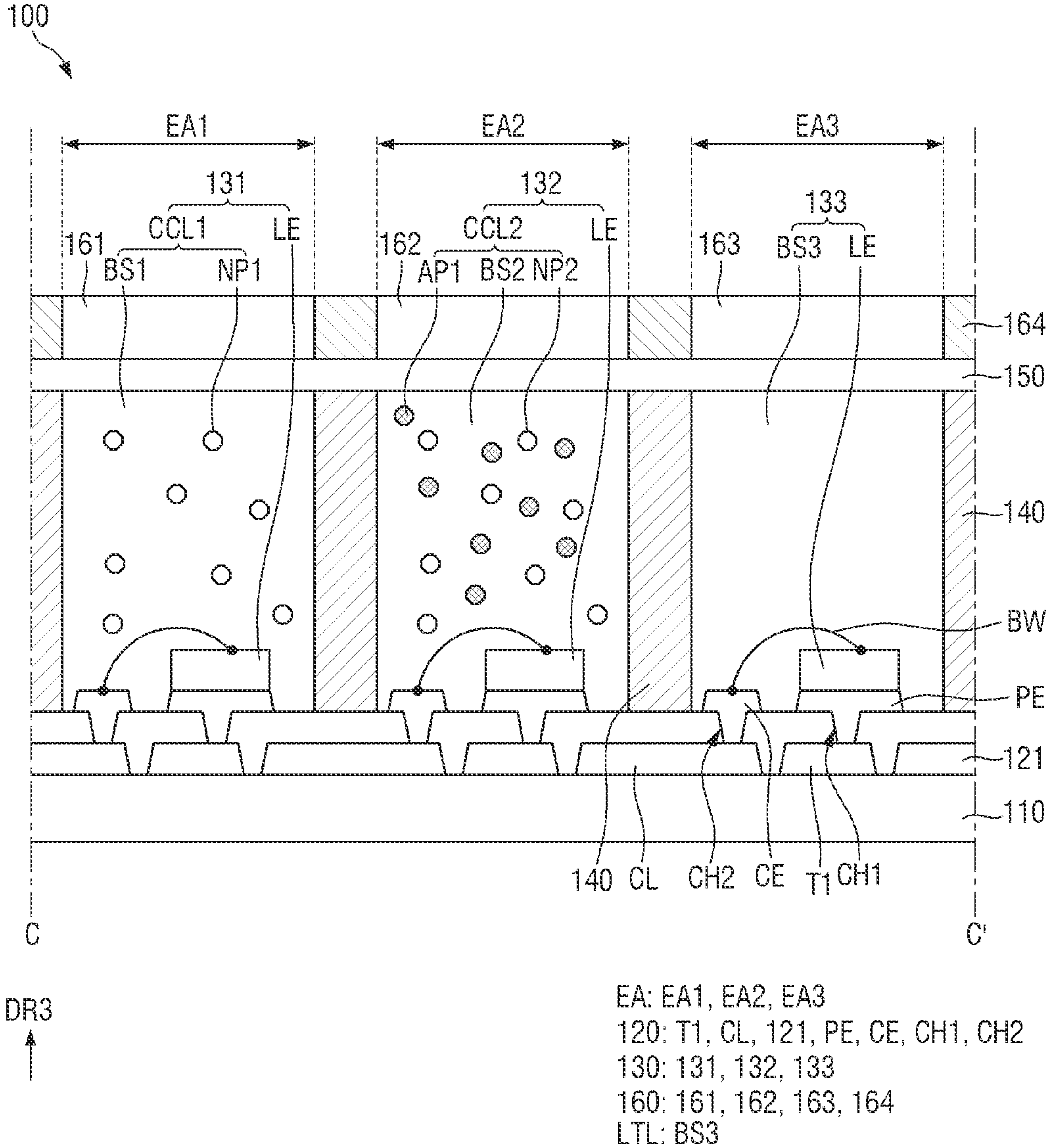
FIG. 11 is a cross-sectional view illustrating a display panel according to one or more embodiments.

FIG. 11 is a cross-sectional view illustrating a display panel according to one or more embodiments.

The embodiment of FIG. 11 is different from the above-described embodiment of FIG. 6 in that the first inorganic particles AP1 are not included in the first color conversion layer CCL1 of the first light emitting part 131 but are included in a second color conversion layer CCL2 of the second light emitting part 132. Hereinafter, differences from the above-described embodiment of FIG. 6 will be mainly described.

Referring to FIG. 11, the second light emitting part 132 corresponding to the second light emitting area EA2 may include a second color conversion layer CCL2. The second color conversion layer CCL2 may include the second wavelength conversion particles NP2 and the first inorganic particles AP1 dispersed in the second base resin BS2.

In the second light emitting part 132, the light in the blue wavelength band emitted from the light emitting element LE may be converted into the light in the green wavelength band by the second wavelength conversion particles NP2 and emitted. A portion of light in a set or specific wavelength band among the light in the green wavelength band is absorbed by the first inorganic particle AP1, so that a full width of half maximum of a light spectrum may be reduced.

The first inorganic particles AP1 may be included in the second base resin BS2 of the second color conversion layer CCL2 and may be randomly dispersed. The second inorganic particle AP2 may be formed of an inorganic compound, and may be, for example, $Nd_2(Si, Ti, Ge)_2O_7$.

The first inorganic particles AP1 may have a size in a range of about 10 nm to 10 μm. The first inorganic particles AP1 may be included in the second base resin BS2 of the second color conversion layer CCL2 in the range of 0.1 wt % to 10 wt %. When the content of the first inorganic particles AP1 is included within the above-described range, the first inorganic particles AP1 may reduce the full width at half maximum of the wavelength band of the light emitted from the second color conversion layer CCL2, thereby improving a color reproduction ratio and color purity.

Figure 12:
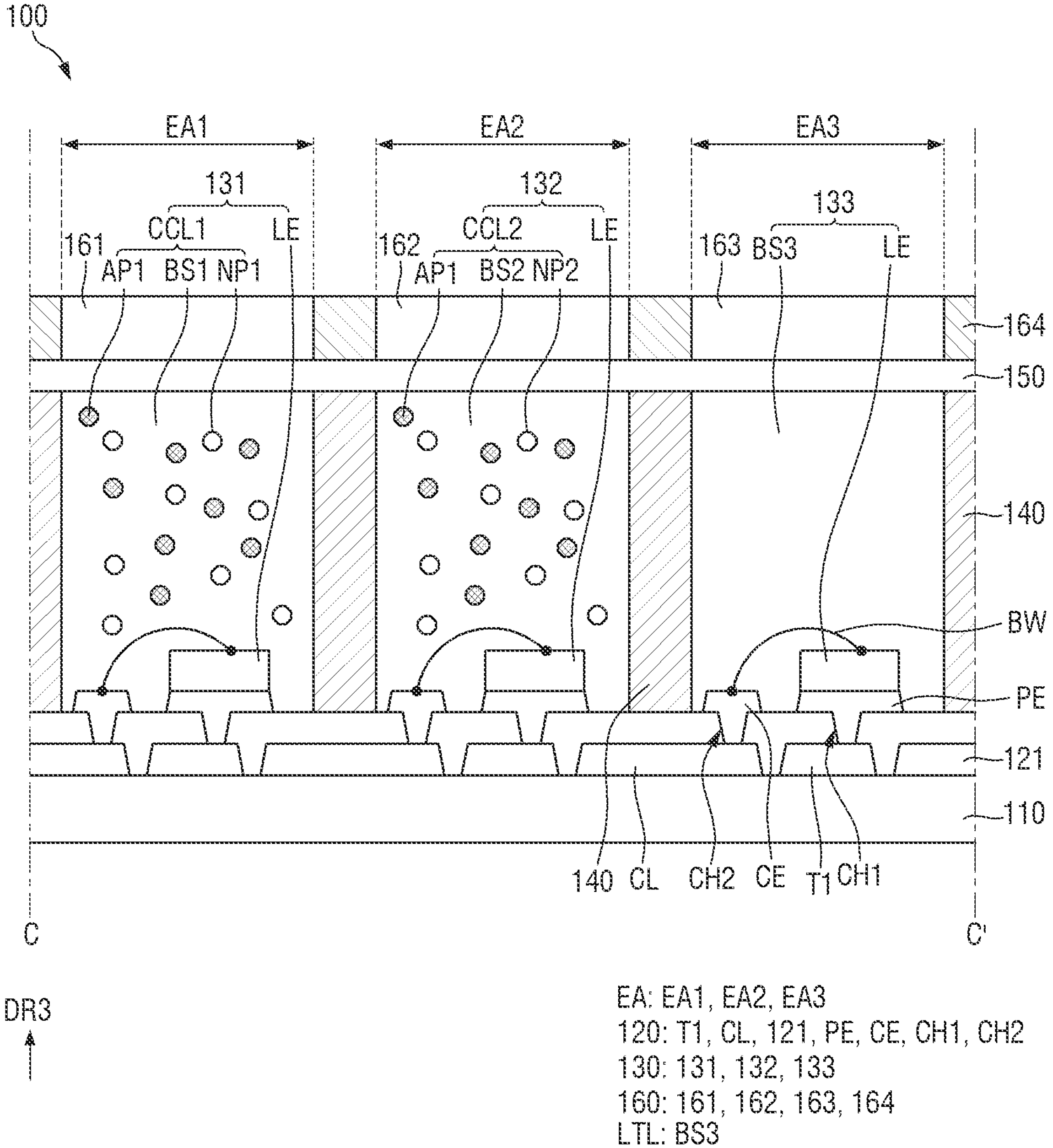
FIG. 12 is a cross-sectional view illustrating a display panel according to one or more embodiments.

FIG. 12 is a cross-sectional view illustrating a display panel according to one or more embodiments.

The embodiment of FIG. 12 is different from the above-described embodiment of FIG. 6 in that the first inorganic particles AP1 are included in the first color conversion layer CCL1 of the first light emitting part 131 and the second color conversion layer CCL2 of the second light emitting part 132, respectively. Hereinafter, differences from the above-described embodiment of FIG. 6 will be mainly described.

Referring to FIG. 12, the first light emitting part 131 corresponding to the first light emitting area EA1 may include the first color conversion layer CCL1. The first color conversion layer CCL1 may include the first wavelength conversion particles NP1 and the first inorganic particles AP1 dispersed in the first base resin BS1. The second light emitting part 132 corresponding to the second light emitting area EA2 may include the second color conversion layer CCL2. The second color conversion layer CCL2 may include the second wavelength conversion particles NP2 and the first inorganic particles AP1 dispersed in the second base resin BS2.

In the first light emitting part 131, the light in the blue wavelength band emitted from the light emitting element LE may be converted into the light in the red wavelength band by the first wavelength conversion particles NP1 and emitted. A portion of light in a set or specific wavelength band among the light in the red wavelength band is absorbed by the first inorganic particle AP1, so that a full width of half maximum of a light spectrum may be reduced. In the second light emitting part 132, the light in the blue wavelength band emitted from the light emitting element LE may be converted into the light in the green wavelength band by the second wavelength conversion particles NP2 and emitted. A portion of light in a set or specific wavelength band among the light in the green wavelength band is absorbed by the first inorganic particle AP1, so that a full width of half maximum of a light spectrum may be reduced.

The first inorganic particles AP1 may be included in the first base resin BS1 of the first color conversion layer CCL1 and the second base resin BS2 of the second color conversion layer CCL2, respectively, and may be randomly dispersed. The first inorganic particle AP1 may be formed of an inorganic compound, and may be, for example, $Nd_2(Si, Ti, Ge)_2O_7$. The first inorganic particles AP1 may have a size in a range of about 10 nm to 10 μm. The first inorganic particles AP1 may be included in each of the first base resin BS1 and the second base resin BS2 of the first color conversion layer CCL1 and the second color conversion layer CCL2, respectively, in the range of 0.1 wt % to 10 wt %. When the content of the first inorganic particles AP1 is included within the above-described range, the first inorganic particles AP1 may reduce the full width at half maximum of the wavelength band of the light emitted from the first color conversion layer CCL1 and the second color conversion layer CCL2, thereby improving a color reproduction ratio and color purity.

Figure 13:
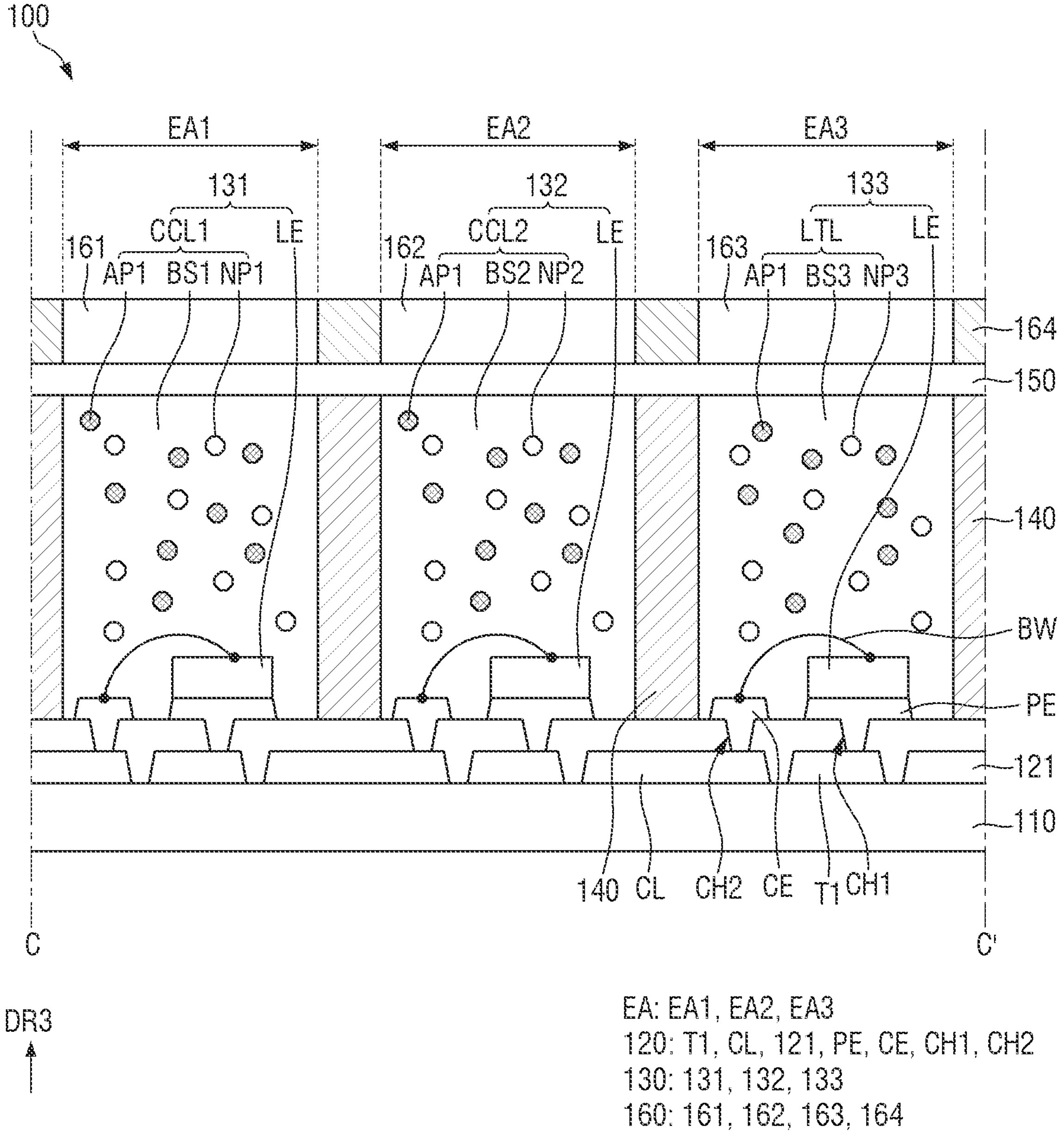
FIG. 13 is a cross-sectional view illustrating a display panel according to one or more embodiments.

FIG. 13 is a cross-sectional view illustrating a display panel according to one or more embodiments.

The embodiment of FIG. 13 is different from the above-described embodiment of FIG. 12 in that the light emitting element LE emits light in an ultraviolet wavelength band and the light transmitting layer LTL of the third light emitting part 133 includes third wavelength conversion particles NP3 and first inorganic particles AP1. Hereinafter, differences from the above-described embodiment of FIG. 12 will be mainly described.

According to one or more embodiments, each of the first light emitting part 131, the second light emitting part 132, and the third light emitting part 133 may include a light emitting element LE that emits light in a wavelength band lower than the third wavelength band. For example, each of the first light emitting part 131, the second light emitting part 132, and the third light emitting part 133 may include a light emitting element LE that emits light in an ultraviolet wavelength band. As an example, each of the first light emitting part 131, the second light emitting part 132, and the third light emitting part 133 may include a light emitting element LE that emits ultraviolet light corresponding to a wave band of approximately 400 nm to 420 nm.

The third light emitting part 133 may include a light transmitting layer LTL including a third base resin BS3 in which third wavelength conversion particles NP3 and first inorganic particles AP1 are dispersed.

The third base resin BS3 may be formed of a transparent organic material having a relatively (or suitably) high light transmittance. For example, the third base resin BS3 may be formed of the same material as the first base resin BS1 or be formed of the material exemplified in connection with the first base resin BS1.

The third wavelength conversion particle NP3 may convert the light in the ultraviolet wavelength band into light in a third wavelength band. For example, the third wavelength conversion particle NP3 may convert the light in the ultraviolet wavelength band emitted from the light emitting element LE into light in a blue wavelength band and emit the converted light. The third wavelength conversion particle NP3 may include a phosphor or a quantum dot.

The phosphor that converts the light in the ultraviolet wavelength band into the light in the blue wavelength band may include, for example, BaAlMg10O17:$Eu^{2+}$.

The quantum dot included in the third light emitting part 133 may convert the light in the ultraviolet wavelength band into the light in the blue wavelength band, and may include any one or more selected from the group consisting of InP, InGaP, CdSe, CdS, ZnSeTe, $AgGaS_2$, $CuGaS_2$, and $CsPbCl_3$.

In the third light emitting part 133, the light in the ultraviolet wavelength band emitted from the light emitting element LE may be converted into the light in the blue wavelength band by the third wavelength conversion particles NP3 and emitted. A portion of light in a set or specific wavelength band among the light in the blue wavelength band is absorbed by the first inorganic particle AP1, so that a full width of half maximum of a light spectrum may be reduced.

The first inorganic particles AP1 may be included in the third base resin BS3 of the light transmitting layer LTL and may be randomly dispersed. The first inorganic particle AP1 may be formed of an inorganic compound, and may be, for example, $Nd_2(Si, Ti, Ge)_2O_7$. The first inorganic particles AP1 may have a size in a range of about 10 nm to 10 μm. The first inorganic particles AP1 may be included in the third base resin BS3 of the light transmitting layer LTL in the range of 0.1 wt % to 10 wt %. When the content of the first inorganic particles AP1 is included within the above-described range, the first inorganic particles AP1 may reduce the full width at half maximum of the wavelength band of the light emitted from the light transmitting layer LTL, thereby improving a color reproduction ratio and color purity.

Figure 14:
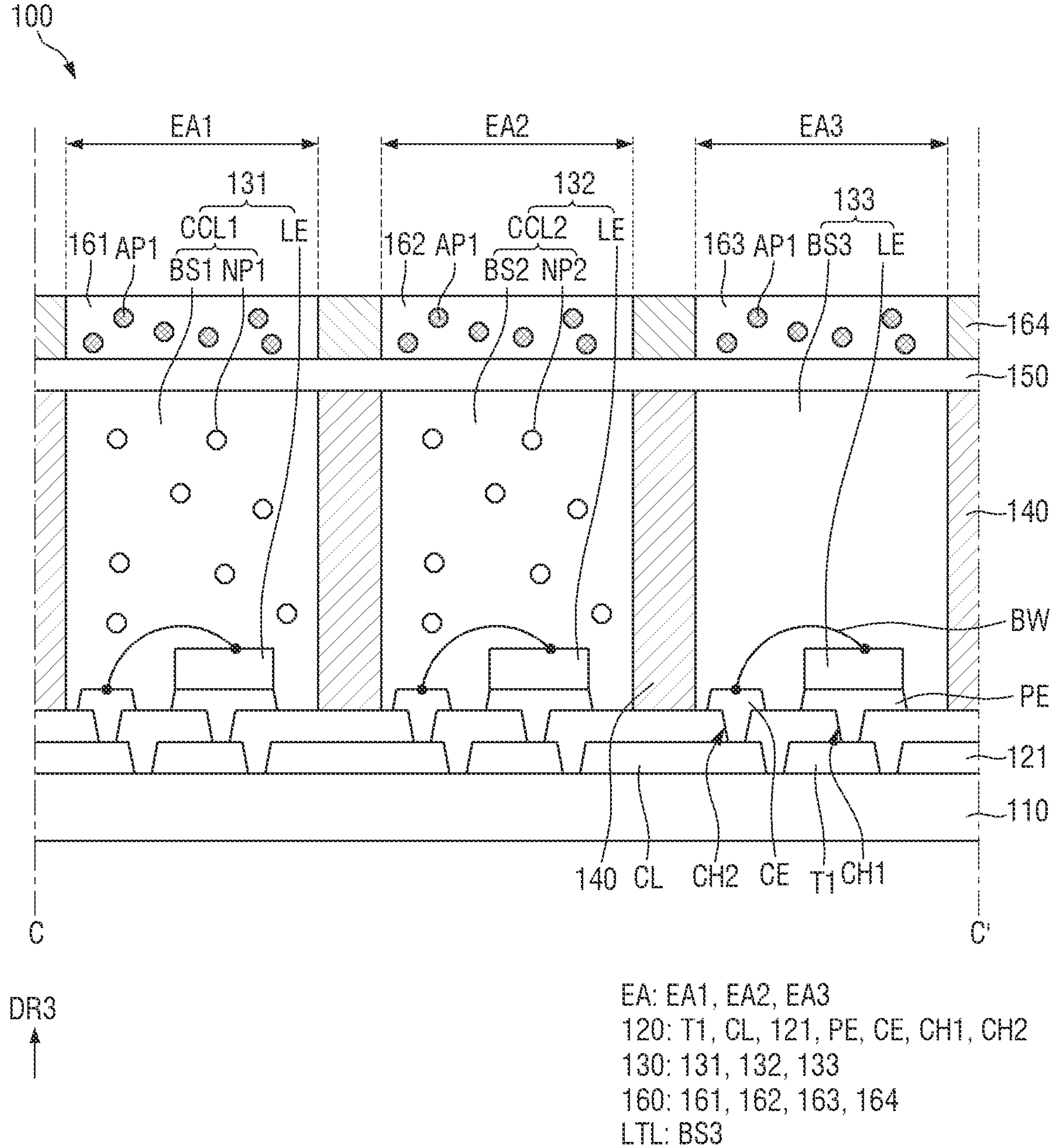
FIG. 14 is a cross-sectional view illustrating a display panel according to one or more embodiments.

FIG. 14 is a cross-sectional view illustrating a display panel according to one or more embodiments.

The embodiment of FIG. 14 is different from the above-described embodiment of FIG. 6 in that the first inorganic particles AP1 are not included in the first light emitting part 131 but are included in the color filter layer 160. Hereinafter, differences from the above-described embodiment of FIG. 6 will be mainly described.

Referring to FIG. 14, the first inorganic particles AP1 may be included in the color filter layer 160. For example, the first inorganic particles AP1 may be included in the first color filter 161, the second color filter 162, and the third color filter 163, respectively.

The first inorganic particle AP1 may partially absorb light in a set or specific wavelength band of the incident light. For the light in the first wavelength band emitted from the first light emitting part 131, light in a partial wavelength band among the light in the first wavelength band is absorbed by the first inorganic particles AP1 in the first color filter 161 provided on the first light emitting part 131, so that a full width at half maximum of a light spectrum may be reduced. For the light in the second wavelength band emitted from the second light emitting part 132, light in a partial wavelength band among the light in the second wavelength band is absorbed by the first inorganic particles AP1 in the second color filter 162 provided on the second light emitting part 132, so that a full width at half maximum of a light spectrum may be reduced. For the light in the third wavelength band emitted from the third light emitting part 133, light in a partial wavelength band among the light in the third wavelength band is absorbed by the first inorganic particles AP1 in the third color filter 163 provided on the third light emitting part 133, so that a full width at half maximum of a light spectrum may be reduced.

Although it is illustrated and described in the embodiment of FIG. 14 that the first inorganic particles AP1 are included in the first color filter 161, the second color filter 162, and the third color filter 163, respectively, the present disclosure is not limited thereto. The first inorganic particles AP1 may be included in one or more selected from the first color filter 161, the second color filter 162, and the third color filter 163. For example, the first inorganic particles AP1 may be included in any one selected from the first color filter 161, the second color filter 162, and the third color filter 163, or may be included in two or more selected from the first color filter 161, the second color filter 162, and the third color filter 163.

Figure 15:
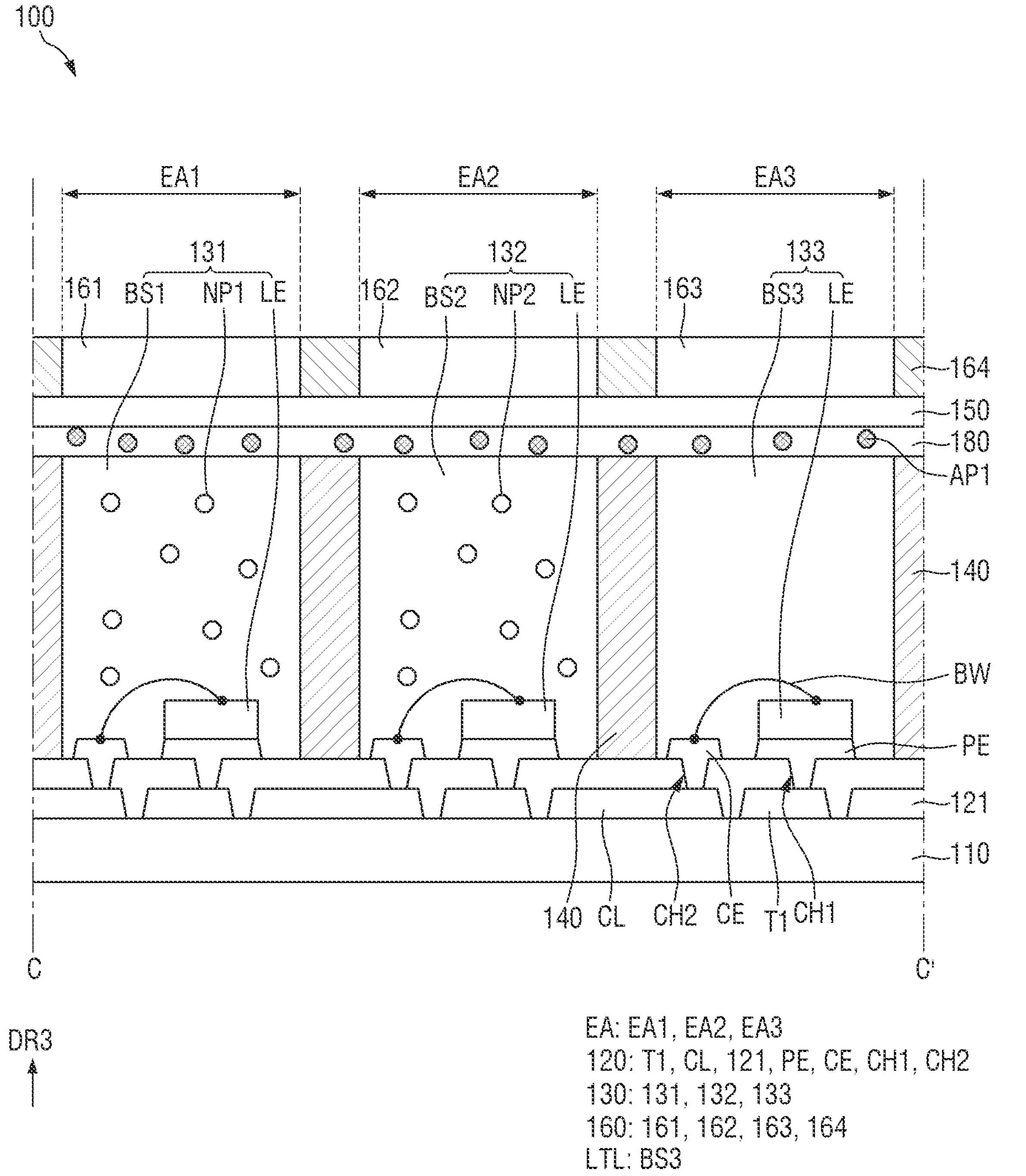
FIG. 15 is a cross-sectional view illustrating a display panel according to one or more embodiments.

FIG. 15 is a cross-sectional view illustrating a display panel according to one or more embodiments.

The embodiment of FIG. 15 is different from the above-described embodiment of FIG. 6 in that the first inorganic particles AP1 are not included in the first light emitting part 131 but are included in an absorption layer 180. Hereinafter, differences from the above-described embodiment of FIG. 6 will be mainly described.

Referring to FIG. 15, an absorption layer 180 may be provided on the partition wall portion 140, the first light emitting part 131, the second light emitting part 132, and the third light emitting part 133. The absorption layer 180 may be provided on a lower side of the protective layer 150 and the color filter layer 160.

The absorption layer 180 may include a material having a relatively (or suitably) high light transmittance. The absorption layer 180 may be formed of a transparent organic material. For example, the absorption layer 180 may include at least one of organic materials such as an epoxy-based resin, an acrylic resin, a cardo-based resin, and/or an imide-based resin.

The absorption layer 180 may include the first inorganic particles AP1. The first inorganic particle AP1 may partially absorb light in a set or specific wavelength band of the incident light. For the light in the first wavelength band emitted from the first light emitting part 131, light in a partial wavelength band among the light in the first wavelength band is absorbed by the first inorganic particles AP1 in the absorption layer 180 provided on the first light emitting part 131, so that a full width at half maximum of a light spectrum may be reduced. For the light in the second wavelength band emitted from the second light emitting part 132, light in a partial wavelength band among the light in the second wavelength band is absorbed by the first inorganic particles AP1 in the absorption layer 180 provided on the second light emitting part 132, so that a full width at half maximum of a light spectrum may be reduced. For the light in the third wavelength band emitted from the third light emitting part 133, light in a partial wavelength band among the light in the third wavelength band is absorbed by the first inorganic particles AP1 in the absorption layer 180 provided on the third light emitting part 133, so that a full width at half maximum of a light spectrum may be reduced.

Although it is illustrated in FIG. 15 that the absorption layer 180 is provided on the lower side of the protective layer 150, the present disclosure is not limited thereto, and the absorption layer 180 may also be provided between the protective layer 150 and the color filter layer 160. In some embodiments, although it is illustrated that the absorption layer 180 is entirely provided on the first light emitting part 131, the second light emitting part 132, and the third light emitting part 133, the present disclosure is not limited thereto. The absorption layer 180 may be provided to overlap at least one or more (e.g., at least one, or one or more) selected from the first light emitting part 131, the second light emitting part 132, and the third light emitting part 133. For example, the absorption layer 180 may be provided to overlap the first light emitting part 131, and may be provided so as not to overlap the second light emitting part 132 and the third light emitting part 133. In some embodiments, the absorption layer 180 may also be provided to overlap the first light emitting part 131 and the second light emitting part 132, and may also be provided so as not to overlap the third light emitting part 133.

Figure 16:
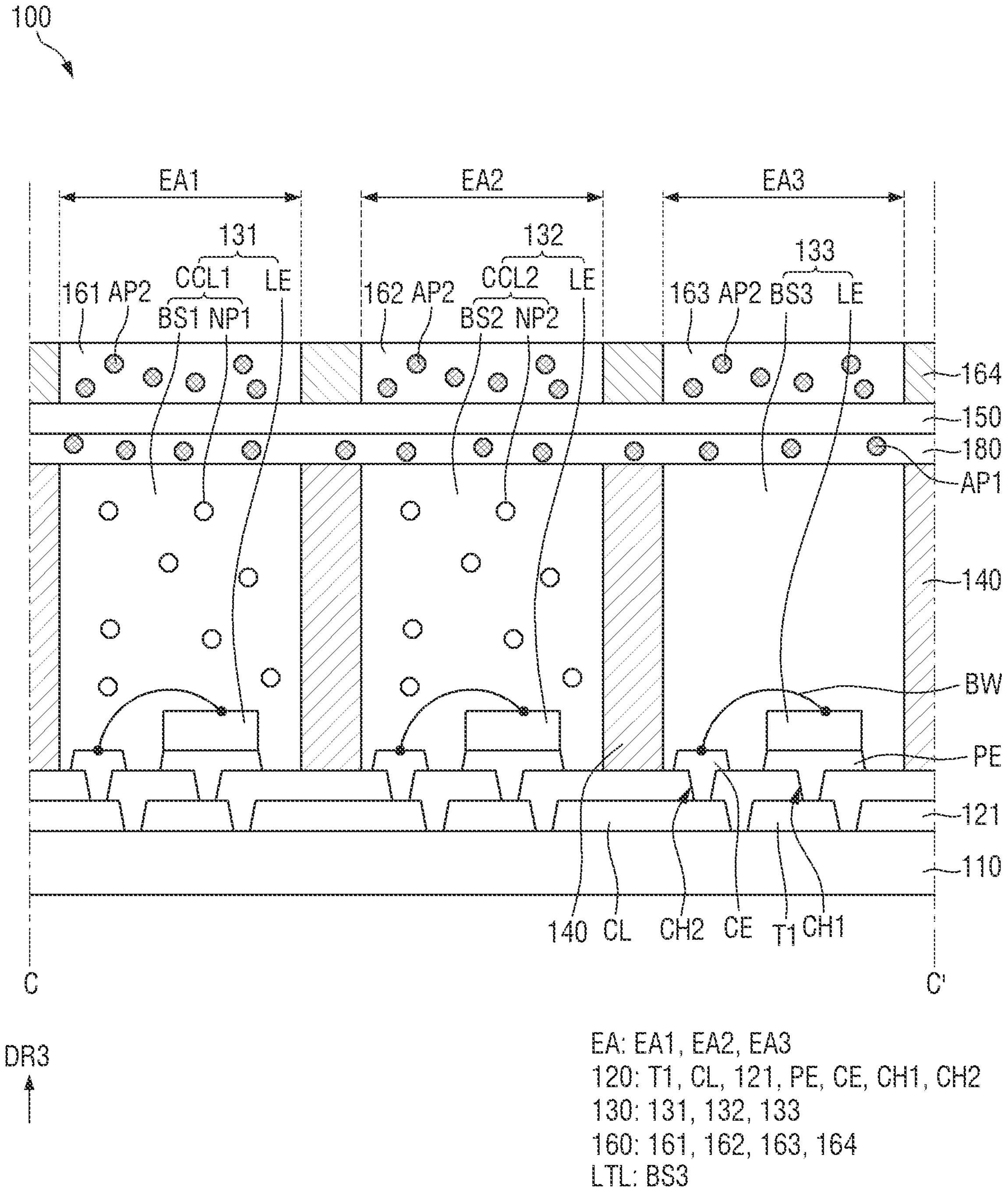
FIG. 16 is a cross-sectional view illustrating a display panel according to one or more embodiments.

FIG. 16 is a cross-sectional view illustrating a display panel according to one or more embodiments.

The embodiment of FIG. 16 is different from the above-described embodiment of FIG. 15 in that the second inorganic particles AP2 are further included in the color filter layer 160. Hereinafter, differences from the above-described embodiment of FIG. 15 will be mainly described.

Referring to FIG. 15, the second inorganic particles AP2 may be included in the color filter layer 160. For example, the second inorganic particles AP2 may be included in the first color filter 161, the second color filter 162, and the third color filter 163, respectively. In addition, the absorption layer 180 may include the first inorganic particles AP1.

Each of the first inorganic particle AP1 and the second inorganic particle AP2 may be formed of an inorganic compound, and may be, for example, $Nd_2(Si, Ti, Ge)_2O_7$. The first inorganic particles AP1 and the second inorganic particles AP2 may have a size in a range of about 10 nm to 10 μm. At least some of the first inorganic particles AP1 and the second inorganic particles AP2 may have the same size, or at least some of the first inorganic particles AP1 and the second inorganic particles AP2 may have different sizes within the above-described range.

The first inorganic particle AP1 and the second inorganic particle AP2 may partially absorb light in a set or specific wavelength band of the incident light. For the light in the first wavelength band emitted from the first light emitting part 131, light in a partial wavelength band among the light in the first wavelength band is absorbed by the first inorganic particles AP1 in the absorption layer 180 provided on the first light emitting part 131, so that a full width at half maximum of a light spectrum may be reduced. For the light in the first wavelength band transmitting through the absorption layer 180, light in a partial wavelength band among the light in the wavelength band is further absorbed by the second inorganic particles AP2 of the first color filter 161, so that a full width of half maximum of a light spectrum may be reduced.

For the light in the second wavelength band emitted from the second light emitting part 132, light in a partial wavelength band among the light in the second wavelength band is absorbed by the first inorganic particles AP1 in the absorption layer 180 provided on the second light emitting part 132, so that a full width at half maximum of a light spectrum may be reduced. For the light in the second wavelength band transmitting through the absorption layer 180, light in a partial wavelength band among the light in the wavelength band is further absorbed by the second inorganic particles AP2 of the second color filter 162, so that a full width of half maximum of a light spectrum may be reduced.

For the light in the third wavelength band emitted from the third light emitting part 133, light in a partial wavelength band among the light in the third wavelength band is absorbed by the first inorganic particles AP1 in the absorption layer 180 provided on the third light emitting part 133, so that a full width at half maximum of a light spectrum may be reduced. For the light in the third wavelength band transmitting through the absorption layer 180, light in a partial wavelength band among the light in the wavelength band is further absorbed by the second inorganic particles AP2 of the third color filter 163, so that a full width of half maximum of a light spectrum may be reduced.

In one or more embodiments, as the inorganic particles AP1 and AP2 are included in the absorption layer 180 and the color filter layer 160, the inorganic particles AP1 and AP2 may absorb the light in the set or specific wavelength band among the light emitted from each of the light emitting parts 131, 132, and 132, so that the full width of half maximum of the light spectrum may be reduced. Accordingly, a color reproduction ratio and color purity of the light emitted from each of the light emitting areas EA1, EA2, and EA3 may be improved.

Figure 17:
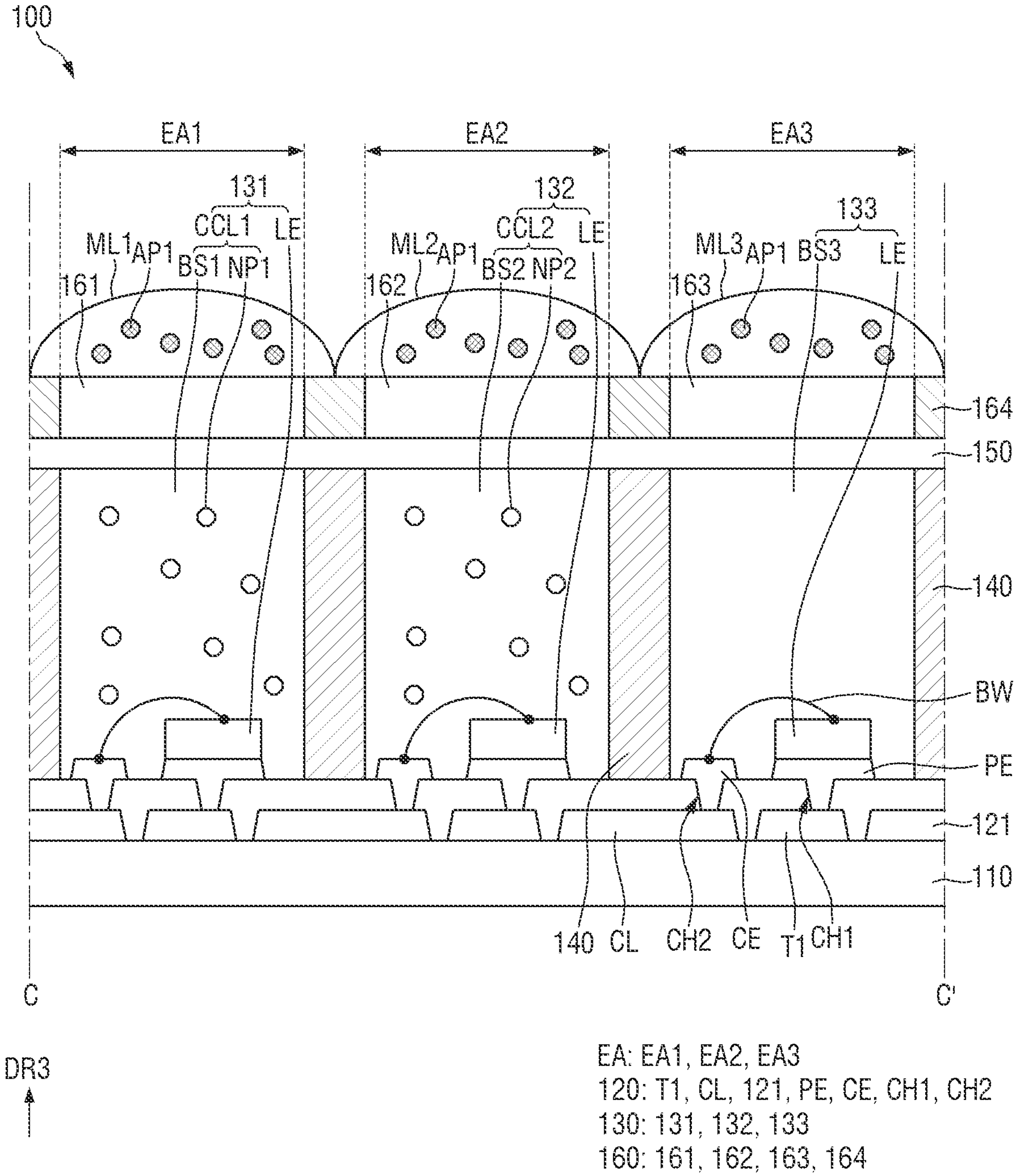
FIG. 17 is a cross-sectional view illustrating a display panel according to one or more embodiments.
Figure 18:
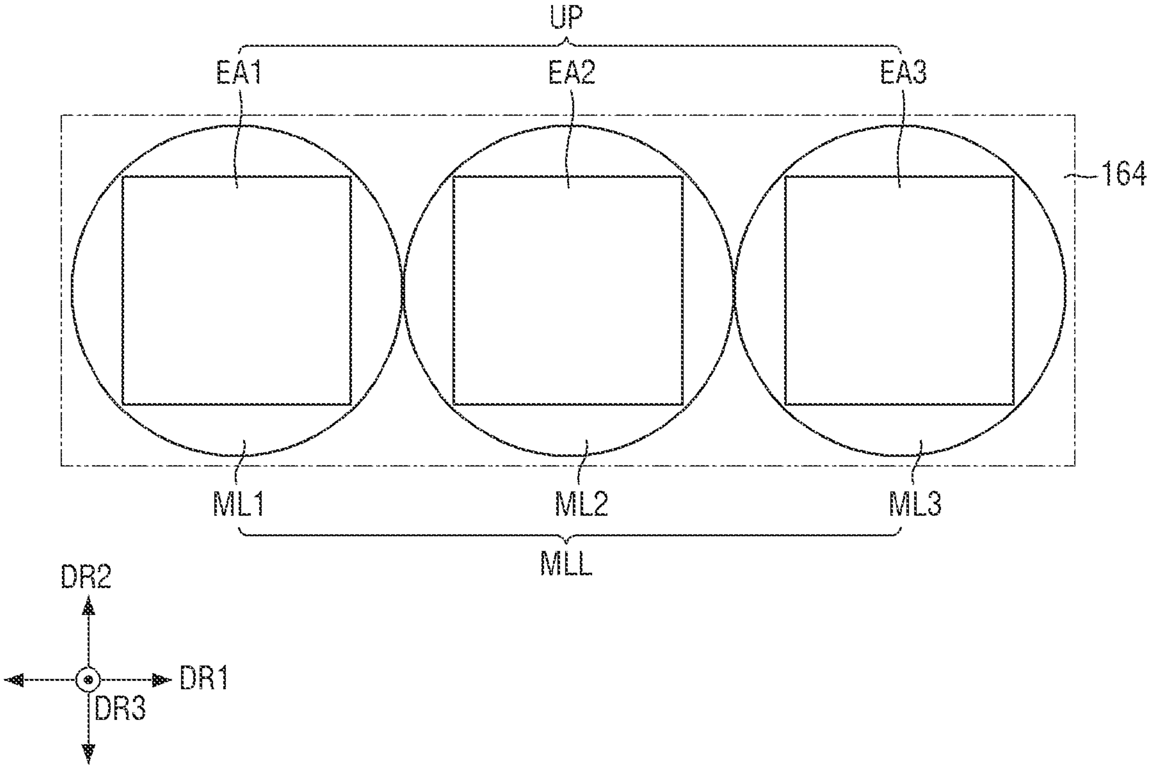
FIG. 18 is a plan view illustrating a unit pixel of the display panel.

FIG. 17 is a cross-sectional view illustrating a display panel according to one or more embodiments. FIG. 18 is a plan view illustrating a unit pixel of the display panel.

Embodiments of FIGS. 17 and 18 are different from the embodiment of FIG. 14 in that a lens layer MLL is provided on the color filter layer 160, and the first inorganic particles AP1 are included in the lens layer MLL. Hereinafter, differences from the above-described embodiment of FIG. 14 will be mainly described.

Referring to FIGS. 17 and 18, a lens layer MLL may be provided on the color filter layer 160. The lens layer MLL may condense the light emitted from each of the light emitting parts 131, 132, and 133. The lens layer MLL may be a micro lens having condensing characteristics. The micro lens may have a generally hemispherical shape to condense light incident from a lower portion thereof.

The lens layer MLL may include a first lens ML1 overlapping and corresponding to the first light emitting part 131 of the first light emitting area EA1, a second lens ML2 overlapping and corresponding to the second light emitting part 132 of the second light emitting area EA2, and a third lens ML3 overlapping and corresponding to the third light emitting part 133 of the third light emitting area EA3.

Each of the first lens ML1, the second lens ML2, and the third lens ML3 may have a hemispherical shape and may be provided adjacent to each other. Each of the first lens ML1, the second lens ML2, and the third lens ML3 may cover the light emitting parts 131, 132, and 133 corresponding thereto, and may have a diameter greater than a width of each of the light emitting parts 131, 132, and 133. Although it is illustrated in the drawing that the diameter of each of the first lens ML1, the second lens ML2, and the third lens ML3 is greater than the width of each of the light emitting parts 131, 132, and 133, the present disclosure is not limited thereto. The diameter of each of the first lens ML1, the second lens ML2, and the third lens ML3 may be equal to or smaller than the width of each of the light emitting parts 131, 132, and 133. In some embodiments, the diameter of each of the first lens ML1, the second lens ML2, and the third lens ML3 may correspond to a size of each of the light emitting parts 131, 132, and 133, respectively. Although it is illustrated in the drawing that the each of the first lens ML1, the second lens ML2, and the third lens ML3 has the same diameter and each of the light emitting parts 131, 132, and 133 has the same width, the present disclosure is not limited thereto. Each (or some) of the first lens ML1, the second lens ML2, and the third lens ML3 may have different diameters, and each (or some) of the light emitting parts 131, 132, and 133 may also have different widths.

The lens layer MLL may include the first inorganic particles AP1. For example, each of the first lens ML1, the second lens ML2, and the third lens ML3 may include the first inorganic particles AP1.

The first inorganic particle AP1 may partially absorb light in a set or specific wavelength band of the incident light. The light in the first wavelength band emitted from the first light emitting part 131 may transmit through the first color filter 161 provided on the first light emitting part 131 to be incident on the first lens ML1. Light in a partial wavelength band among the light in the first wavelength band is absorbed by the first inorganic particles AP1 in the first lens ML1, so that a full width of half maximum of a light spectrum may be reduced.

The light in the second wavelength band emitted from the second light emitting part 132 may transmit through the second color filter 162 provided on the second light emitting part 132 to be incident on the second lens ML2. Light in a partial wavelength band among the light in the second wavelength band is absorbed by the first inorganic particles AP1 in the second lens ML2, so that a full width of half maximum of a light spectrum may be reduced.

The light in the third wavelength band emitted from the third light emitting part 133 may transmit through the third color filter 163 provided on the third light emitting part 133 to be incident on the third lens ML3. Light in a partial wavelength band among the light in the third wavelength band is absorbed by the first inorganic particles AP1 in the third lens ML3, so that a full width of half maximum of a light spectrum may be reduced.

In one or more embodiments, as the lens layer MLL includes the first inorganic particles AP1, the lens layer MLL may not only absorb light in a set or specific wavelength band of the light emitted from each of the light emitting parts 131, 132, and 133 to reduce the full width at half maximum of the light spectrum, but also may improve luminance by condensing the light.

Figure 19:
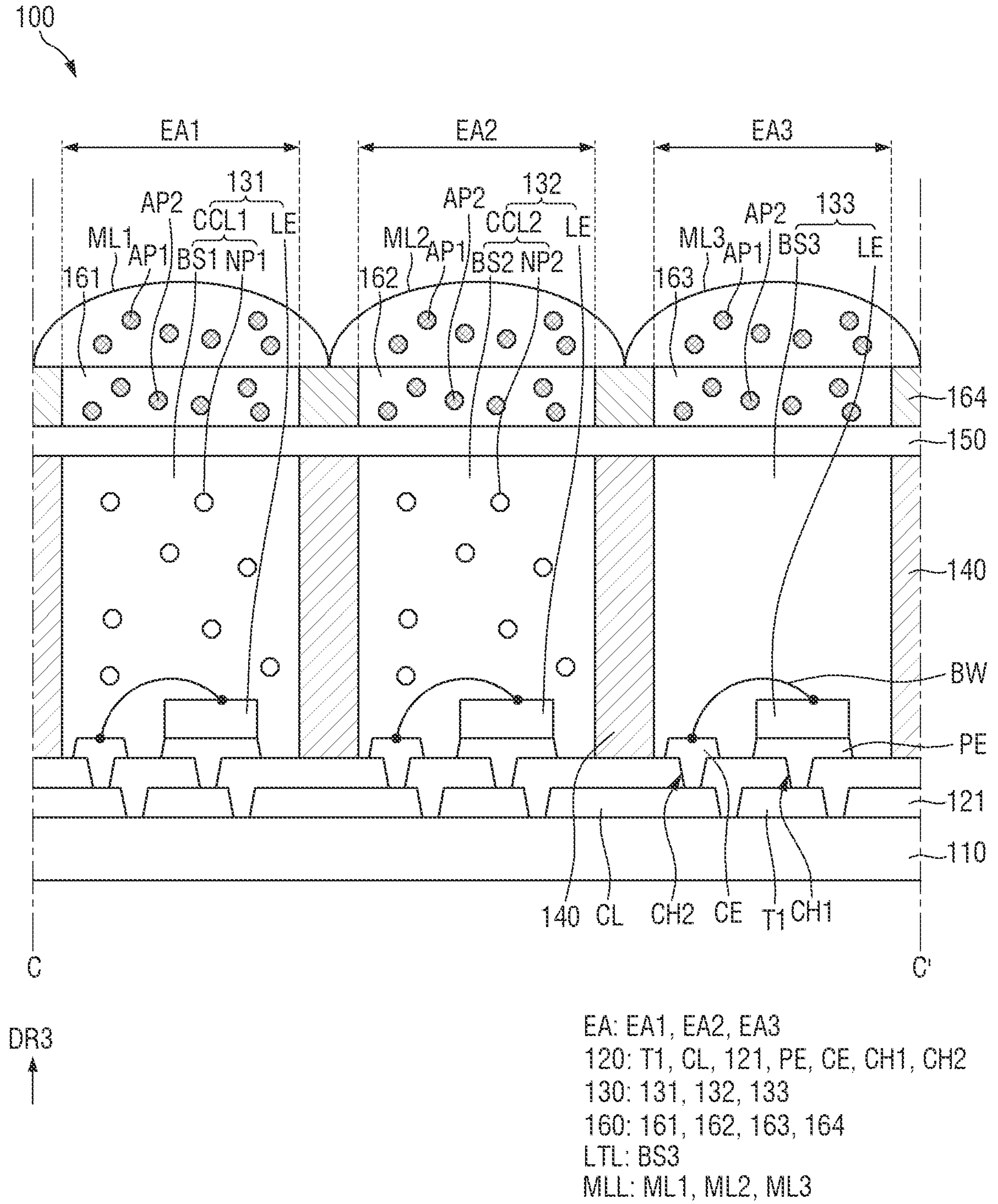
FIG. 19 is a cross-sectional view illustrating a display panel according to one or more embodiments.

FIG. 19 is a cross-sectional view illustrating a display panel according to one or more embodiments.

The embodiment of FIG. 19 is different from the above-described embodiment of FIG. 17 in that the second inorganic particles AP2 are further included in the color filter layer 160. Hereinafter, differences from the above-described embodiment of FIG. 17 will be mainly described.

Referring to FIG. 19, the second inorganic particles AP2 may be included in the color filter layer 160. For example, each of the first color filter 161, the second color filter 162, and the third color filter 163 may include the second inorganic particles AP2.

The second inorganic particle AP2 may be formed of an inorganic compound in the same manner as the above-described first inorganic particle AP1, and may be, for example, $Nd_2(Si, Ti, Ge)_2O_7$. The first inorganic particles AP1 and the second inorganic particles AP2 may have a size in a range of about 10 nm to 10 μm. At least some of the first inorganic particles AP1 and the second inorganic particles AP2 may have the same size, and/or at least some of the first inorganic particles AP1 and the second inorganic particles AP2 may have different sizes within the above-described range.

The first inorganic particle AP1 and the second inorganic particle AP2 may partially absorb light in a set or specific wavelength band of the incident light. For the light in the first wavelength band emitted from the first light emitting part 131, light in a partial wavelength band among the light in the wavelength band is absorbed by the second inorganic particles AP2 in the first color filter 161 provided on the first light emitting part 131, so that a full width at half maximum of a light spectrum may be reduced. For the light in the first wavelength band transmitting through the first color filter 161, light in a partial wavelength band among the light in the wavelength band is further absorbed by the first inorganic particles AP1 of the first lens ML1, so that a full width of half maximum of a light spectrum may be reduced.

For the light in the second wavelength band emitted from the second light emitting part 132, light in a partial wavelength band among the light in the wavelength band is absorbed by the second inorganic particles AP2 in the second color filter 162 provided on the second light emitting part 132, so that a full width at half maximum of a light spectrum may be reduced. For the light in the second wavelength band transmitting through the second color filter 162, light in a partial wavelength band among the light in the wavelength band is further absorbed by the first inorganic particles AP1 of the second lens ML2, so that a full width of half maximum of a light spectrum may be reduced.

For the light in the third wavelength band emitted from the third light emitting part 133, light in a partial wavelength band among the light in the wavelength band is absorbed by the second inorganic particles AP2 in the third color filter 163 provided on the third light emitting part 133, so that a full width at half maximum of a light spectrum may be reduced. For the light in the third wavelength band transmitting through the third color filter 163, light in a partial wavelength band among the light in the wavelength band is further absorbed by the first inorganic particles AP1 of the third lens ML3, so that a full width of half maximum of a light spectrum may be reduced.

In one or more embodiments, as the inorganic particles AP1 and AP2 are included in the lens layer MLL and the color filter layer 160, the inorganic particles AP1 and AP2 absorb the light in the set or specific wavelength band among the light emitted from each of the light emitting parts 131, 132, and 132, so that the full width of half maximum of the light spectrum may be reduced. Accordingly, a color reproduction ratio and color purity of the light emitted from each of the light emitting areas EA1, EA2, and EA3 may be improved.

Figure 20:
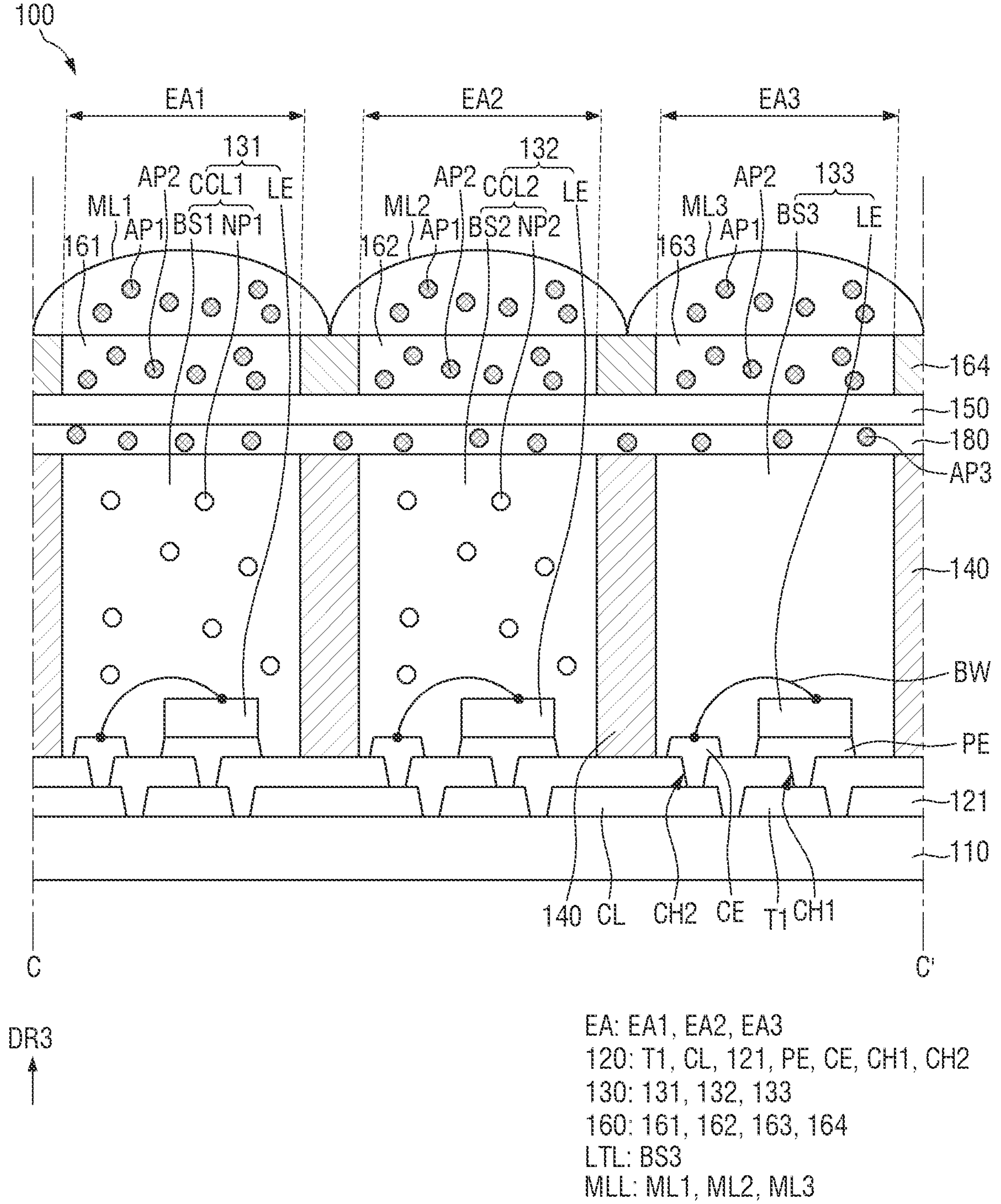
FIG. 20 is a cross-sectional view illustrating a display panel according to one or more embodiments.

FIG. 20 is a cross-sectional view illustrating a display panel according to one or more embodiments.

The embodiment of FIG. 20 is different from the above-described embodiment of FIG. 19 in that the display panel 100 further includes an absorption layer 180 including third inorganic particles AP3. Hereinafter, differences from the above-described embodiment of FIG. 19 will be mainly described.

Referring to FIG. 20, the absorption layer 180 may include the third inorganic particles AP3. The absorption layer 180 may be provided on a lower side of the protective layer 150 and the color filter layer 160. The absorption layer 180 may include the third inorganic particles AP3. The third inorganic particle AP3 may partially absorb light in a set or specific wavelength band of the incident light. For the light in the first wavelength band emitted from the first light emitting part 131, light in a partial wavelength band among the light in the first wavelength band is absorbed by the third inorganic particles AP3 in the absorption layer 180 provided on the first light emitting part 131, so that a full width at half maximum of a light spectrum may be reduced.

For the light in the second wavelength band emitted from the second light emitting part 132, light in a partial wavelength band among the light in the second wavelength band is absorbed by the third inorganic particles AP3 in the absorption layer 180 provided on the second light emitting part 132, so that a full width at half maximum of a light spectrum may be reduced.

For the light in the third wavelength band emitted from the third light emitting part 133, light in a partial wavelength band among the light in the third wavelength band is absorbed by the third inorganic particles AP3 in the absorption layer 180 provided on the third light emitting part 133, so that a full width at half maximum of a light spectrum may be reduced.

In one or more embodiments, as the inorganic particles AP1, AP2, and AP3 are included in the absorption layer 180 together with the lens layer MLL and the color filter layer 160, the inorganic particles AP1, AP2, and AP3 may absorb the light in the set or specific wavelength band among the light emitted from each of the light emitting parts 131, 132, and 132, so that the full width of half maximum of the light spectrum may be reduced. Accordingly, a color reproduction ratio and color purity of the light emitted from each of the light emitting areas EA1, EA2, and EA3 may be improved.

Figure 21:
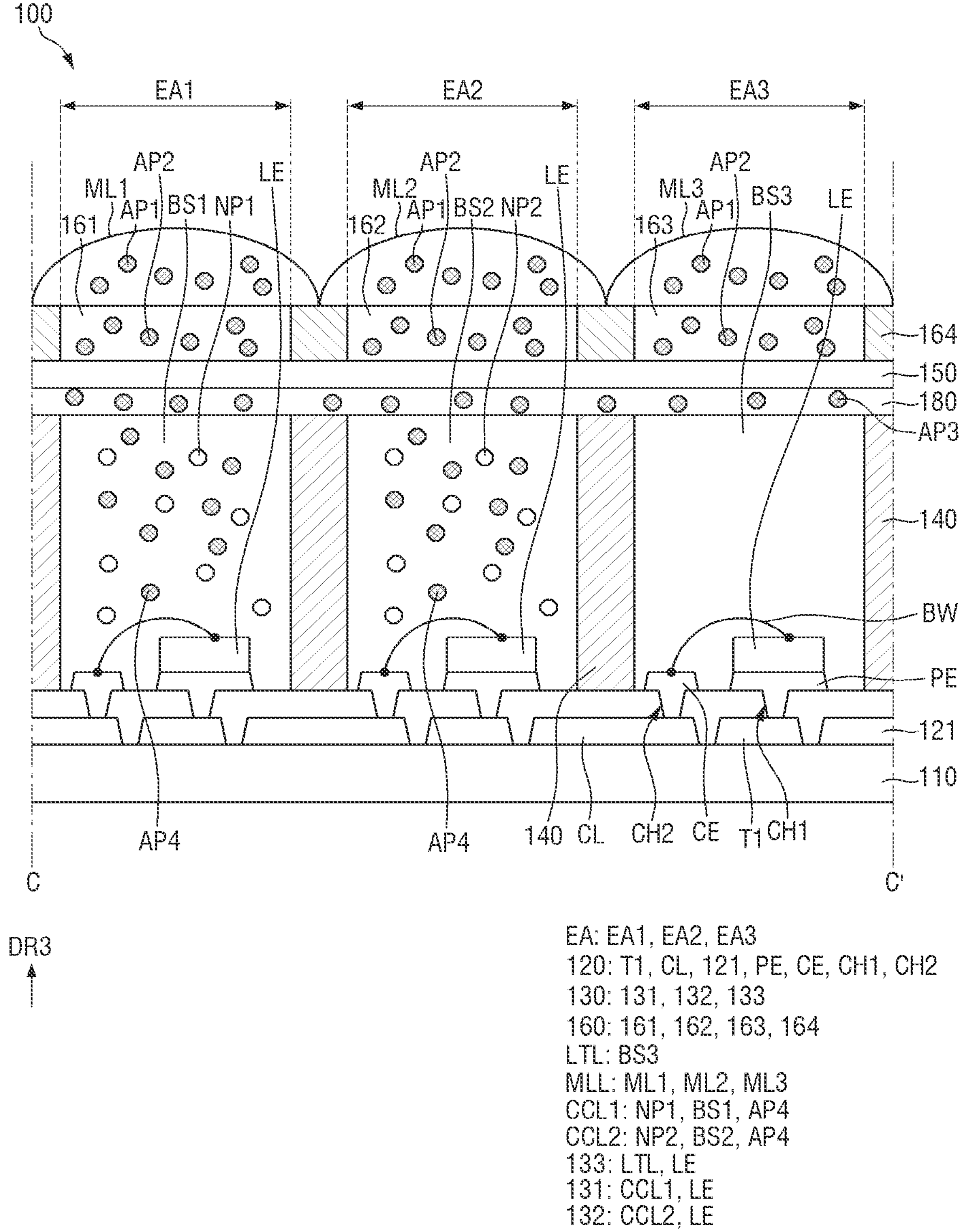
FIG. 21 is a cross-sectional view illustrating a display panel according to one or more embodiments.

FIG. 21 is a cross-sectional view illustrating a display panel according to one or more embodiments.

The embodiment of FIG. 21 is different from the above-described embodiment of FIG. 20 in that each of the first light emitting part 131 and the second light emitting part 132 includes fourth inorganic particles AP4. Hereinafter, differences from the above-described embodiment of FIG. 20 will be mainly described.

Referring to FIG. 21, each of the first light emitting part 131 and the second light emitting part 132 may include fourth inorganic particles AP4.

The fourth inorganic particle AP4 may absorb light in a set or specific wavelength band to reduce a full width at half maximum of the set or specific wavelength band. The fourth inorganic particles AP4 may be included in the first base resin BS1 of the first color conversion layer CCL1 and the second base resin BS2 of the second color conversion layer CCL2, respectively, and may be randomly dispersed. The fourth inorganic particle AP4 may be formed of an inorganic compound, and may be, for example, $Nd_2(Si, Ti, Ge)_2O_7$. The fourth inorganic particles AP4 may have a size in a range of about 10 nm to 10 μm.

The fourth inorganic particles AP4 may be included in the first color conversion layer CCL1 and the second color conversion layer CCL2 to absorb light in a wavelength band around a peak wavelength, thereby reducing a full width at half maximum of a light spectrum.

For the light in the first wavelength band converted by the first wavelength conversion particles NP1 in the first light emitting part 131, light in a partial wavelength band among the light in the first wavelength band is absorbed by the fourth inorganic particles AP4, so that a full width at half maximum of a light spectrum may be reduced. For the light in the second wavelength band converted by the second wavelength conversion particles NP2 in the second light emitting part 132, light in a partial wavelength band among the light in the second wavelength band is absorbed by the fourth inorganic particles AP4, so that a full width at half maximum of a light spectrum may be reduced In one or more embodiments, as the inorganic particles AP1, AP2, AP3, and AP4 are included in the first and second light emitting parts 131 and 132 together with the lens layer MLL, the color filter layer 160, and the absorption layer 180, the inorganic particles AP1, AP2, AP3, and AP4 may absorb the light in the set or specific wavelength band among the light emitted from each of the light emitting parts 131, 132, and 132, so that the full width of half maximum of the light spectrum may be reduced. Accordingly, a color reproduction ratio and color purity of the light emitted from each of the light emitting areas EA1, EA2, and EA3 may be improved.

Figure 22:
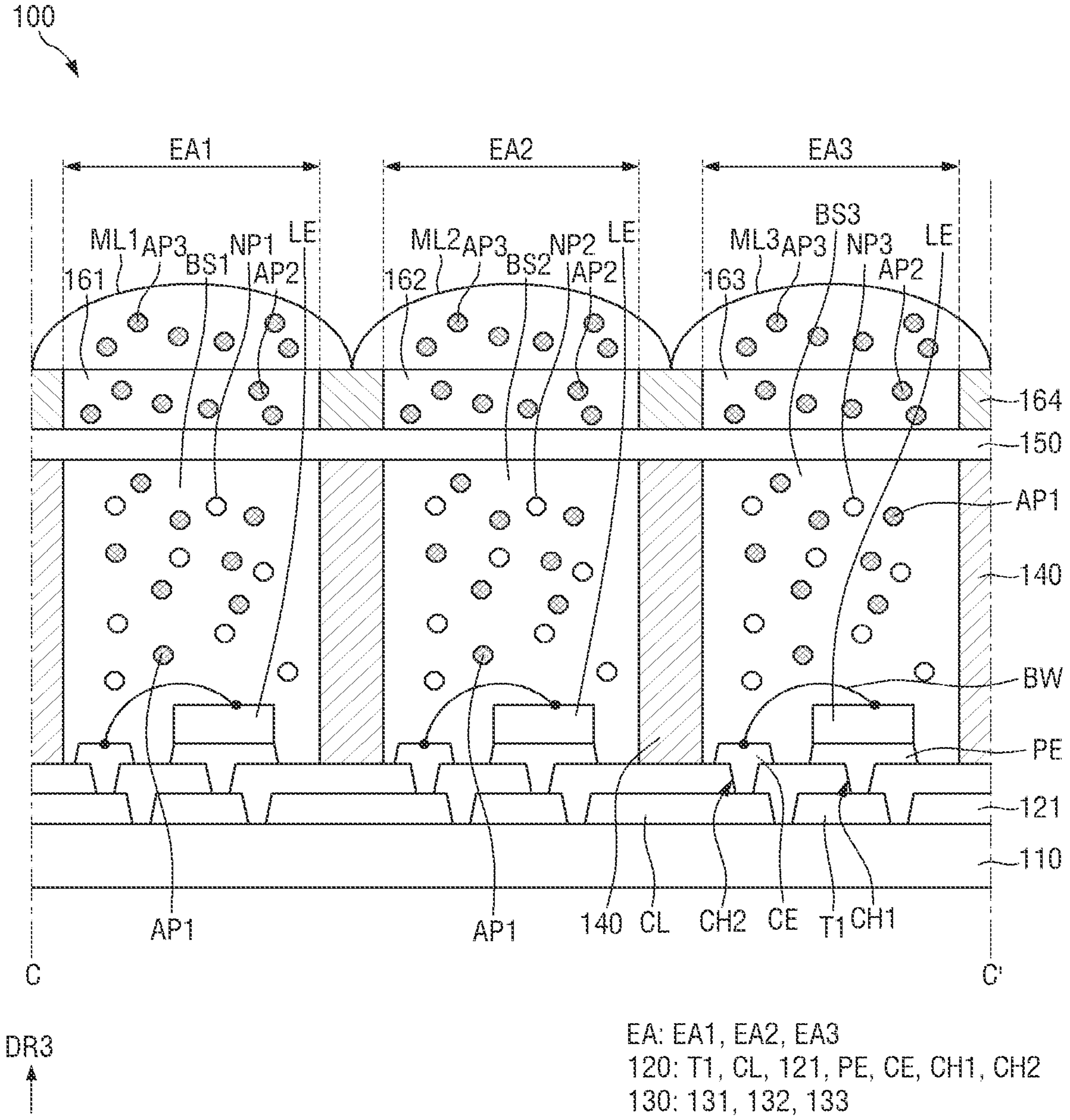
FIG. 22 is a cross-sectional view illustrating a display panel according to one or more embodiments.

FIG. 22 is a cross-sectional view illustrating a display panel according to one or more embodiments.

The embodiment of FIG. 22 is different from the above-described embodiment of FIG. 13 in that the display panel 100 further includes the color filter layer 160 including the second inorganic particles AP2 and the lens layer MLL including the third inorganic particles AP3. Hereinafter, differences from the above-described embodiment of FIG. 13 will be mainly described.

Each of the first color conversion layer CCL1 of the first light emitting part 131, the second color conversion layer CCL2 of the second light emitting part 132, and the light transmitting layer LTL of the third light emitting part 133 may include the first inorganic particles AP1.

The color filter layer 160 may include the second inorganic particles AP2, and the second inorganic particles AP2 may be included in the first color filter 161, the second color filter 162, and the third color filter 163, respectively.

The lens layer MLL may include the third inorganic particles AP3, and the third inorganic particles AP3 may be included in the first lens ML1, the second lens ML2, and the third lens ML3, respectively.

Each of the first light emitting part 131, the second light emitting part 132, and the third light emitting part 133 may include a light emitting element LE that emits light in an ultraviolet wavelength band. In the first light emitting part 131, the light in the ultraviolet wavelength band emitted from the light emitting element LE is converted into the light in the first wavelength band by the first wavelength conversion particles NP1, and a portion of light in a set or specific wavelength band is absorbed by the first inorganic particles AP1, so that a full width of half maximum of a light spectrum may be reduced. In some embodiments, in the light emitted from the first light emitting part 131, the full width of half maximum of the light spectrum may be reduced by the second inorganic particles AP2 of the first color filter 161 and the third inorganic particles AP3 of the first lens ML1.

In the second light emitting part 132, the light in the ultraviolet wavelength band emitted from the light emitting element LE is converted into the light in the second wavelength band by the second wavelength conversion particles NP2, and a portion of light in a set or specific wavelength band is absorbed by the first inorganic particles AP1, so that a full width of half maximum of a light spectrum may be reduced. In some embodiments, in the light emitted from the second light emitting part 132, the full width of half maximum of the light spectrum may be reduced by the second inorganic particles AP2 of the second color filter 162 and the third inorganic particles AP3 of the second lens ML2.

In the third light emitting part 133, the light in the ultraviolet wavelength band emitted from the light emitting element LE is converted into the light in the third wavelength band by the third wavelength conversion particles NP3, and a portion of light in a set or specific wavelength band is absorbed by the first inorganic particles AP1, so that a full width of half maximum of a light spectrum may be reduced. In some embodiments, in the light emitted from the third light emitting part 133, the full width of half maximum of the light spectrum may be reduced by the second inorganic particles AP2 of the third color filter 163 and the third inorganic particles AP3 of the third lens ML3.

Hereinafter, Experimental Examples for the above-described embodiments will be described.

Experimental Example 1

A display panel having light emitting areas emitting (e.g., configured to emit) red light, green light, and blue light was manufactured. A white light spectrum and a color reproduction ratio were measured by adding different amounts of inorganic particles $Nd_2(Si, Ti, Ge)_2O_7$ to the light emitting part of the light emitting area emitting the green light among the light emitting areas at 0 wt %, 1 wt %, 3 wt %, 5 wt %, and 10 wt %, respectively. The results are illustrated in FIGS. 23 to 30 and Tables 1 and 2, respectively.

Figure 23:
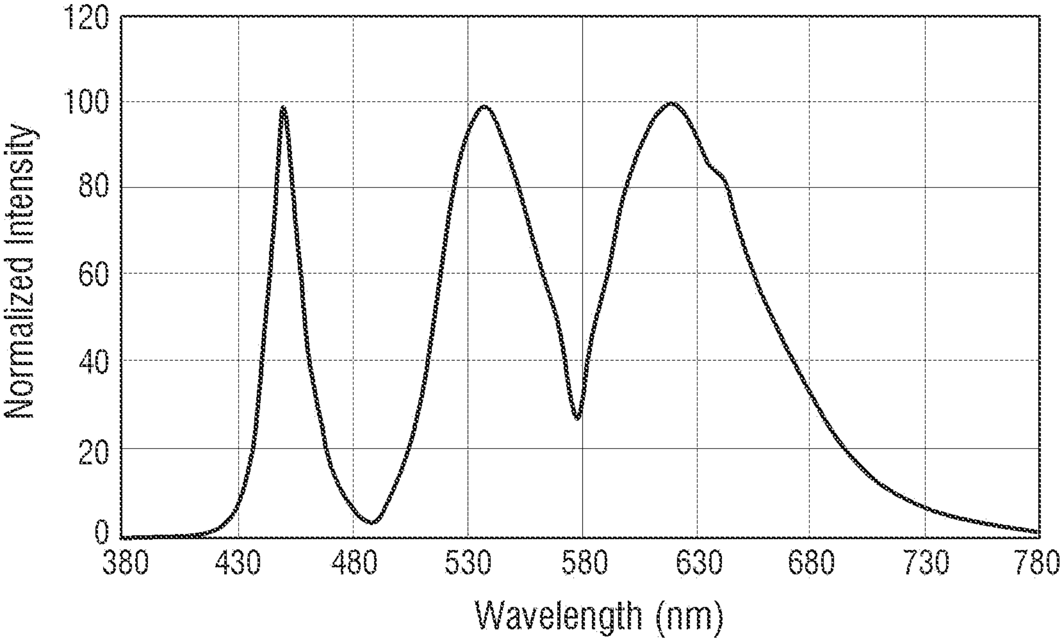
FIG. 23 is a graph illustrating a light spectrum of a display panel having content of inorganic particles of 0 wt % according to Experimental Example 1.
Figure 24:
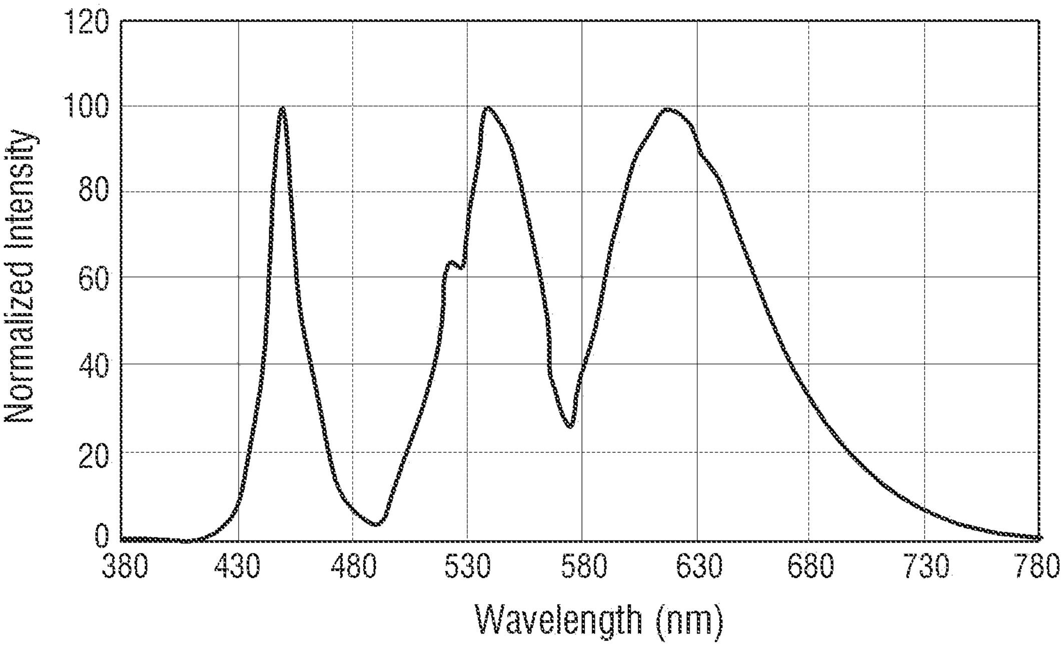
FIG. 24 is a graph illustrating a light spectrum of a display panel having content of inorganic particles of 1 wt % according to Experimental Example 1.
Figure 25:
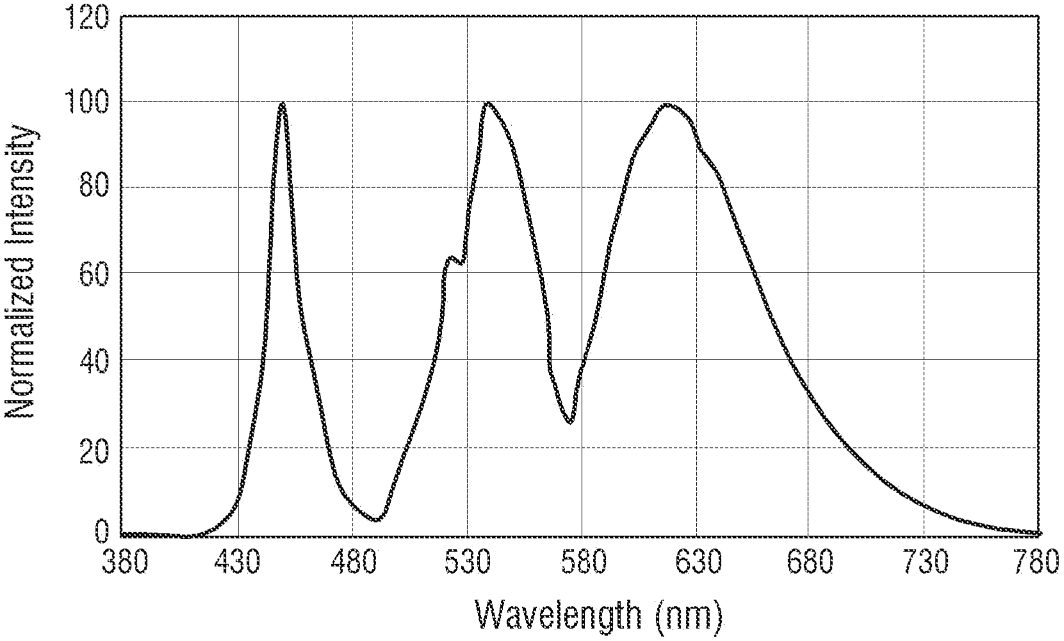
FIG. 25 is a graph illustrating a light spectrum of a display panel having content of inorganic particles of 3 wt % according to Experimental Example 1.
Figure 26:
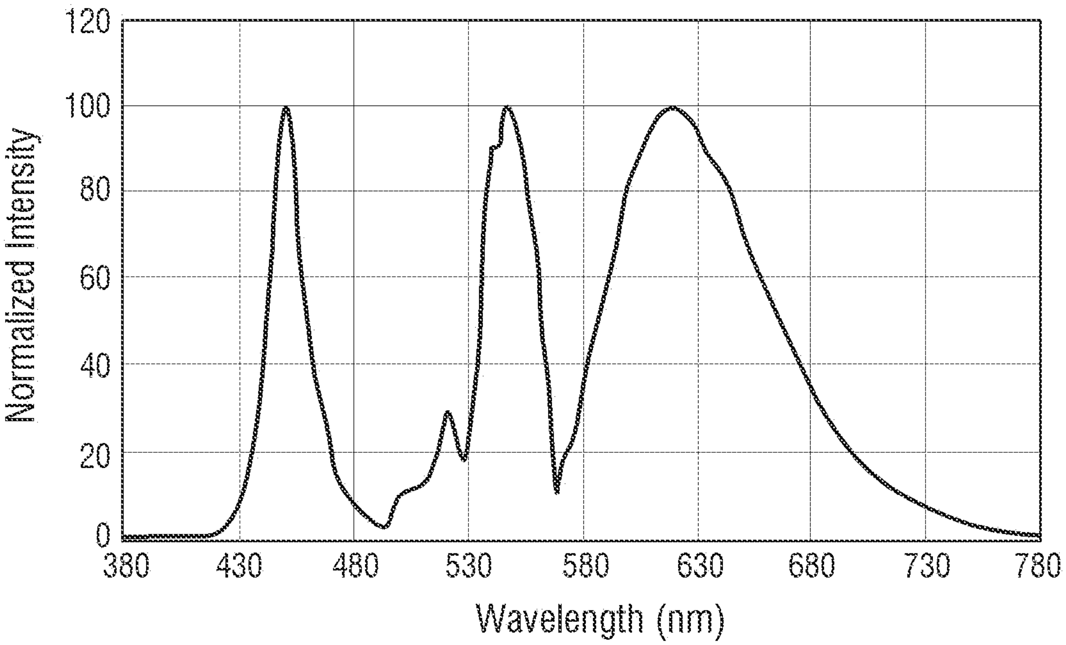
FIG. 26 is a graph illustrating a light spectrum of a display panel having content of inorganic particles of 5 wt % according to Experimental Example 1.
Figure 27:
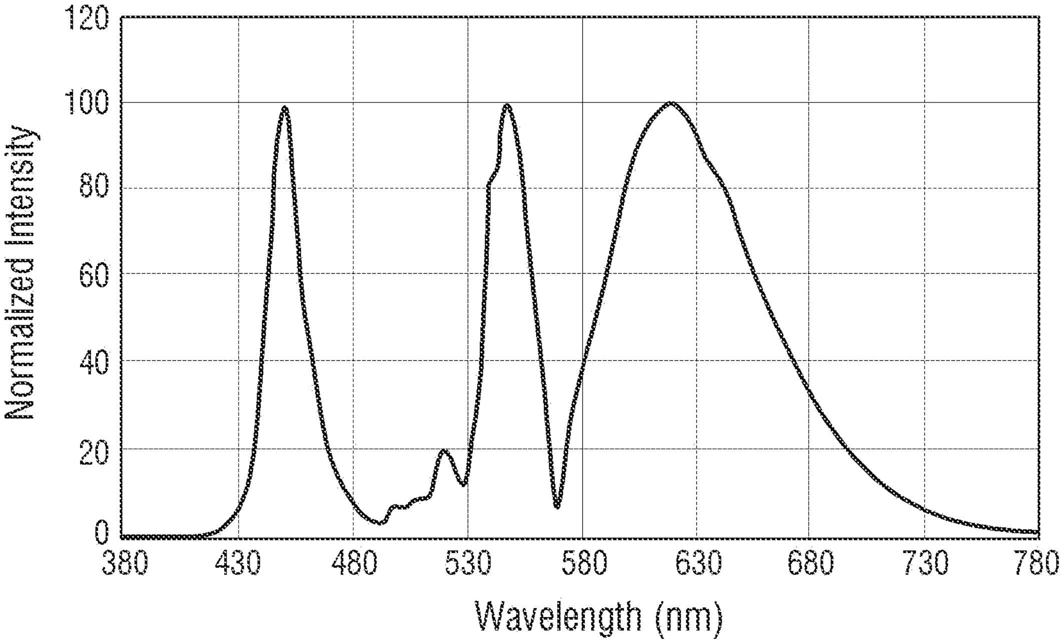
FIG. 27 is a graph illustrating a light spectrum of a display panel having content of inorganic particles of 10 wt % according to Experimental Example 1.
Figure 28:
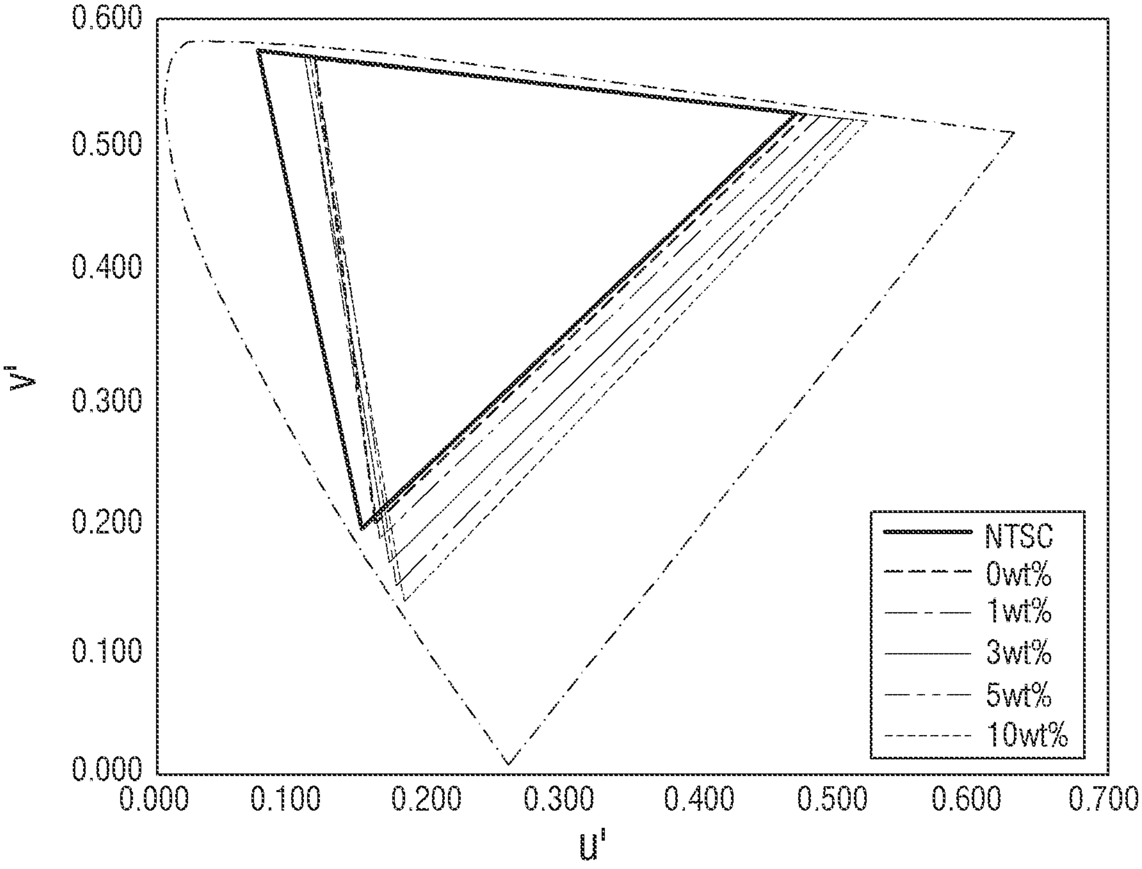
FIG. 28 is a view illustrating a color reproduction ratio of a display panel for each of contents of inorganic particles in an NTSC color coordinate system according to Experimental Example 1.
Figure 29:
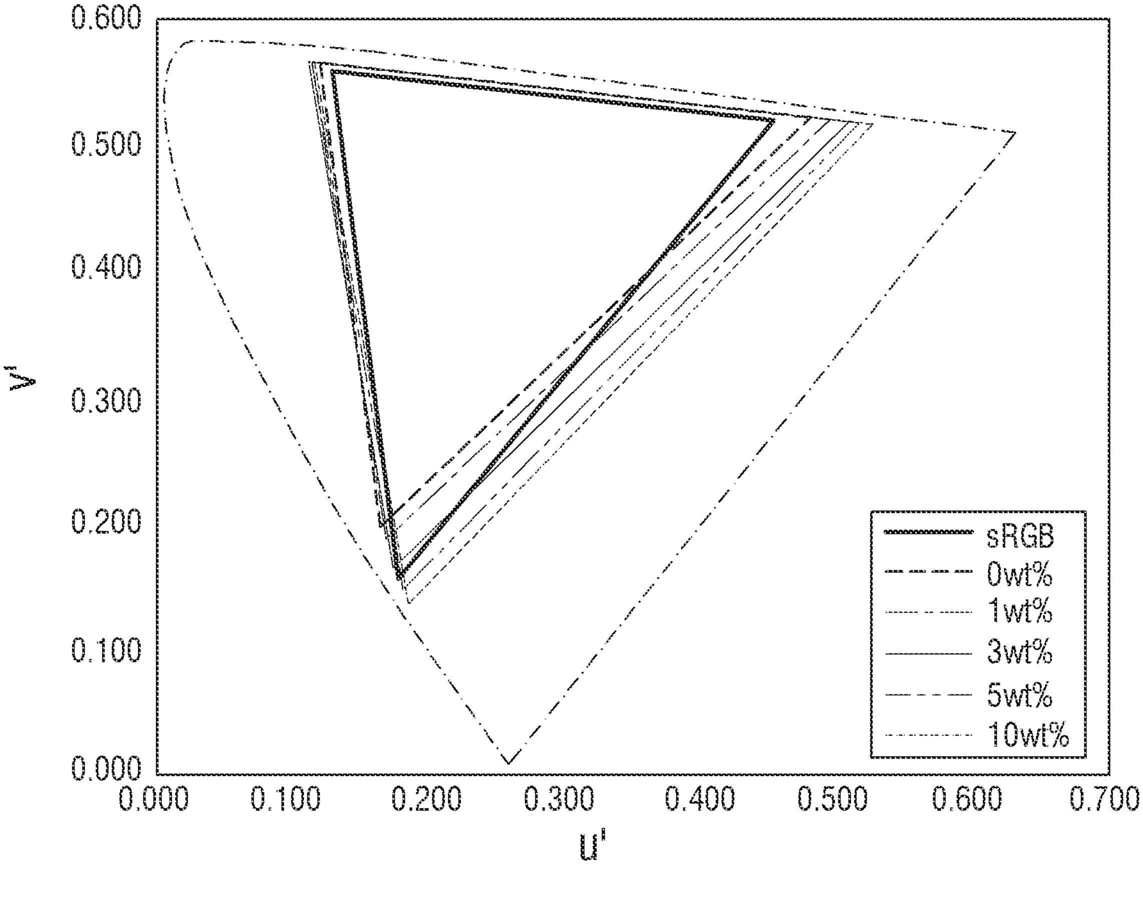
FIG. 29 is a view illustrating a color reproduction ratio of a display panel for each of contents of inorganic particles in an sRGB color coordinate system according to Experimental Example 1.
Figure 30:
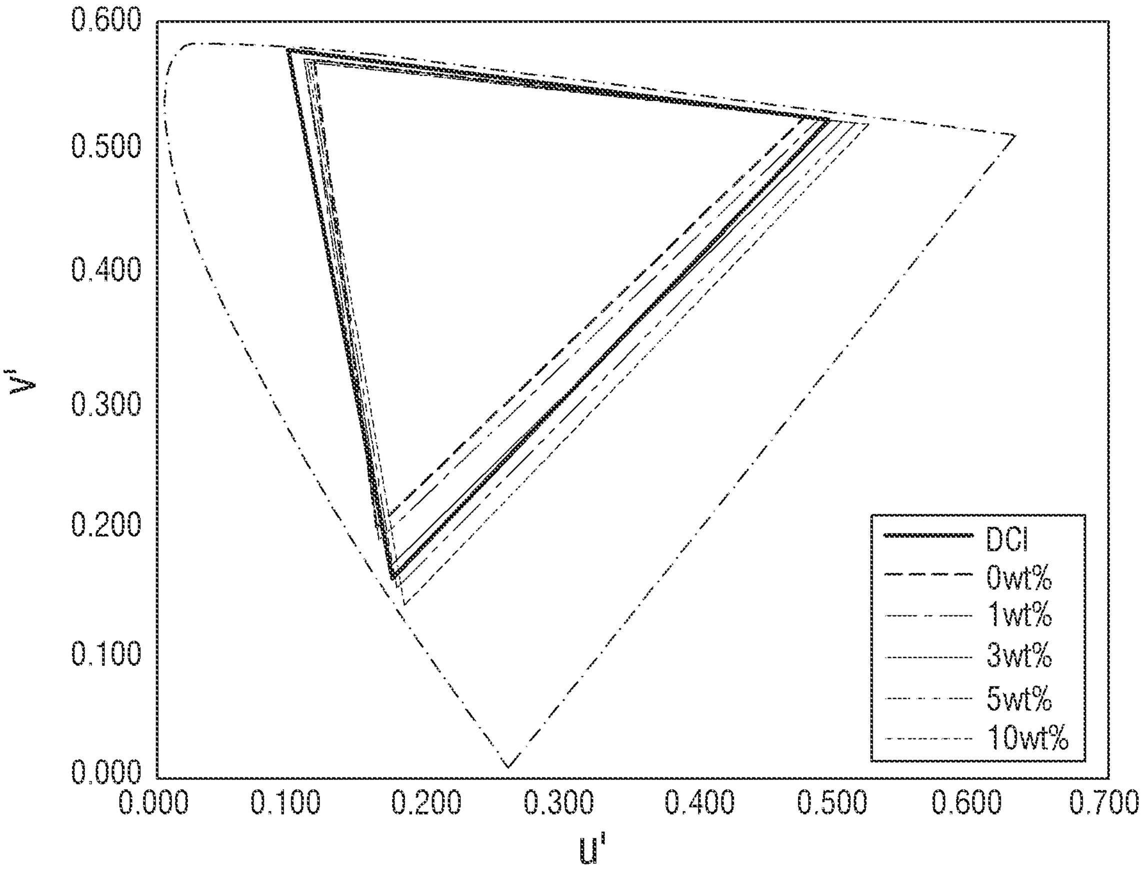
FIG. 30 is a view illustrating a color reproduction ratio of a display panel for each of contents of inorganic particles in a DCI color coordinate system according to Experimental Example 1.

FIG. 23 is a graph illustrating a light spectrum of a display panel having content of inorganic particles of 0 wt % according to Experimental Example 1. FIG. 24 is a graph illustrating a light spectrum of a display panel having content of inorganic particles of 1 wt % according to Experimental Example 1. FIG. 25 is a graph illustrating a light spectrum of a display panel having content of inorganic particles of 3 wt % according to Experimental Example 1. FIG. 26 is a graph illustrating a light spectrum of a display panel having content of inorganic particles of 5 wt % according to Experimental Example 1. FIG. 27 is a graph illustrating a light spectrum of a display panel having content of inorganic particles of 10 wt % according to Experimental Example 1. FIG. 28 is a view illustrating a color reproduction ratio of a display panel for each of contents of inorganic particles in an NTSC color coordinate system according to Experimental Example 1. FIG. 29 is a view illustrating a color reproduction ratio of a display panel for each of contents of inorganic particles in an sRGB color coordinate system according to Experimental Example 1. FIG. 30 is a view illustrating a color reproduction ratio of a display panel for each of contents of inorganic particles in a DCI color coordinate system according to Experimental Example 1. Table 1 illustrates color coordinate values of the DCI color coordinate system of the display panel for each of contents of inorganic particles according to Experimental Example 1. Table 2 illustrates a color reproduction ratio of a display panel for each of contents of inorganic particles according to Experimental Example 1 as a relative area ratio and an overlap ratio compared to a reference color gamut.

Before describing the effect of improving a color reproduction ratio of experimental results to be described in more detail herein below, a color gamut and a color reproduction ratio (CRR) are defined. The color gamut refers to the representation of physical characteristics related to color expression of a device that acquires, processes, and outputs an image as a figure (mainly a triangle) illustrated on the color coordinate system, and examples of the representative color gamut include NTSC, BT.709, sRGB, Adobe RGB, DCI, and BT2020. In the present disclosure, the color gamut represents NTSC, sRGB, and DCI color coordinate systems.

In some embodiments, a value expressed as a relative area ratio (%) to the reference color gamut rather than expressing the color gamut as an absolute area is called a color reproduction ratio, and in the present disclosure, the color reproduction ratio was calculated based on NTSC, sRGB and DCI color gamut, and the relative area ratio (%) and overlap ratio (%) compared to the reference color gamut are represented.

First, referring to FIGS. 23 to 27, it may be seen that the full width of half maximum of the wavelength band of the green light is reduced as the content of the inorganic particles is increased to 1 wt %, 3 wt %, 5 wt %, and 10 wt % as compared with FIG. 23 in which the content of the inorganic particles is 0 wt %.

Referring to Tables 1 and 2 below together with FIGS. 28 to 30, it may be seen that an NTSC area ratio, an sRGB overlap ratio, an sRGB area ratio and a DCI overlap ratio are increased as the content of inorganic particles is increased to 1 wt %, 3 wt %, 5 wt % and 10 wt % as compared with FIG. 23 in which the content of the inorganic particles is 0 wt %.

TABLE 1

| | Organic Particle Content (wt %) | | | | | | | | | |
|---|---|---|---|---|---|---|---|---|---|---|
| | 0 | | 1 | | 3 | | 5 | | 10 | |
| CIE | 'u | 'v | 'u | 'v | 'u | 'v | 'u | 'v | 'u | 'v |
| sR | 0.480 | 0.526 | 0.491 | 0.525 | 0.506 | 0.522 | 0.515 | 0.521 | 0.523 | 0.519 |
| sG | 0.117 | 0.572 | 0.113 | 0.572 | 0.110 | 0.572 | 0.112 | 0.570 | 0.113 | 0.569 |
| sB | 0.163 | 0.200 | 0.166 | 0.189 | 0.173 | 0.168 | 0.178 | 0.150 | 0.182 | 0.138 |

TABLE 2

| | Organic Particle Content (wt %) | | | | |
|---|---|---|---|---|---|
| | 0 | 1 | 3 | 5 | 10 |
| NTSC Area Ratio (%) | 89.3 | 91.0 | 93.8 | 95.4 | 96.2 |
| sRGB Overlap Ratio (%) | 91.8 | 94.6 | 98.3 | 95.6 | 92.8 |
| sRGB Area Ratio (%) | 102.4 | 104.4 | 107.6 | 109.4 | 110.3 |
| DCI Overlap Area (%) | 81.3 | 83.0 | 85.7 | 86.5 | 84.9 |

As a result, it may be seen that as the inorganic particles are included in the light emitting parts of the light emitting areas emitting the green light, the full width at half maximum of the green light spectrum may be reduced to improve the color reproduction ratio.

Experimental Example 2

A display panel having light emitting areas emitting red light, green light, and blue light was manufactured. A white light spectrum and a color reproduction ratio were measured by adding different amounts of inorganic particles $Nd_2(Si, Ti, Ge)_2O_7$ to the light emitting part of the light emitting area emitting the red light among the light emitting areas at 0 wt %, 1 wt %, 3 wt %, 5 wt %, and 10 wt %, respectively. The results are illustrated in FIGS. 31 to 38 and Tables 3 and 4, respectively.

Figure 31:
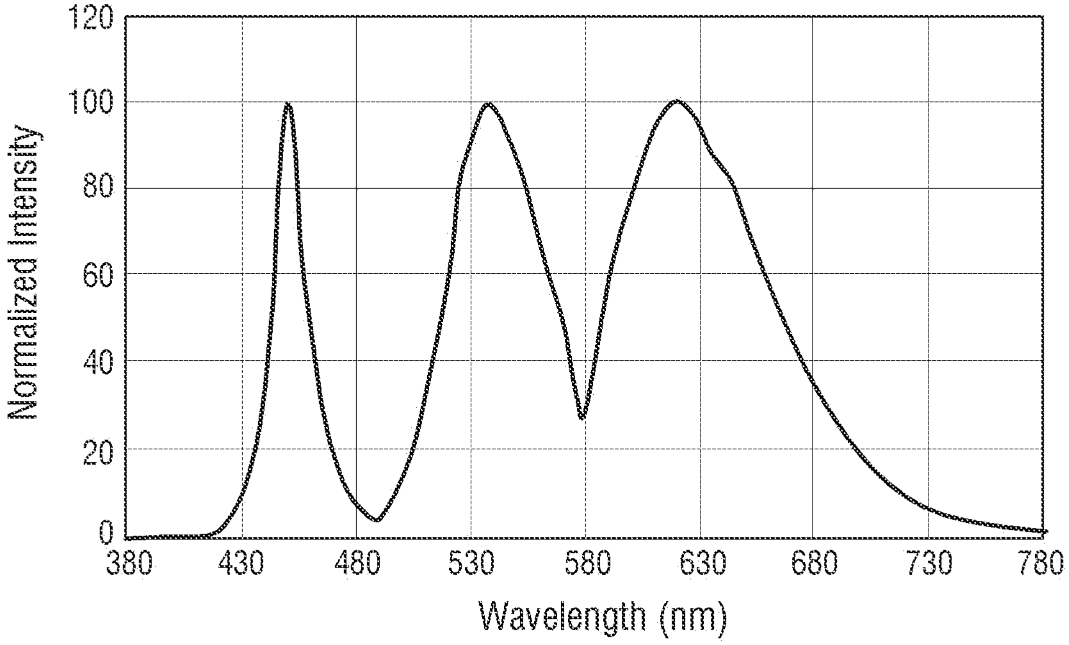
FIG. 31 is a graph illustrating a light spectrum of a display panel having content of inorganic particles of 0 wt % according to Experimental Example 2.
Figure 32:
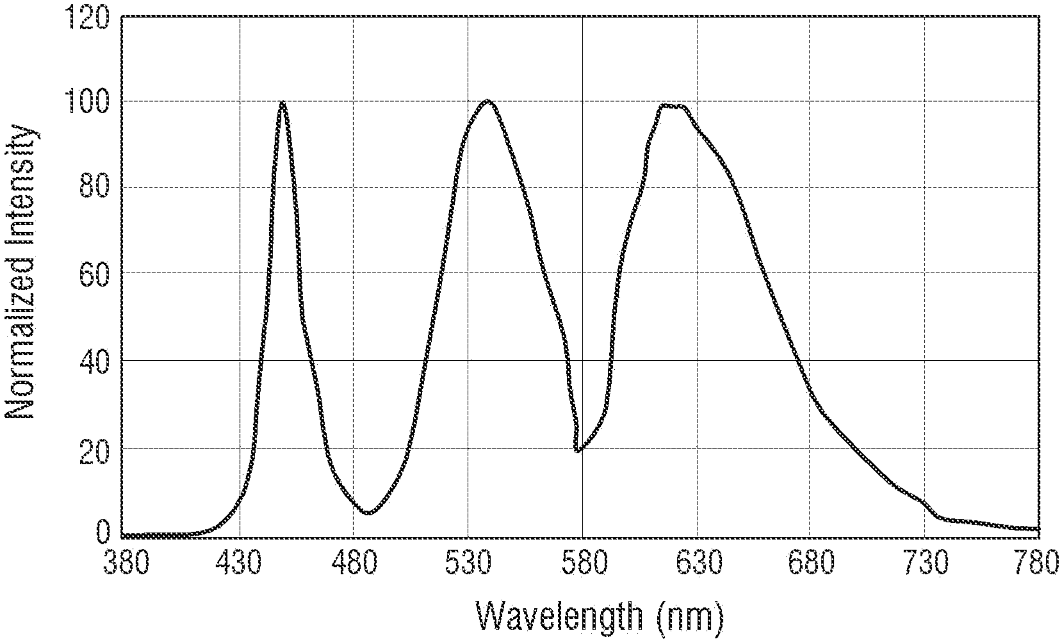
FIG. 32 is a graph illustrating a light spectrum of a display panel having content of inorganic particles of 1 wt % according to Experimental Example 2.
Figure 33:
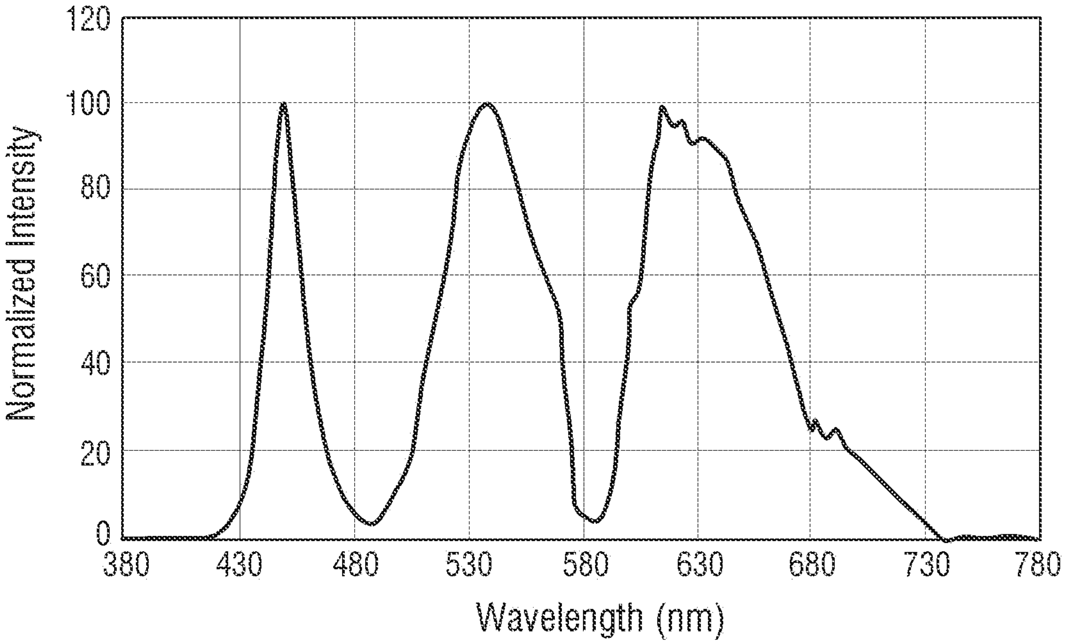
FIG. 33 is a graph illustrating a light spectrum of a display panel having content of inorganic particles of 3 wt % according to Experimental Example 2.

FIG. 31 is a graph illustrating a light spectrum of a display panel having content of inorganic particles of 0 wt % according to Experimental Example 2. FIG. 32 is a graph illustrating a light spectrum of a display panel having content of inorganic particles of 1 wt % according to Experimental Example 2. FIG. 33 is a graph illustrating a light spectrum of a display panel having content of inorganic particles of 3 wt % according to Experimental Example 2.

Figure 34:
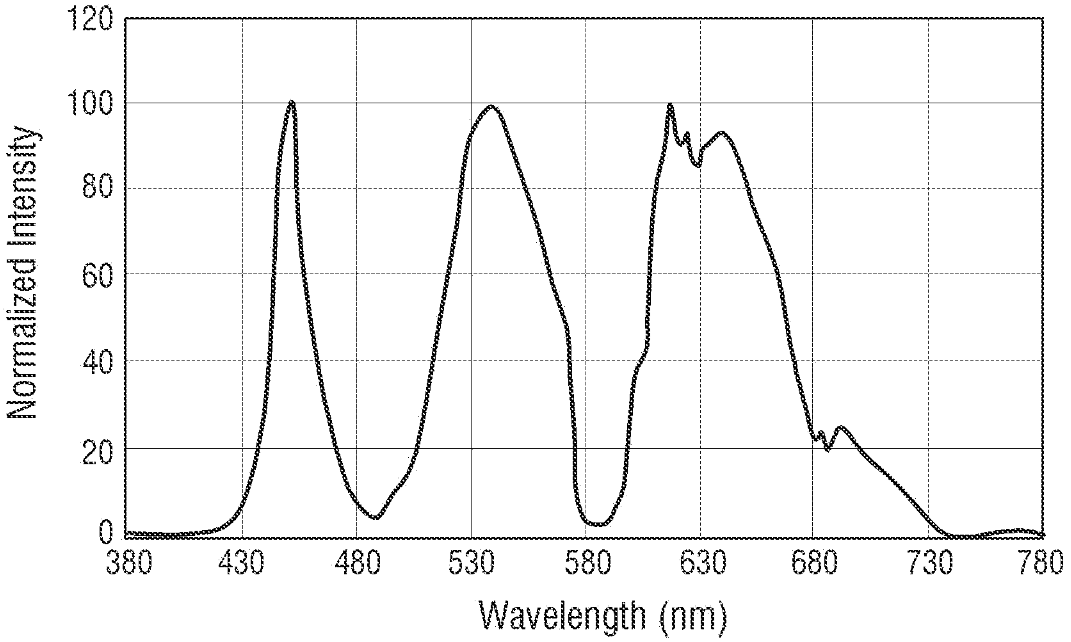
FIG. 34 is a graph illustrating a light spectrum of a display panel having content of inorganic particles of 5 wt % according to Experimental Example 2.
Figure 35:
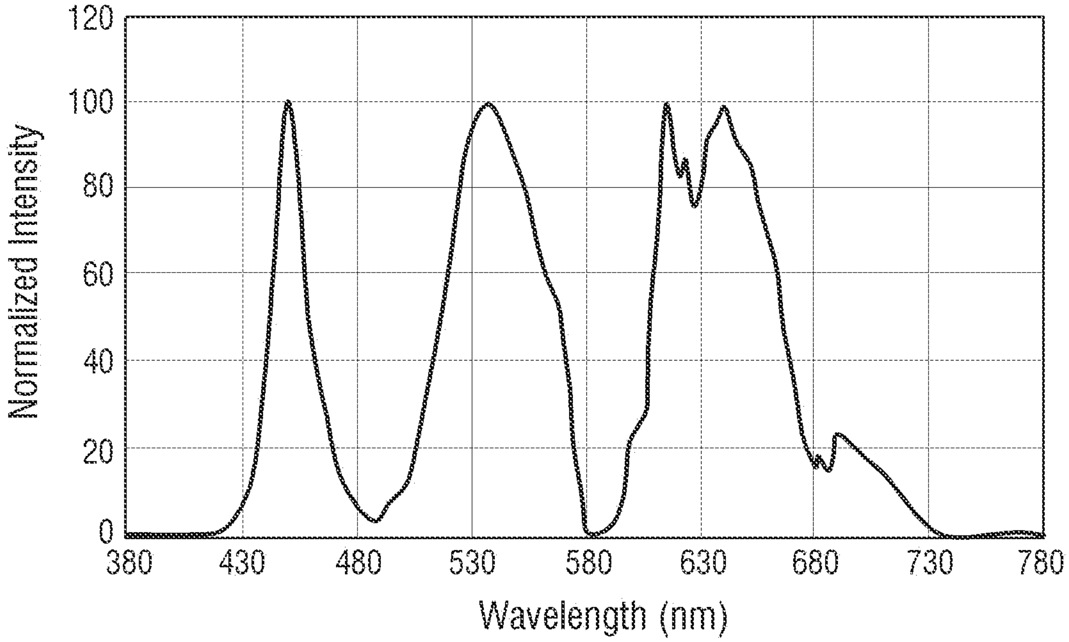
FIG. 35 is a graph illustrating a light spectrum of a display panel having content of inorganic particles of 10 wt % according to Experimental Example 2.
Figure 36:
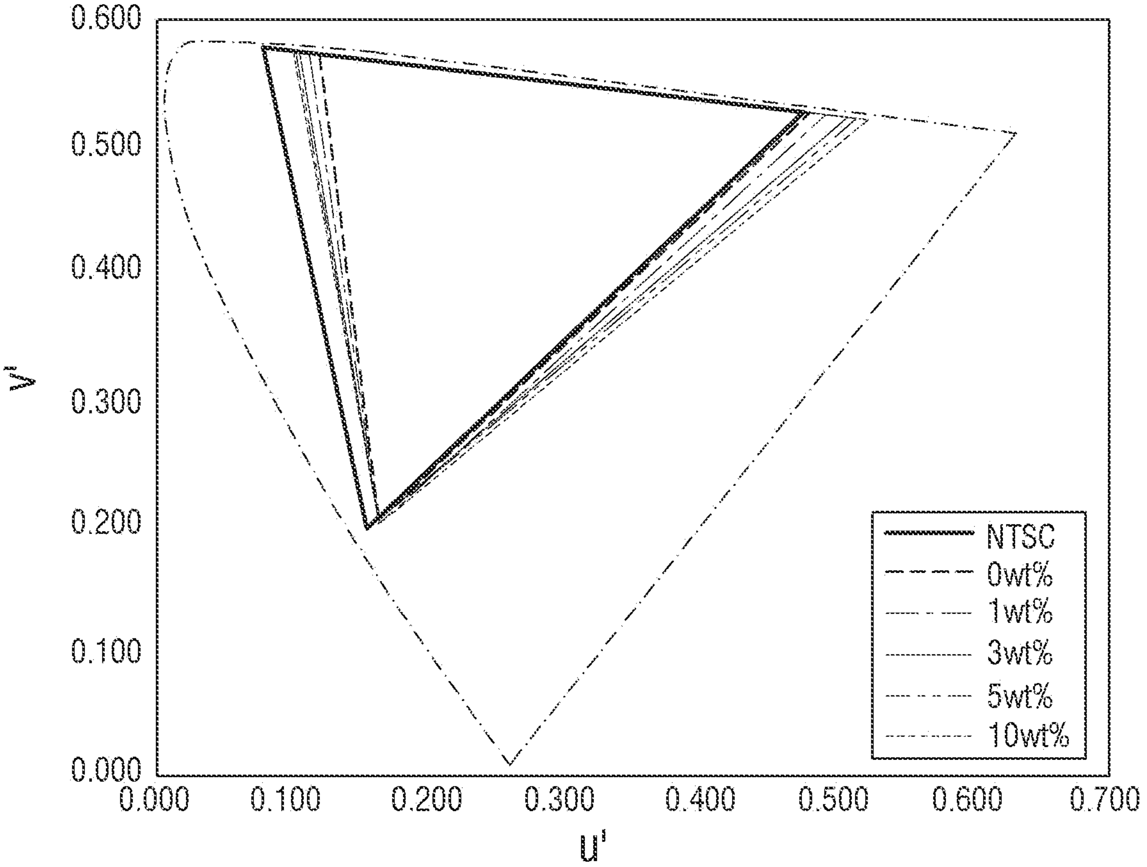
FIG. 36 is a view illustrating a color reproduction ratio of a display panel for each of contents of inorganic particles in an NTSC color coordinate system according to Experimental Example 2.
Figure 37:
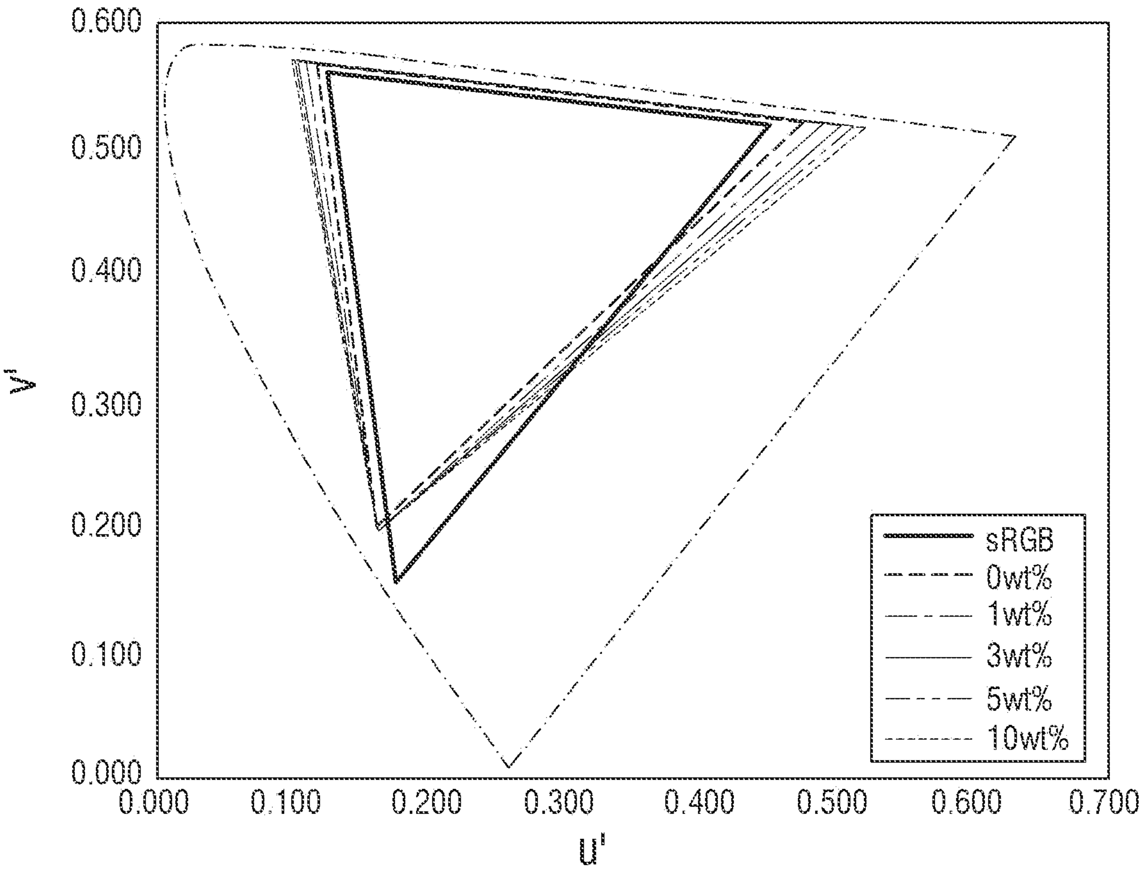
FIG. 37 is a view illustrating a color reproduction ratio of a display panel for each of contents of inorganic particles in an sRGB color coordinate system according to Experimental Example 2.
Figure 38:
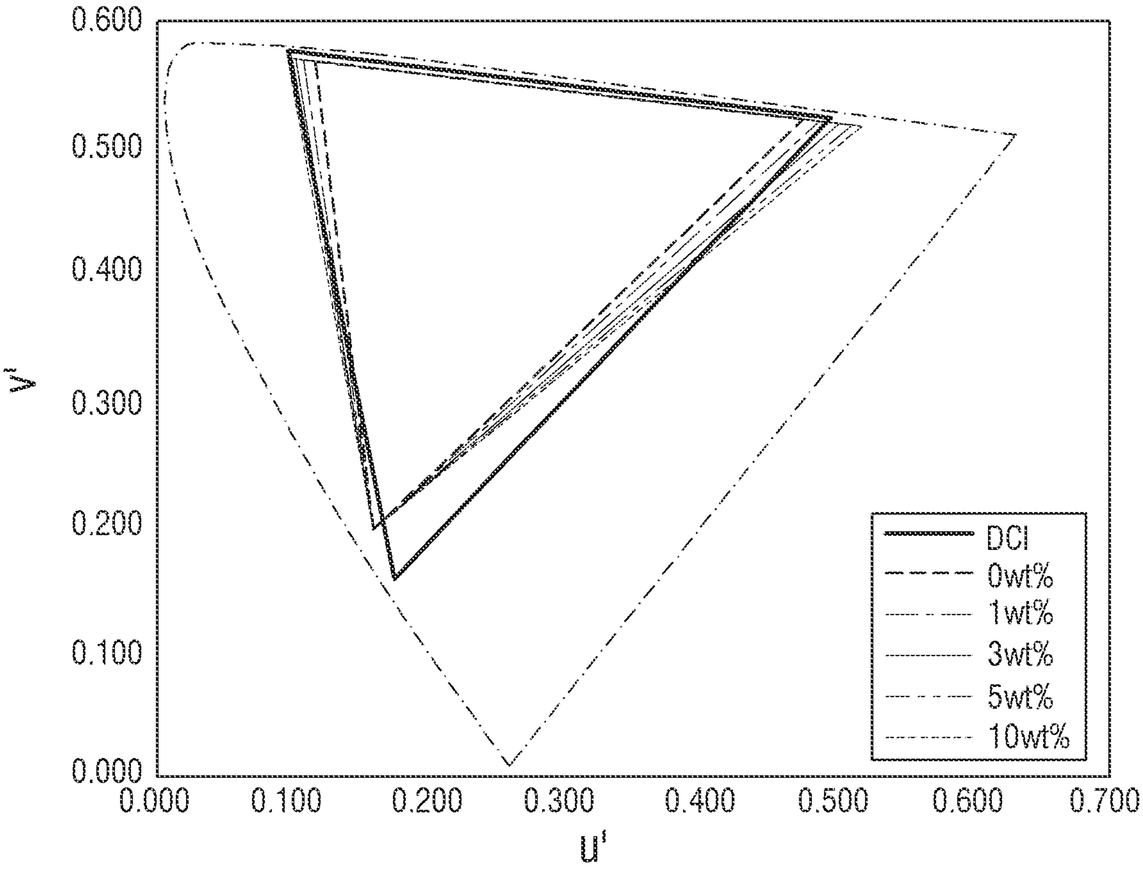
FIG. 38 is a view illustrating a color reproduction ratio of a display panel for each of contents of inorganic particles in a DCI color coordinate system according to Experimental Example 2.

FIG. 34 is a graph illustrating a light spectrum of a display panel having content of inorganic particles of 5 wt % according to Experimental Example 2. FIG. 35 is a graph illustrating a light spectrum of a display panel having content of inorganic particles of 10 wt % according to Experimental Example 2. FIG. 36 is a view illustrating a color reproduction ratio of a display panel for each of contents of inorganic particles in an NTSC color coordinate system according to Experimental Example 2. FIG. 37 is a view illustrating a color reproduction ratio of a display panel for each of contents of inorganic particles in an sRGB color coordinate system according to Experimental Example 2. FIG. 38 is a view illustrating a color reproduction ratio of a display panel for each of contents of inorganic particles in a DCI color coordinate system according to Experimental Example 2. Table 3 illustrates color coordinate values of the DCI color coordinate system of the display panel for each of contents of inorganic particles according to Experimental Example 2. Table 4 illustrates a color reproduction ratio of a display panel for each of contents of inorganic particles according to Experimental Example 2 as a relative area ratio and an overlap ratio compared to a reference color gamut.

First, referring to FIGS. 31 to 35, it may be seen that the full width of half maximum of the wavelength band of the red light is reduced as the content of the inorganic particles is increased to 1 wt %, 3 wt %, 5 wt %, and 10 wt % as compared with FIG. 31 in which the content of the inorganic particles is 0 wt %.

Referring to Tables 3 and 4 below together with FIGS. 36 to 38, it may be seen that an NTSC area ratio, an sRGB overlap ratio, an sRGB area ratio and a DCI overlap ratio are increased as the content of inorganic particles is increased to 1 wt %, 3 wt %, 5 wt % and 10 wt % as compared with the case in which the content of the inorganic particles is 0 wt %.

TABLE 3

| | Organic Particle Content (wt %) | | | | | | | | | |
|---|---|---|---|---|---|---|---|---|---|---|
| | 0 | | 1 | | 3 | | 5 | | 10 | |
| CIE | 'u | 'v | 'u | 'v | 'u | 'v | 'u | 'v | 'u | 'v |
| sR | 0.480 | 0.526 | 0.490 | 0.525 | 0.505 | 0.522 | 0.513 | 0.521 | 0.520 | 0.520 |
| sG | 0.117 | 0.572 | 0.110 | 0.572 | 0.102 | 0.573 | 0.099 | 0.573 | 0.098 | 0.574 |
| sB | 0.163 | 0.200 | 0.162 | 0.201 | 0.162 | 0.200 | 0.161 | 0.199 | 0.161 | 0.199 |

TABLE 4

| | Organic Particle Content (wt %) | | | | |
|---|---|---|---|---|---|
| | 0 | 1 | 3 | 5 | 10 |
| NTSC Area Ratio (%) | 89.3 | 93.4 | 99.1 | 101.8 | 103.9 |
| sRGB Overlap Ratio (%) | 91.8 | 92.6 | 93.7 | 94.2 | 94.6 |
| sRGB Area Ratio (%) | 102.4 | 107.1 | 113.6 | 116.7 | 119.2 |
| DCI Overlap Area (%) | 81.3 | 84.9 | 89.1 | 90.3 | 90.9 |

As a result, it may be seen that as the inorganic particles are included in the light emitting parts of the light emitting areas emitting the red light, the full width at half maximum of the red light spectrum may be reduced to improve the color reproduction ratio.

Experimental Example 3

A display panel having light emitting areas emitting red light, green light, and blue light was manufactured. A white light spectrum and a color reproduction ratio were measured by adding different amounts of inorganic particles $Nd_2(Si, Ti, Ge)_2O_7$ to the light emitting part of the light emitting area emitting the red light and the light emitting part of the light emitting area emitting the green light, respectively, among the light emitting areas at 0 wt %, 1 wt %, 3 wt %, 5 wt %, and 10 wt %, respectively. The results are illustrated in FIGS. 39 to 46 and Tables 5 and 6, respectively.

Figure 39:
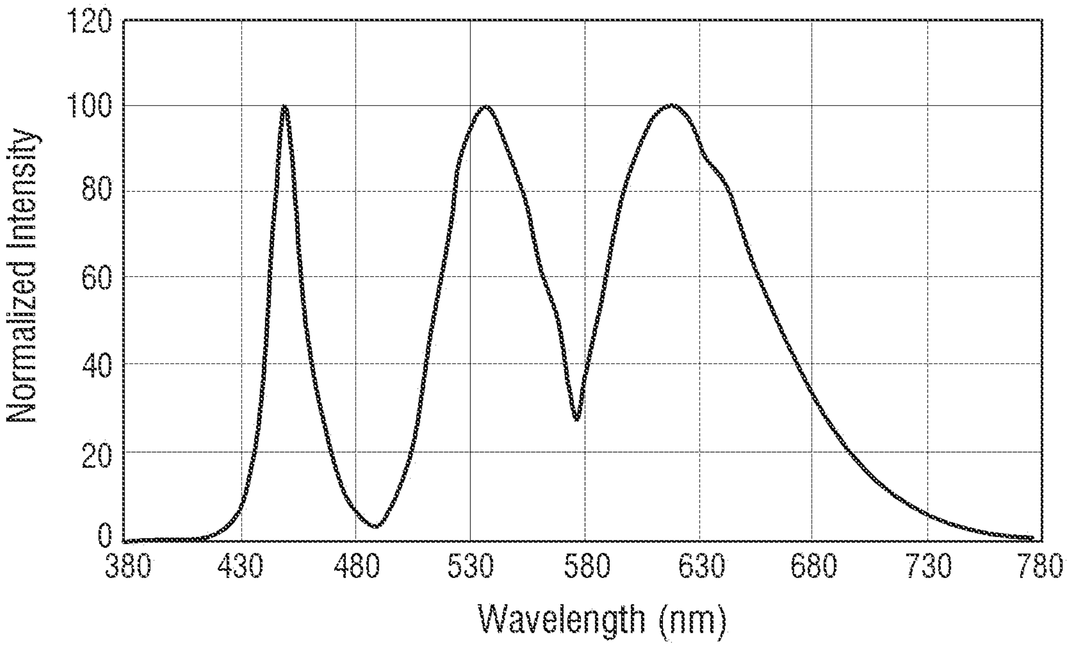
FIG. 39 is a graph illustrating a light spectrum of a display panel having content of inorganic particles of 0 wt % according to Experimental Example 3.
Figure 40:
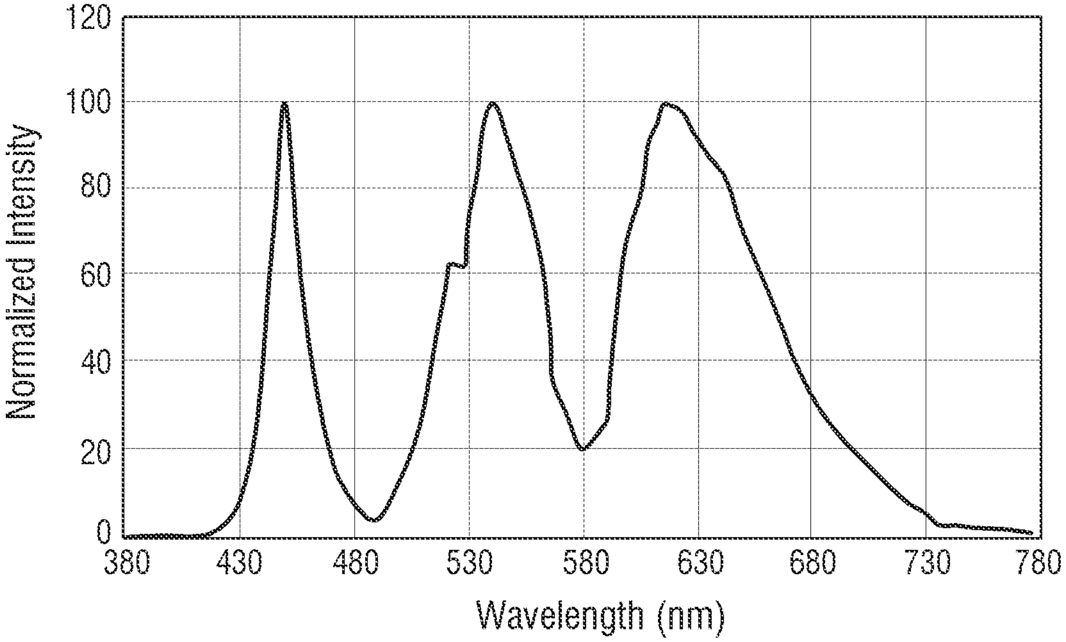
FIG. 40 is a graph illustrating a light spectrum of a display panel having content of inorganic particles of 1 wt % according to Experimental Example 3.
Figure 41:
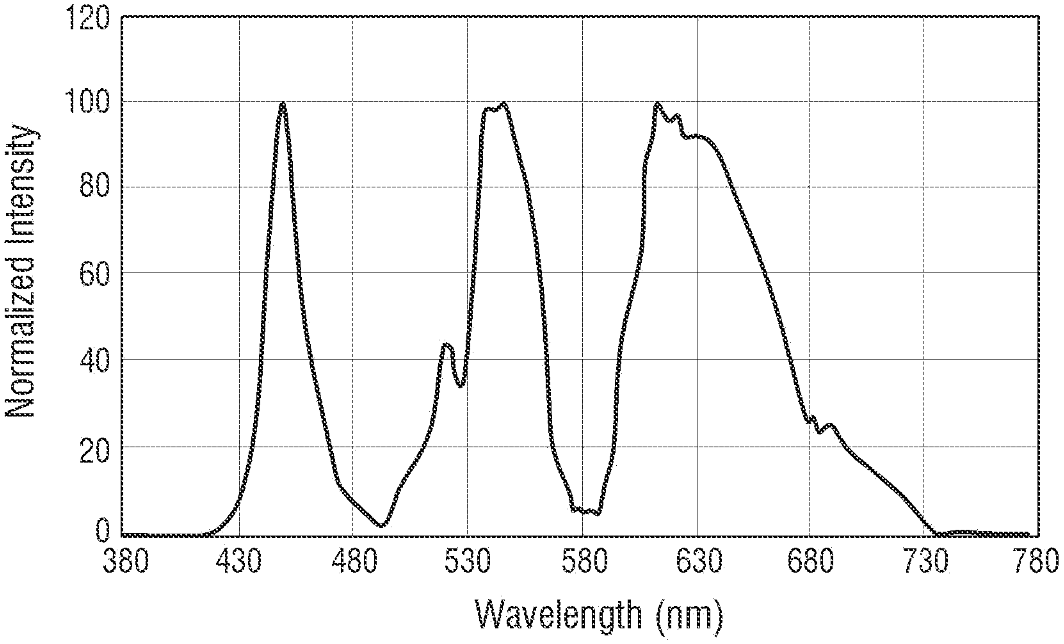
FIG. 41 is a graph illustrating a light spectrum of a display panel having content of inorganic particles of 3 wt % according to Experimental Example 3.
Figure 42:
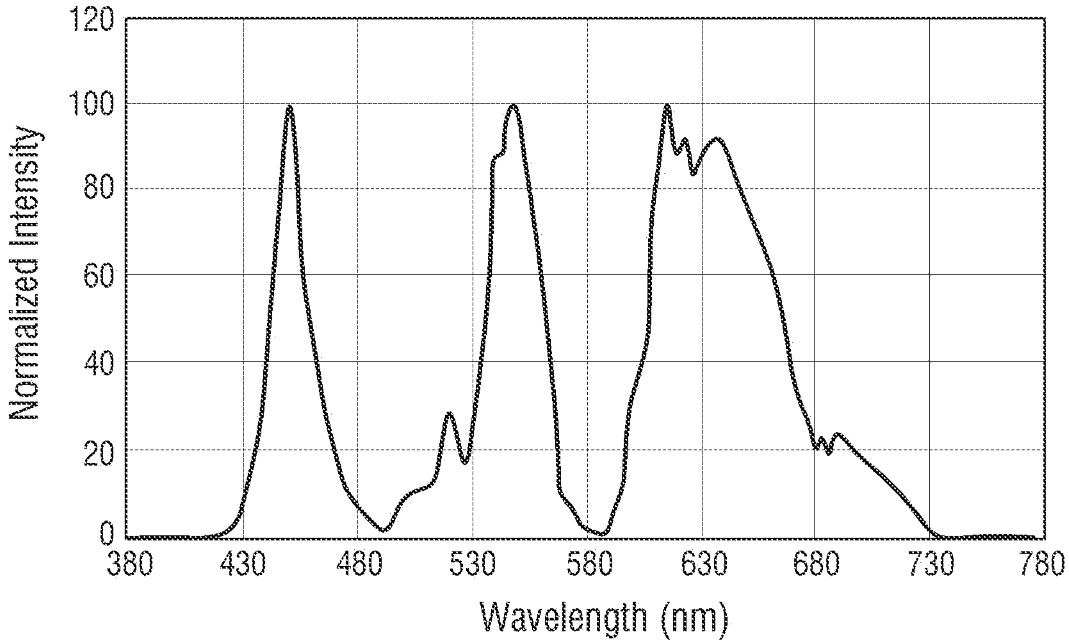
FIG. 42 is a graph illustrating a light spectrum of a display panel having content of inorganic particles of 5 wt % according to Experimental Example 3.
Figure 43:
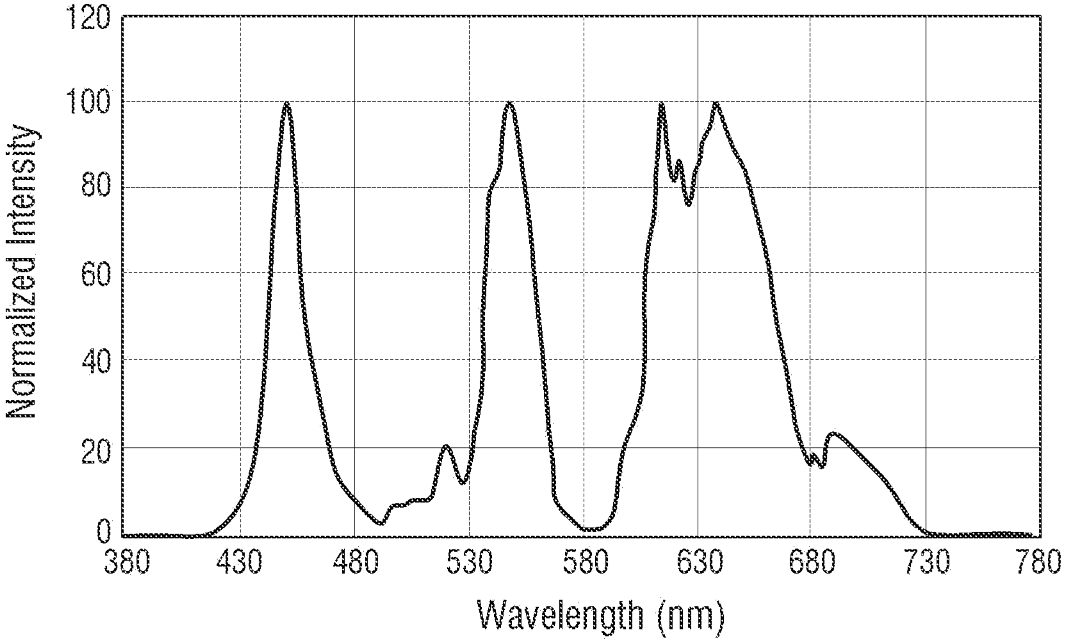
FIG. 43 is a graph illustrating a light spectrum of a display panel having content of inorganic particles of 10 wt % according to Experimental Example 3.
Figure 44:
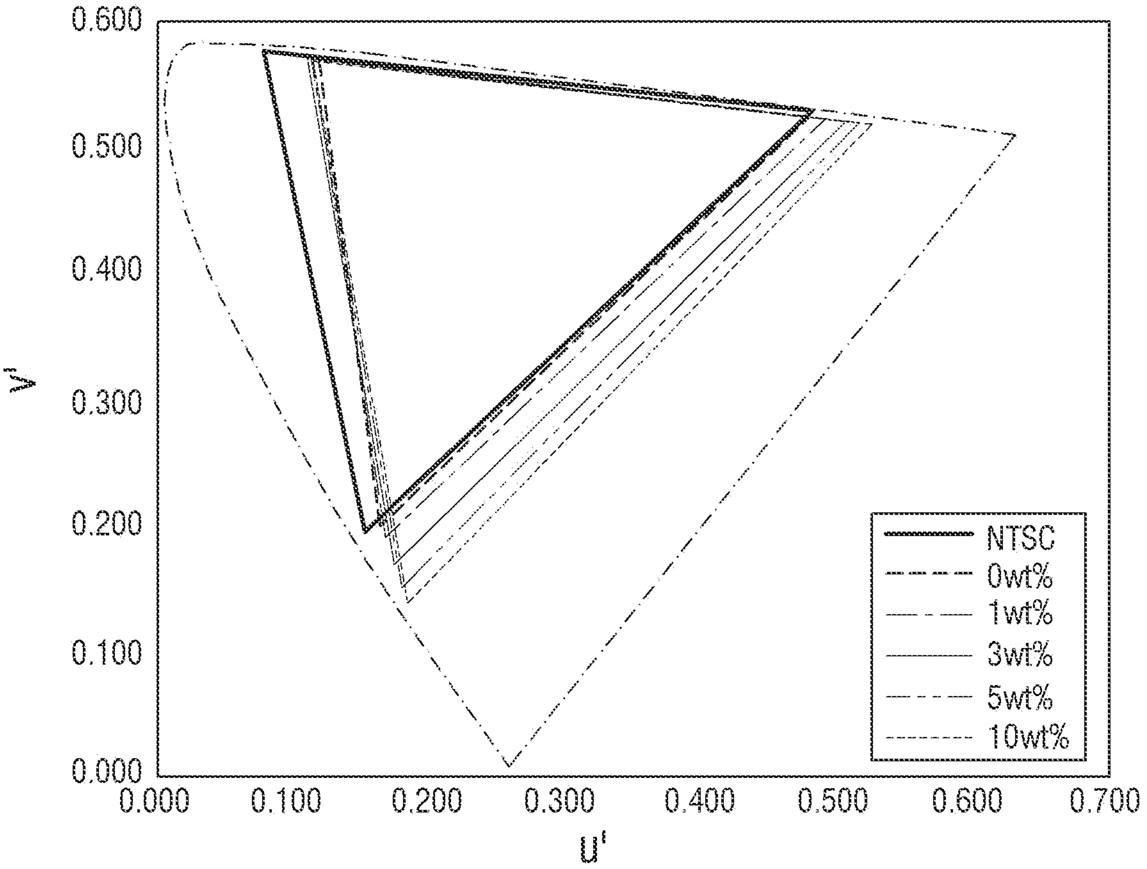
FIG. 44 is a view illustrating a color reproduction ratio of a display panel for each of contents of inorganic particles in an NTSC color coordinate system according to Experimental Example 3.
Figure 45:
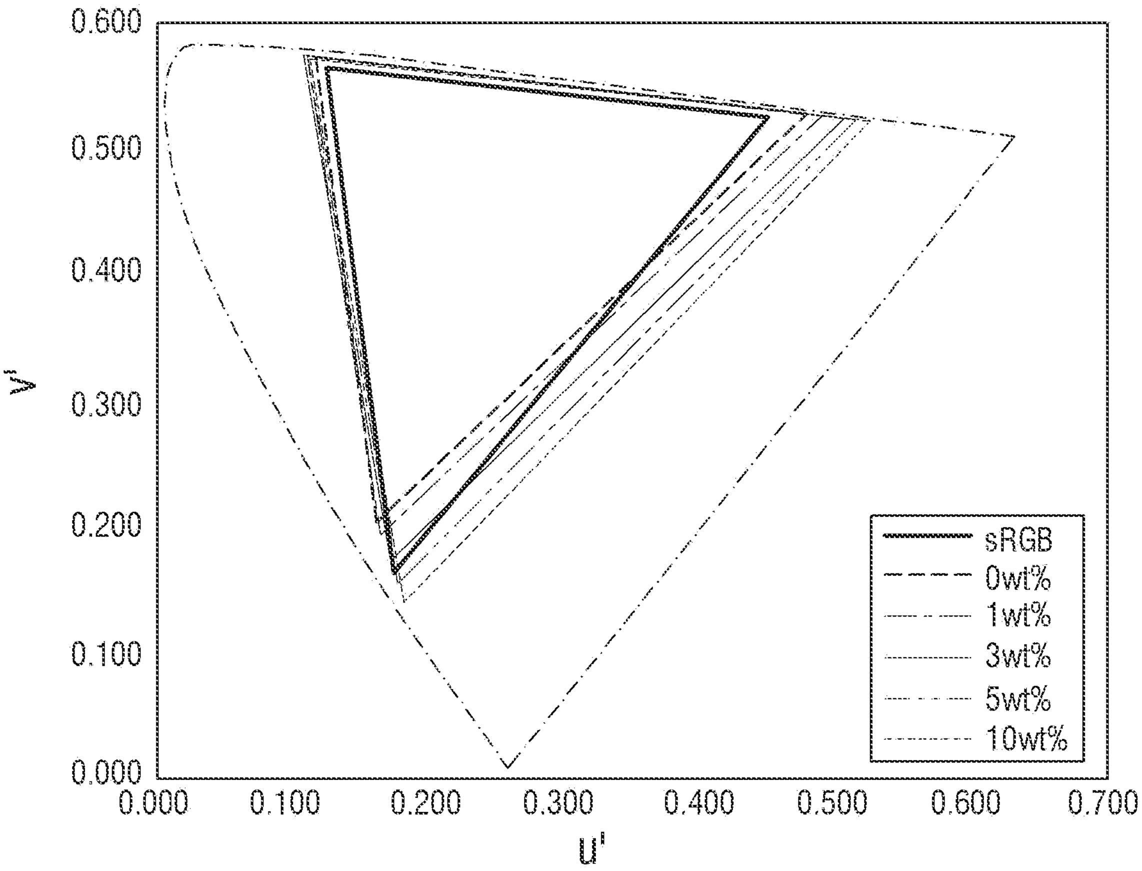
FIG. 45 is a view illustrating a color reproduction ratio of a display panel for each of contents of inorganic particles in an sRGB color coordinate system according to Experimental Example 3.
Figure 46:
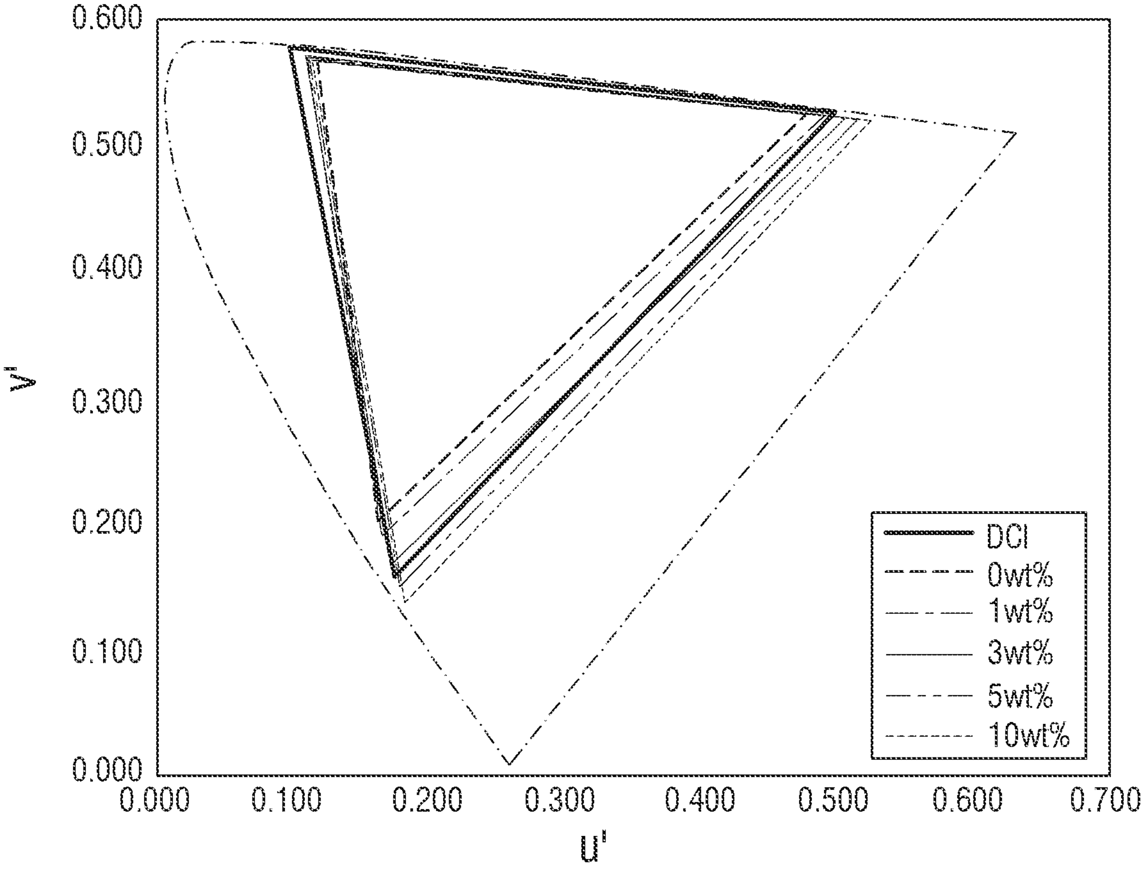
FIG. 46 is a view illustrating a color reproduction ratio of a display panel for each of contents of inorganic particles in a DCI color coordinate system according to Experimental Example 3.

FIG. 39 is a graph illustrating a light spectrum of a display panel having content of inorganic particles of 0 wt % according to Experimental Example 3. FIG. 40 is a graph illustrating a light spectrum of a display panel having content of inorganic particles of 1 wt % according to Experimental Example 3. FIG. 41 is a graph illustrating a light spectrum of a display panel having content of inorganic particles of 3 wt % according to Experimental Example 3. FIG. 42 is a graph illustrating a light spectrum of a display panel having content of inorganic particles of 5 wt % according to Experimental Example 3. FIG. 43 is a graph illustrating a light spectrum of a display panel having content of inorganic particles of 10 wt % according to Experimental Example 3. FIG. 44 is a view illustrating a color reproduction ratio of a display panel for each of contents of inorganic particles in an NTSC color coordinate system according to Experimental Example 3. FIG. 45 is a view illustrating a color reproduction ratio of a display panel for each of contents of inorganic particles in an sRGB color coordinate system according to Experimental Example 3. FIG. 46 is a view illustrating a color reproduction ratio of a display panel for each of contents of inorganic particles in a DCI color coordinate system according to Experimental Example 3. Table 5 illustrates color coordinate values of the DCI color coordinate system of the display panel for each of contents of inorganic particles according to Experimental Example 3. Table 6 illustrates a color reproduction ratio of a display panel for each of contents of inorganic particles according to Experimental Example 3 as a relative area ratio and an overlap ratio compared to a reference color gamut.

First, referring to FIGS. 39 to 43, it may be seen that the full widths of half maximum of the wavelength bands of the red and green light are reduced as the content of the inorganic particles is increased to 1 wt %, 3 wt %, 5 wt %, and 10 wt % as compared with FIG. 39 in which the content of inorganic particles included in each of the light emitting parts of the red and green light emitting areas is 0 wt %.

Referring to Tables 5 and 6 below together with FIGS. 44 to 46, it may be seen that an NTSC area ratio, an sRGB overlap ratio, an sRGB area ratio and a DCI overlap ratio are substantially increased as the content of inorganic particles is increased to 1 wt %, 3 wt %, 5 wt % and 10 wt % as compared with the case in which the content of the inorganic particles is 0 wt %

TABLE 5

| | Organic Particle Content (wt %) | | | | | | | | | |
|---|---|---|---|---|---|---|---|---|---|---|
| | 0 | | 1 | | 3 | | 5 | | 10 | |
| CIE | 'u | 'v | 'u | 'v | 'u | 'v | 'u | 'v | 'u | 'v |
| sR | 0.480 | 0.526 | 0.491 | 0.525 | 0.506 | 0.522 | 0.515 | 0.521 | 0.523 | 0.519 |
| sG | 0.117 | 0.572 | 0.113 | 0.572 | 0.110 | 0.572 | 0.112 | 0.570 | 0.113 | 0.569 |
| sB | 0.163 | 0.200 | 0.166 | 0.189 | 0.173 | 0.168 | 0.178 | 0.150 | 0.182 | 0.138 |

TABLE 6

| | Organic Particle Content (wt %) | | | | |
|---|---|---|---|---|---|
| | 0 | 1 | 3 | 5 | 10 |
| NTSC Area Ratio (%) | 89.3 | 95.6 | 105.6 | 111.6 | 116.5 |
| sRGB Overlap Ratio (%) | 91.8 | 95.4 | 99.5 | 99.9 | 99.7 |
| sRGB Area Ratio (%) | 102.4 | 109.7 | 121.1 | 128.1 | 133.7 |
| DCI Overlap Area (%) | 81.3 | 87.1 | 94.9 | 94.5 | 93.5 |

As a result, it may be seen that as the inorganic particles are included in each of the light emitting parts of the light emitting areas emitting the green and red light, the full widths at half maximum of the green and red light spectrums may be reduced to improve the color reproduction ratio.

In concluding the detailed description, those skilled in the art will appreciate that many variations and modifications can be made to the embodiments described herein without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A display device comprising:

a substrate comprising a plurality of light emitting areas;

a partition wall portion on the substrate and partitioning the plurality of light emitting areas; and a plurality of light emitting parts on the substrate and respectively corresponding to the plurality of light emitting areas, wherein at least one of the plurality of light emitting parts comprises:

a light emitting element on the substrate; and a first color conversion layer covering the light emitting element and comprising first inorganic particles, and wherein the first inorganic particles comprise $Nd_2(Ge)_2O_7$.

2. The display device of claim 1, wherein the plurality of light emitting parts comprise:

a first light emitting part configured to emit light in a first wavelength band, a second light emitting part configured to emit light in a second wavelength band, and a third light emitting part configured to emit light in a third wavelength band.

3. The display device of claim 2, wherein the first light emitting part comprises the first color conversion layer, and the first color conversion layer comprises first wavelength conversion particles configured to convert light emitted from the light emitting element into the light in the first wavelength band, and a first base resin in which the first wavelength conversion particles and the first inorganic particles are dispersed.

4. The display device of claim 3, wherein a content of the first inorganic particles is 0.1 wt % to 10 wt % with respect to the first base resin.

5. The display device of claim 3, wherein the light in the first wavelength band is any one of red, green, or blue light.

6. The display device of claim 3, wherein the first wavelength conversion particles are selected from phosphors and quantum dots.

7. The display device of claim 2, wherein the first light emitting part comprises the first color conversion layer, the first color conversion layer comprises first wavelength conversion particles configured to convert light emitted from the light emitting element into the light in the first wavelength band, and the second light emitting part comprises a second color conversion layer comprising the first inorganic particles and second wavelength conversion particles configured to convert the light emitted from the light emitting element into the light in the second wavelength band.

8. The display device of claim 7, wherein the third light emitting part comprises a light transmitting layer comprising the first inorganic particles and third wavelength conversion particles configured to convert the light emitted from the light emitting element into the light in the third wavelength band.

9. The display device of claim 1, wherein the light emitting element is configured to emit light in an ultraviolet wavelength band or light in a blue wavelength band.

10. The display device of claim 1, further comprising a color filter layer on the plurality of light emitting parts, wherein the color filter layer comprises second inorganic particles that are the same as the first inorganic particles.

11. The display device of claim 10, further comprising an absorption layer between the color filter layer and the plurality of light emitting parts, wherein the absorption layer comprises third inorganic particles that are the same as the first inorganic particles.

12. The display device of claim 11, further comprising a lens layer on the color filter layer, wherein the lens layer comprises a plurality of lenses respectively corresponding to the plurality of light emitting areas, and the plurality of lenses comprise fourth inorganic particles that are the same as the first inorganic particles.

13. A display device comprising:

a substrate comprising a plurality of light emitting areas;

a partition wall portion on the substrate and partitioning the plurality of light emitting areas;

a plurality of light emitting parts on the substrate and respectively corresponding to the plurality of light emitting areas; and an absorption layer on the plurality of light emitting parts, the absorption layer comprising first inorganic particles, wherein at least one of the plurality of light emitting parts comprises:

a light emitting element on the substrate; and wavelength converting particles covering the light emitting element and configured to convert a wavelength band of light emitted from the light emitting element, and wherein the first inorganic particles comprise $Nd_2(Ge)_2O_7$.

14. The display device of claim 13, wherein the absorption layer overlaps at least one of the plurality of light emitting parts.

15. The display device of claim 13, further comprising a color filter layer on the absorption layer, wherein the color filter layer comprises second inorganic particles that are the same as the first inorganic particles.

16. The display device of claim 15, further comprising a lens layer on the color filter layer, wherein the lens layer comprises a plurality of lenses respectively corresponding to the plurality of light emitting areas, and the plurality of lenses comprise third inorganic particles that are the same as the first inorganic particles.

17. A display device comprising:

a substrate comprising a plurality of light emitting areas;

a partition wall portion on the substrate and partitioning the plurality of light emitting areas;

a plurality of light emitting parts on the substrate and respectively corresponding to the plurality of light emitting areas; and a lens layer on the plurality of light emitting parts, the lens layer comprising first inorganic particles, wherein at least one of the plurality of light emitting parts comprises:

a light emitting element on the substrate; and wavelength converting particles covering the light emitting element and configured to convert a wavelength band of light emitted from the light emitting element, and wherein the first inorganic particles comprise $Nd_2(Ge)_2O_7$.

18. The display device of claim 17, further comprising a color filter layer provided between the lens layer and the plurality of light emitting parts, wherein the color filter layer comprises second inorganic particles that are the same as the first inorganic particles.

19. An electronic device comprising:

a substrate comprising a plurality of light emitting areas;

a partition wall portion on the substrate and partitioning the plurality of light emitting areas;

a plurality of light emitting parts on the substrate and respectively corresponding to the plurality of light emitting areas; and a color filter layer on the plurality of light emitting parts, the color filter layer comprising first inorganic particles, wherein at least one of the plurality of light emitting parts comprises:

a light emitting element on the substrate; and wavelength converting particles covering the light emitting element and configured to convert a wavelength band of light emitted from the light emitting element, and wherein the first inorganic particles comprise $Nd_2(Ge)_2O_7$.

20. The electronic-device of claim 19, wherein the color filter layer comprises a plurality of color filters respectively corresponding to the plurality of light emitting areas, and at least one of the plurality of color filters comprises the first inorganic particles.

* * * * *